United States Patent
Shi et al.

(10) Patent No.: US 10,338,451 B2
(45) Date of Patent: Jul. 2, 2019

(54) DEVICES AND METHODS FOR REMOVING ZEROTH ORDER LEAKAGE IN BEAM STEERING DEVICES

(71) Applicant: Facebook Technologies, LLC, Menlo Park, CA (US)

(72) Inventors: Jianru Shi, Union City, CA (US); Mary Lou Jepsen, Sausalito, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 152 days.

(21) Appl. No.: 15/347,691

(22) Filed: Nov. 9, 2016

(65) Prior Publication Data

US 2017/0059960 A1    Mar. 2, 2017

Related U.S. Application Data

(63) Continuation-in-part of application No. 15/065,772, filed on Mar. 9, 2016, now Pat. No. 9,989,765.

(Continued)

(51) Int. Cl.
*G02F 1/13*    (2006.01)
*G02F 1/29*    (2006.01)

(Continued)

(52) U.S. Cl.
CPC ........... *G02F 1/292* (2013.01); *G02B 3/0056* (2013.01); *G02B 26/0875* (2013.01); *G02B 27/0093* (2013.01); *G02B 27/0101* (2013.01); *G02B 27/0172* (2013.01); *G06F 3/011* (2013.01); *G06F 3/013* (2013.01); *G06F 3/0346* (2013.01);

(Continued)

(58) Field of Classification Search
None
See application file for complete search history.

(56) References Cited

U.S. PATENT DOCUMENTS

| | | | |
|---|---|---|---|
| 4,769,750 A | 9/1988 | Matsumoto et al. | |
| 5,016,282 A | 5/1991 | Tomono et al. | |

(Continued)

FOREIGN PATENT DOCUMENTS

| | | |
|---|---|---|
| JP | 57207217 A | 12/1982 |
| WO | WO20130144311 A1 | 10/2013 |

OTHER PUBLICATIONS

Jepsen, Final Office Action, U.S. Appl. No. 15/065,772, dated Nov. 3, 2017, 16 pgs.

(Continued)

*Primary Examiner* — James A Dudek
(74) *Attorney, Agent, or Firm* — Morgan, Lewis & Bockius LLP

(57) ABSTRACT

A beam steering device includes a first active deflector. The first active deflector includes a first substrate with one or more electrodes, a second substrate with one or more electrodes, and liquid crystals located between the first substrate and the second substrate. The second substrate is distinct from the first substrate. The beam steering device also includes a passive deflector positioned parallel to the first active deflector. The passive deflector includes a third substrate, a fourth substrate that is distinct from the third substrate, and liquid crystals located between the third substrate and the fourth substrate. A method for separating zeroth order leakage with the beam steering device is also disclosed.

20 Claims, 43 Drawing Sheets

Related U.S. Application Data

(60) Provisional application No. 62/246,117, filed on Oct. 25, 2015, provisional application No. 62/200,481, filed on Aug. 3, 2015.

(51) Int. Cl.

|  |  |  |
|---|---|---|
| *G02B 27/01* | (2006.01) | |
| *G02B 27/00* | (2006.01) | |
| *G02B 3/00* | (2006.01) | |
| *G06F 3/01* | (2006.01) | |
| *G09G 3/34* | (2006.01) | |
| *G06F 3/0346* | (2013.01) | |
| *G02B 26/08* | (2006.01) | |
| *G09G 3/00* | (2006.01) | |
| *G09G 3/36* | (2006.01) | |
| *G06F 3/14* | (2006.01) | |

(52) U.S. Cl.
CPC ......... *G09G 3/003* (2013.01); *G09G 3/3426* (2013.01); *G09G 3/3611* (2013.01); *G02B 2027/014* (2013.01); *G02B 2027/015* (2013.01); *G02B 2027/0118* (2013.01); *G02B 2027/0123* (2013.01); *G02B 2027/0147* (2013.01); *G02B 2027/0152* (2013.01); *G02B 2027/0178* (2013.01); *G02B 2027/0187* (2013.01); *G06F 3/1446* (2013.01); *G09G 2300/026* (2013.01); *G09G 2300/0478* (2013.01); *G09G 2300/0804* (2013.01); *G09G 2310/04* (2013.01); *G09G 2320/028* (2013.01); *G09G 2354/00* (2013.01); *G09G 2360/145* (2013.01)

(56) References Cited

U.S. PATENT DOCUMENTS

| | | |
|---|---|---|
| 5,414,559 A | 5/1995 | Burghardt et al. |
| 5,619,373 A | 4/1997 | Meyerhofer et al. |
| 5,742,262 A | 4/1998 | Tabata et al. |
| 5,748,375 A | 5/1998 | Yamana |
| 5,758,940 A | 6/1998 | Ogino et al. |
| 5,883,606 A | 3/1999 | Smoot |
| 6,133,687 A | 10/2000 | Clarke |
| 6,140,980 A | 10/2000 | Spitzer et al. |
| 6,215,593 B1 | 4/2001 | Bruce |
| 6,381,072 B1 | 4/2002 | Burger |
| 7,573,640 B2 | 8/2009 | Nivon et al. |
| 7,701,648 B2 | 4/2010 | Amano et al. |
| 8,218,212 B2 | 7/2012 | Kroll et al. |
| 8,611,004 B2 | 12/2013 | Newell |
| 8,941,932 B2 | 1/2015 | Kamiyarma et al. |
| 9,335,548 B1 | 5/2016 | Cakmakci |
| 9,810,909 B2 | 11/2017 | Kang et al. |
| 2001/0043163 A1 | 11/2001 | Waldern |
| 2002/0033442 A1 | 3/2002 | Toko et al. |
| 2002/0158813 A1 | 10/2002 | Kiyokawa et al. |
| 2003/0025881 A1 | 2/2003 | Hwang |
| 2004/0108971 A1 | 6/2004 | Waldern et al. |
| 2004/0227703 A1 | 11/2004 | Lamvik et al. |
| 2004/0252277 A1 | 12/2004 | Chmielewski, Jr. et al. |
| 2005/0142303 A1 | 6/2005 | Ota |
| 2006/0050398 A1 | 3/2006 | Gurevich |
| 2006/0066785 A1 | 3/2006 | Moriya |
| 2006/0103924 A1 | 5/2006 | Katz |
| 2007/0035829 A1 | 2/2007 | Woodgate et al. |
| 2007/0159599 A1 | 7/2007 | Yamada |
| 2007/0252074 A1 | 11/2007 | Ng |
| 2008/0106489 A1 | 5/2008 | Brown |
| 2008/0239420 A1 | 10/2008 | McGrew |
| 2008/0297898 A1 | 12/2008 | Martin |
| 2009/0021716 A1 | 1/2009 | Wangler |
| 2009/0052838 A1 | 2/2009 | McDowall |
| 2009/0128899 A1 | 5/2009 | Newell |
| 2009/0296188 A1 | 12/2009 | Jain et al. |
| 2010/0141905 A1 | 6/2010 | Burke |
| 2011/0025955 A1 | 2/2011 | Bos et al. |
| 2011/0057930 A1 | 3/2011 | Keller |
| 2011/0069254 A1 | 3/2011 | Takama |
| 2011/0249452 A1 | 10/2011 | Chen et al. |
| 2012/0075569 A1 | 3/2012 | Chang |
| 2012/0188467 A1* | 7/2012 | Escuti ............... G02B 27/286 349/1 |
| 2012/0242615 A1 | 9/2012 | Teraguchi |
| 2013/0021226 A1 | 1/2013 | Bell |
| 2013/0038935 A1 | 2/2013 | Moussa et al. |
| 2013/0107145 A1 | 5/2013 | Ueki et al. |
| 2013/0114850 A1 | 5/2013 | Publicover |
| 2013/0187836 A1 | 7/2013 | Cheng et al. |
| 2013/0214301 A1 | 8/2013 | Yamada et al. |
| 2013/0218270 A1 | 8/2013 | Blanckaert et al. |
| 2013/0234935 A1 | 9/2013 | Griffith |
| 2013/0242555 A1 | 9/2013 | Mukawa |
| 2013/0286053 A1 | 10/2013 | Fleck et al. |
| 2013/0335795 A1 | 12/2013 | Song et al. |
| 2014/0085865 A1 | 3/2014 | Yun et al. |
| 2014/0118829 A1 | 5/2014 | Ma et al. |
| 2014/0140653 A1 | 5/2014 | Brown et al. |
| 2014/0168034 A1 | 6/2014 | Luebke et al. |
| 2014/0240342 A1 | 8/2014 | Xu |
| 2014/0267205 A1 | 9/2014 | Nestorovic |
| 2014/0267958 A1 | 9/2014 | Sugita |
| 2014/0361957 A1 | 12/2014 | Hua et al. |
| 2014/0375541 A1 | 12/2014 | Nister et al. |
| 2014/0375913 A1 | 12/2014 | Jen et al. |
| 2015/0015814 A1 | 1/2015 | Qin |
| 2015/0049390 A1 | 2/2015 | Lanman et al. |
| 2015/0077618 A1 | 3/2015 | Ueno |
| 2015/0085259 A1 | 3/2015 | Schreiber et al. |
| 2015/0091789 A1 | 4/2015 | Alzate |
| 2015/0124315 A1 | 5/2015 | Sasahara |
| 2015/0138451 A1 | 5/2015 | Amitai |
| 2015/0173846 A1 | 6/2015 | Schneider |
| 2015/0185699 A1 | 7/2015 | Yamamoto et al. |
| 2015/0205014 A1 | 7/2015 | Akasaka |
| 2015/0205132 A1 | 7/2015 | Osterhout |
| 2015/0262424 A1 | 9/2015 | Tabaka et al. |
| 2015/0287206 A1 | 10/2015 | Ebisawa |
| 2015/0312558 A1 | 10/2015 | Miller et al. |
| 2015/0338660 A1 | 11/2015 | Mukawa |
| 2016/0018645 A1 | 1/2016 | Haddick |
| 2016/0033769 A1 | 2/2016 | Kang et al. |
| 2016/0062121 A1 | 3/2016 | Border |
| 2016/0091715 A1 | 3/2016 | Larson et al. |
| 2016/0131918 A1 | 5/2016 | Chu et al. |
| 2016/0147074 A1 | 5/2016 | Kobayashi et al. |
| 2016/0165151 A1 | 6/2016 | Corlett |
| 2016/0191890 A1 | 6/2016 | Kawano et al. |
| 2016/0259198 A1 | 9/2016 | Yi |
| 2016/0274365 A1 | 9/2016 | Bailey |
| 2016/0314564 A1 | 10/2016 | Jones et al. |
| 2016/0327798 A1 | 11/2016 | Xiao |
| 2016/0349414 A1 | 12/2016 | Rudmann |
| 2017/0010473 A1 | 1/2017 | Ide |
| 2017/0010488 A1 | 1/2017 | Klug et al. |
| 2017/0018215 A1 | 1/2017 | Black et al. |
| 2017/0018688 A1 | 1/2017 | Mazed et al. |
| 2017/0019602 A1 | 1/2017 | Dopilka et al. |
| 2017/0031435 A1 | 2/2017 | Raffle |
| 2017/0038589 A1 | 2/2017 | Jepsen |
| 2017/0038590 A1 | 2/2017 | Jepsen |
| 2017/0038591 A1 | 2/2017 | Jepsen |
| 2017/0038834 A1 | 2/2017 | Wilson |
| 2017/0038836 A1 | 2/2017 | Jepsen |
| 2017/0039904 A1 | 2/2017 | Jepsen |
| 2017/0039905 A1 | 2/2017 | Jepsen |
| 2017/0039906 A1 | 2/2017 | Jepsen |
| 2017/0039907 A1 | 2/2017 | Jepsen |
| 2017/0039960 A1 | 2/2017 | Jepsen |
| 2017/0075421 A1 | 3/2017 | Na |
| 2017/0091549 A1 | 3/2017 | Gustafsson |
| 2017/0102543 A1 | 4/2017 | Vallius |
| 2017/0108697 A1 | 4/2017 | El-Ghoroury et al. |

(56) References Cited

U.S. PATENT DOCUMENTS

| | | |
|---|---|---|
| 2017/0139213 A1 | 5/2017 | Schmidtlin |
| 2017/0293148 A1 | 10/2017 | Park |
| 2017/0336626 A1 | 11/2017 | Hayashi |
| 2018/0046859 A1 | 2/2018 | Jarvenpaa |

OTHER PUBLICATIONS

Jepsen, Final Office Action, U.S. Appl. No. 15/065,780, dated Mar. 28, 2018, 17 pgs.
Jepsen, Final Office Action, U.S. Appl. No. 15/065,785, dated Mar. 28, 2018, 17 pgs.
Jepsen, Final Office Action, U.S. Appl. No. 15/065,790, dated Apr. 18, 2018, 17 pgs.
Jepsen, Final Office Action, U.S. Appl. No. 15/065,796, dated Apr. 26, 2018, 22 pgs.
Jepsen, Notice of Allowance, U.S. Appl. No. 15/065,772, dated Jan. 29, 2018, 8 pgs.
Jepsen, Notice of Allowance, U.S. Appl. No. 15/065,778, dated Apr. 9, 2018, 12 pgs.
Jepsen, Office Action, U.S. Appl. No. 15/065,772, dated Jun. 29, 2017, 16 pgs.
Jepsen, Office Action, U.S. Appl. No. 15/065,778, dated Oct. 27, 2017, 29 pgs.
Jepsen, Office Action, U.S. Appl. No. 15/065,780, dated Oct. 27, 2017, 20 pgs.
Jepsen, Office Action, U.S. Appl. No. 15/065,785, dated Oct. 27, 2017, 21 pgs.
Jepsen, Office Action, U.S. Appl. No. 15/065,790, dated Nov. 8, 2017, 24 pgs.
Jepsen, Office Action, U.S. Appl. No. 15/065,796, dated Nov. 8, 2017, 26 pgs.
Jepsen, Office Action, U.S. Appl. No. 15/065,811, dated May 11, 2018, 17 pgs.
Jepsen, Office Action, U.S. Appl. No. 15/065,813, dated May 17, 2018, 12 pgs.
Jepsen, Office Action, U.S. Appl. No. 15/065,817, dated Mar. 29, 2018, 11 pgs.
Lanman et al., "Near-Eye Light Field Displays," ACM Transactions on Graphics,vol. 32, No. 6, Article 220, Publication Date: Nov. 2013, 10 pgs.
Schmidtlin, Notice of Allowance, U.S. Appl. No. 15/270,803, dated May 2, 2018, 11 pgs.
Schmidtlin, Office Action, U.S. Appl. No. 15/270,803, dated Nov. 29, 2017, 26 pgs.
Shi, Final Office Action, U.S. Appl. No. 15/347,684, dated Nov. 6, 2017, 12 pgs.
Shi, Notice of Allowance, U.S. Appl. No. 15/347,684, dated Jan. 24, 2018, 5 pgs.
Shi, Office Action, U.S. Appl. No. 15/226,815, dated Apr. 5, 2018, 15 pgs.
Shi, Office Action, U.S. Appl. No. 15/226,820, dated Mar. 28, 2018, 10 pgs.
Shi, Office Action, U.S. Appl. No. 15/347,684, dated Jun. 29, 2017, 13 pgs.
Shroff, Office Action, U.S. Appl. No. 15/395,107, dated May 14, 2018, 11 pgs.
Blais, Francois, "Review of 20 years of range sensor development," Journal of Electronic Imaging, Jan. 2004, vol. 13(1), pp. 231-243.
Jepsen, Office Action, U.S. Appl. No. 15/065,780, dated Jul. 9, 2018, 21 pgs.
Jepsen, Final Office Action, U.S. Appl. No. 15/065,780, dated Dec. 4, 2018, 23 pgs.
Jepsen, Office Action, U.S. Appl. No. 15/065,785, dated Sep. 13, 2018, 21 pgs.
Jepsen, Office Action, U.S. Appl. No. 15/065,817, dated Dec. 27, 2018, 11 pgs.
Jepsen, Notice of Allowance, U.S. Appl. No. 15/065,790, dated Aug. 15, 2018, 13 pgs.
Jepsen, Office Action, U.S. Appl. No. 15/065,796, dated Sep. 13, 2018, 24 pgs.
Jepsen, Final Office Action, U.S. Appl. No. 15/065,811, dated Dec. 13, 2018, 8 pgs.
Jepsen, Notice of Allowance, U.S. Appl. No. 15/065,811, dated Feb. 13, 2019, 9pgs.
Jepsen, Final Office Action, U.S. Appl. No. 15/065,813, dated Dec. 18, 2018, 15 pgs.
Jepsen, Office Action, U.S. Appl. No. 15/967,451, dated Jun. 15, 2018, 13 pgs.
Jepsen, Final Office Action, U.S. Appl. No. 15/967,451, dated Oct. 11, 2018, 17 pgs.
Shi, Office Action, U.S. Appl. No. 15/347,6842, dated Jul. 11, 2018, 11 pgs.
Shi, Notice of Allowance, U.S. Appl. No. 15/347,684, dated Jan. 7, 2019, 7 pgs.
Shi, Notice of Allowance, U.S. Appl. No. 15/226,815, dated Sep. 24, 2018, 9 pgs.
Shi, Final Office Action, U.S. Appl. No. 15/226,820, dated Aug. 6, 2018, 13 pgs.
Shi, Notice of Allowance, U.S. Appl. No. 15/226,820, dated Nov. 19, 2018, 10 pgs.
Shi, Office Action, U.S. Appl. No. 15/347,685, dated Jun. 26, 2018, 11 pgs.
Shi, Office Action, U.S. Appl. No. 15/347,672, dated Feb. 21, 2019, 12 pgs.
Shroff, Final Office Action, U.S. Appl. No. 15/395,107, dated Dec. 12, 2018, 13 pgs.
Schmidtlin, Office Action, U.S. Appl. No. 15/422,403, dated Sep. 19, 2018, 21 pgs.
Schmidtlin, Final Office Action, U.S. Appl. No. 15/422,403, dated Jan. 29, 2019, 24 pgs.
Jepsen, Notice of Allowance, US15/065,785, 24APR2019, 12 pgs.
Jepsen, FinalOffice Action, US15/065,796, 25APR2019, 25 pgs.
Jepsen, Office Action, US15/065,813, 01APR2019, 15 pgs.
Jepsen, Notice of Allowance, US15/967,451, 25FEB2019, 9 pgs.
Shi, Notice of Allowance, US15/347,685, 02MAY2019, 7 pgs.
Shroff, Office Action, US15/395,107, 15MAR2019,15 pgs.

\* cited by examiner

DEVICES AND METHODS FOR REMOVING ZEROTH ORDER LEAKAGE IN BEAM STEERING DEVICES

RELATED APPLICATIONS

This application is a continuation-in-part of U.S. patent application Ser. No. 15/065,772, filed Mar. 9, 2016, which claims the benefit of, and priority to, U.S. Provisional Patent Application Ser. No. 62/200,481, filed Aug. 3, 2015 and U.S. Provisional Patent Application Ser. No. 62/246,117, filed Oct. 25, 2015. All of these applications are incorporated by reference herein in their entireties. This application is related to U.S. patent application Ser. No. 15/347,672, entitled "Wide Angle Beam Steering in Sunglasses for Virtual Reality and Augmented Reality", filed Nov. 9, 2016, which claims priority to U.S. Provisional Patent Application Ser. No. 62/270,523, filed Dec. 21, 2015, both of which are incorporated by reference herein in their entireties.

TECHNICAL FIELD

This relates generally to display devices, and more specifically to head-mounted display devices.

BACKGROUND

Head-mounted display devices (also called herein head-mounted displays) are gaining popularity as means for providing visual information to user. In head-mounted displays, optical elements are located close to an eye of a user, which provides additional challenges.

SUMMARY

Accordingly, there is a need for improved head-mounted displays. Electro-optic elements, such as beam steering devices, are used to enhance the user's virtual-reality and/or augmented reality experience. However, electro-optic elements configured to deflect light in a direction of first order diffraction often suffers from leakage of light in a direction of zeroth order diffraction. The leaked light generates optical artifacts.

The above deficiencies and other problems associated with electro-optic elements are reduced or eliminated by the disclosed beam steering devices. In some embodiments, such beam steering devices are used in an eye tracking device. In some embodiments, such beam steering devices are used in a display device. In some embodiments, the device is a head-mounted display device. In some embodiments, the device is portable.

In accordance with some embodiments, a beam steering device includes a first active deflector and a passive deflector positioned parallel to the first active deflector. The first active deflector includes a first substrate with one or more electrodes, a second substrate with one or more electrodes, and liquid crystals located between the first substrate and the second substrate. The second substrate is distinct from the first substrate. The passive deflector includes a third substrate, a fourth substrate that is distinct from the third substrate, and liquid crystals located between the third substrate and the fourth substrate.

In accordance with some embodiments, a display device includes one or more light sources, and a beam steering device configured to steer light from the one or more light sources.

In accordance with some embodiments, a method includes transmitting incoming light through a first active deflector. The first active deflector includes a first substrate with one or more electrodes, a second substrate with one or more electrodes, and liquid crystals located between the first substrate and the second substrate. The second substrate is distinct from the first substrate. The method also includes separating light diffracted into a zeroth order direction by the first active deflector, including transmitting the light from the active deflector through a passive deflector. The passive deflector includes a third substrate, a fourth substrate that is distinct from the third substrate, and liquid crystals located between the third substrate and the fourth substrate.

Thus, the disclosed embodiments provide compact and light display devices with increased efficiency, effectiveness, and user satisfaction with such devices.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

These figures are not drawn to scale unless indicated otherwise.

DETAILED DESCRIPTION

Conventional head-mounted displays are larger and heavier than typical eyeglasses, because conventional head-mounted displays often include a complex set of optics that can be bulky and heavy. It is not easy for users to get used to wearing such large and heavy head-mounted displays.

The disclosed embodiments, by utilizing a combination of a pixel array and a microlens (called herein a "tile"), provide display devices (including those that can be head-mounted) that are compact and light. In addition, display devices with an array of tiles can provide a large field of view, thereby improving user experience with the display devices.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first tile could be termed a second tile, and, similarly, a second tile could be termed a first tile, without departing from the scope of the various described embodiments. The first tile and the second tile are both tiles, but they are not the same tile.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Figure 1:
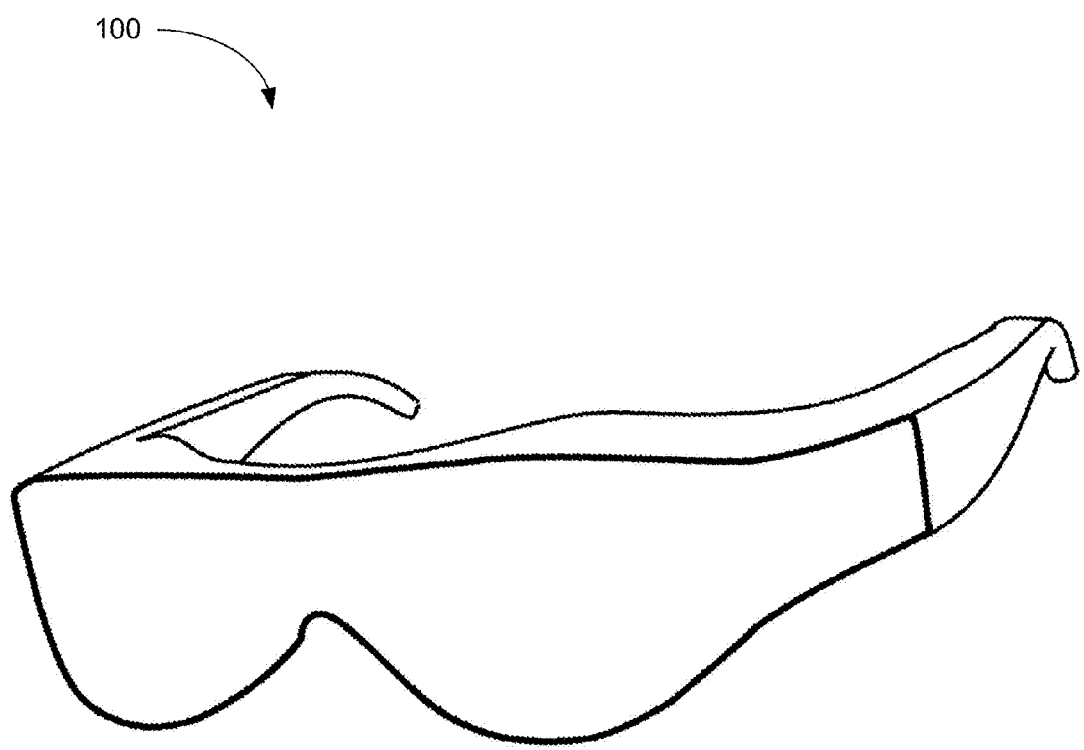
FIG. 1 is a perspective view of a display device in accordance with some embodiments.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user).

In some embodiments, display device 100 includes one or more components described below with respect to FIG. 2. In some embodiments, display device 100 includes additional components not shown in FIG. 2.

Figure 2:
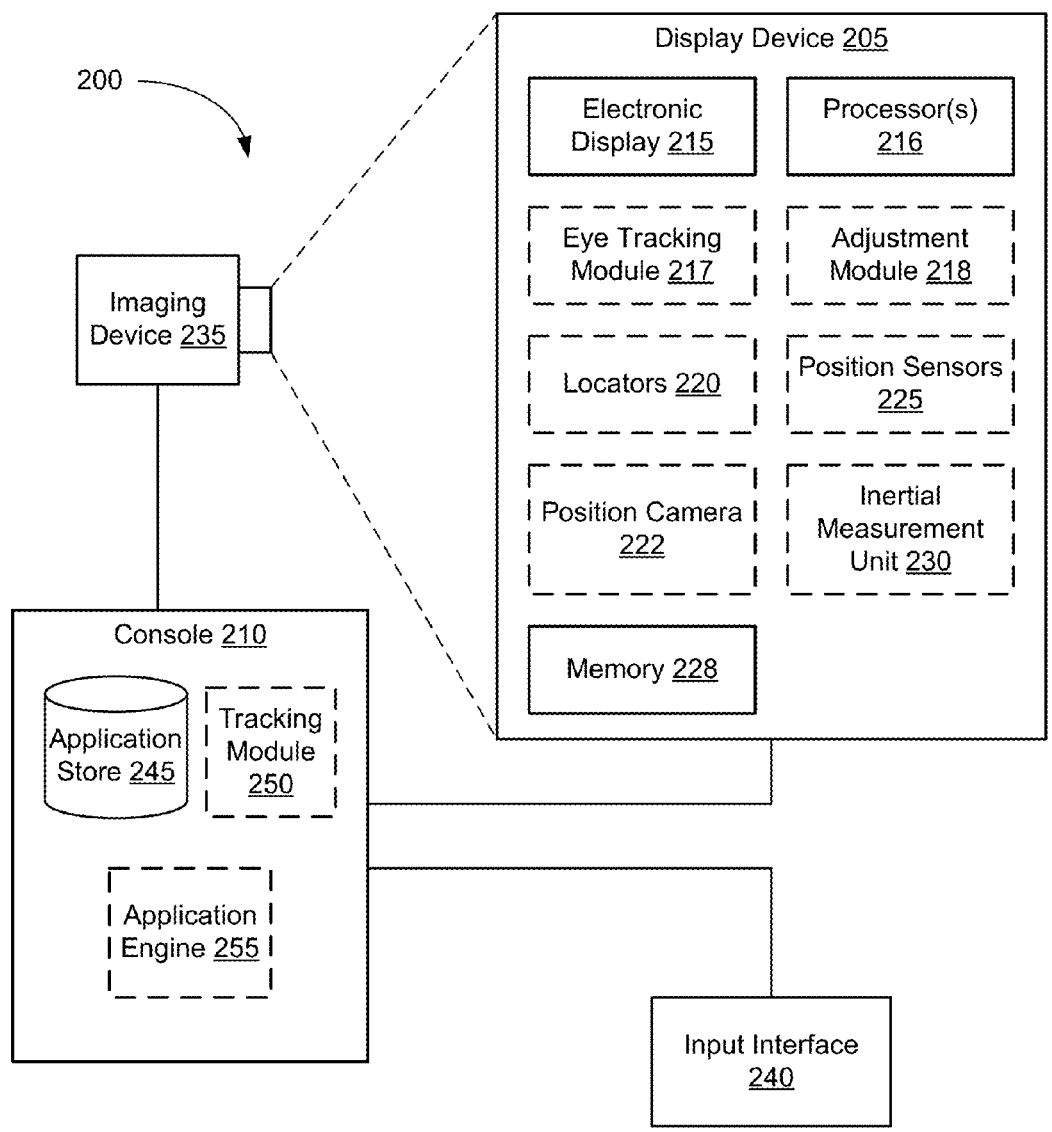
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and augmented reality.

In some embodiments, as shown in FIG. 1, display device 205 is a head-mounted display that presents media to a user.

Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores the following programs, modules and data structures, or a subset or superset thereof:
- instructions for activating at least a subset of a two-dimensional array of tiles for outputting, from at least the subset of the two-dimensional array of tiles, a collective pattern of light that is directed to a pupil of an eye of a user;
- instructions for, prior to activating at least the subset of the two-dimensional array of tiles, selecting the subset of the two-dimensional array of tiles for activation;
- instructions for directing the light from each pixel that outputs light to a pupil of an eye of a user; and
- instructions for activating at least the subset of the two-dimensional array of tiles include instructions for activating less than all of the tiles of the two-dimensional array of tiles.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user). As discussed in detail below with regard to FIGS. 3A-3I, an adjustable electronic display element is comprised of a display element, one or more integrated microlens arrays, or some combination thereof. The adjustable electronic display element may be flat, cylindrically curved, or have some other shape.

In some embodiments, the display element includes an array of light emission devices and a corresponding array of emission intensity array. An emission intensity array is an array of electro-optic pixels, opto-electronic pixels, some other array of devices that dynamically adjust the amount of light transmitted by each device, or some combination thereof. These pixels are placed behind an array of microlenses, and are arranged in groups. Each group of pixels outputs light that is directed by the microlens in front of it to a different place on the retina where light from these groups of pixels are then seamlessly "tiled" to appear as one continuous image. In some embodiments, computer graphics, computational imaging and other techniques are used to pre-distort the image information (e.g., correcting for the brightness variations) sent to the pixel groups so that through the distortions of the system from optics, electronics, electro-optics, and mechanicals, a smooth seamless image appears on the back of the retina, as described below with respect to FIGS. 4A and 4B. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

The microlens arrays are arrays of lenslets that direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square (see, e.g., FIG. 3D). In some embodiments, a lenslet is a conventional passive lens (e.g., glass lens, plastic lens, etc.) or an active lens (e.g., liquid crystal lens, liquid lens, etc.). In some embodiments, display device 205 dynamically adjusts the curvature and/or refractive ability of active lenslets to direct light to specific locations within each eyebox (e.g., location of pupil). In some embodiments, one or more of the microlens arrays include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described above.

Adjustment module 218 generates an image frame based on the determined locations of the pupils. This sends a discrete image to the display that will tile subimages together thus a coherent stitched image will appear on the back of the retina. A small portion of each image is projected through each lenslet in the lenslet array. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenslets in the microlens arrays, or some combination thereof.

In some embodiments, adjustment module 218 is configured to instruct the display elements to not use every pixel (e.g., one or more light emission devices), such that black spaces aperture the diverging light to abut the image together from the retinal perspective. In addition, in some embodiments, gaps are created between the pixel groups or "tiles" to match divergence of the light source array and the magnification of the group of pixels as it transverses through the optical system and fully fills the lenslet. In some embodiments, adjustment module 218 determines, for a given position of an eye, which pixels are turned on and which pixels are turned off, with the resulting image being seamlessly tiled on the eye's retina.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3A:
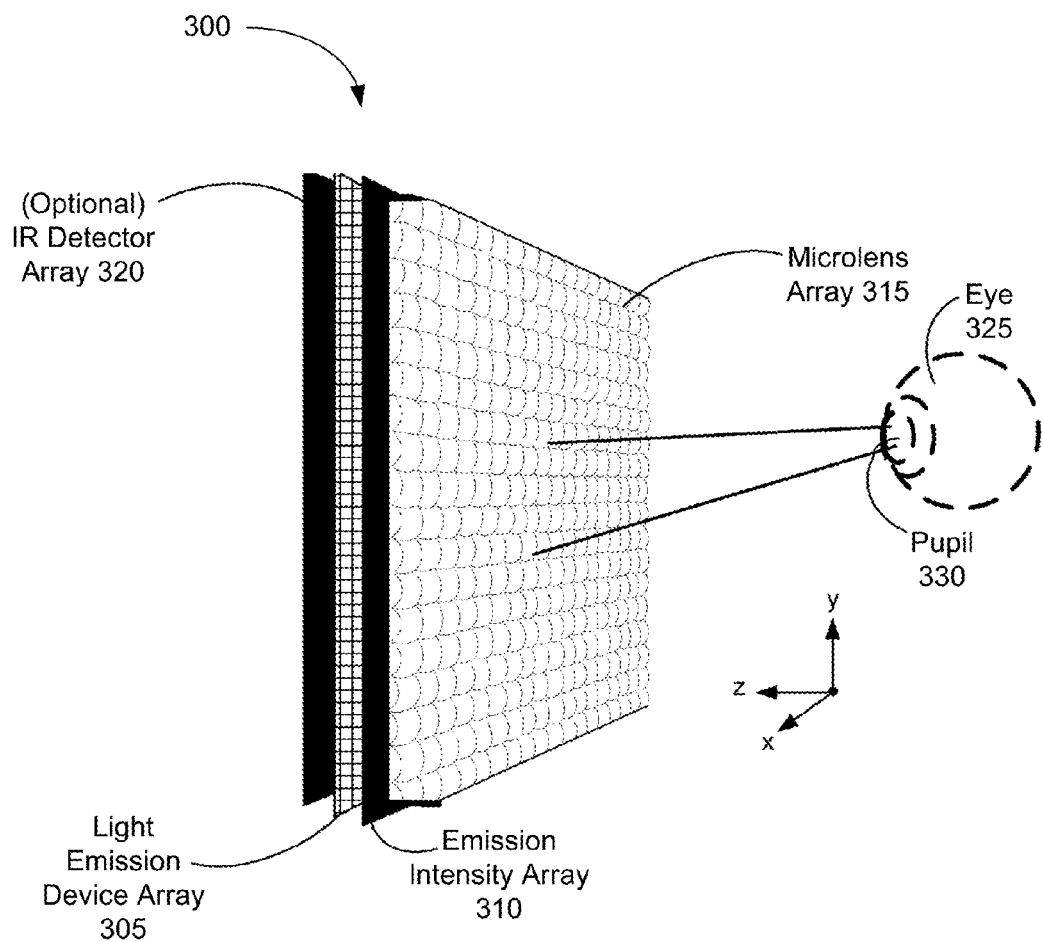
FIG. 3A is an isometric view of an adjustable electronic display element of a display device in accordance with some embodiments.

FIG. 3A is an isometric view of an adjustable electronic display element 300 of display device 205, in accordance with some embodiments. In some other embodiments, adjustable electronic display element 300 is part of some other electronic display (e.g., digital microscope, etc.). In some embodiments, adjustable electronic display element 300 includes light emission device array 305, emission intensity array 310, microlens array 315, and IR detector array 320. In some other embodiments, adjustable electronic display element 300 includes a subset or superset of light emission device array 305, emission intensity array 310, microlens array 315, and IR detector array 320 (e.g., adjustable electronic display element 300 includes an adjustable light emission device array that includes individually adjustable pixels and microlens array 315, without a separate emission intensity array).

Light emission device array 305 emits image light and optional IR light toward the viewing user. Light emission device array 305 may be, e.g., an array of LEDs, an array of microLEDs, an array of OLEDs, or some combination thereof. Light emission device array 305 includes light emission devices that emit light in the visible light (and optionally includes devices that emit light in the IR).

Emission intensity array 310 is configured to selectively attenuate light emitted from light emission array 305. In some embodiments, emission intensity array 310 is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner emission intensity array 310 is able to control what portion of the image light emitted from light emission device array 305 is passed to the microlens array 315. In some embodiments, display device 205 uses emission intensity array 310 to facilitate providing image light to a location of pupil 330 of eye 325 of a user, and minimize the amount of image light provided to other areas in the eyebox.

Microlens array 315 receives the modified image light (e.g., attenuated light) from emission intensity array 310, and directs the modified image light to a location of pupil 330. Microlens array 315 includes a plurality of lenslets. In some embodiments, microlens array 315 includes one or more diffractive optics. A lenslet may be a conventional passive lens (e.g., glass lens, plastic lens, etc.) or an active lens. An active lens is a lens whose lens curvature and/or refractive ability may be dynamically controlled (e.g., via a change in applied voltage). An active lens may be a liquid crystal lens, a liquid lens (e.g., using electro-wetting), or some other lens whose curvature and/or refractive ability may be dynamically controlled, or some combination thereof. Accordingly, in some embodiments, system 200 may dynamically adjust the curvature and/or refractive ability of active lenslets to direct light received from emission intensity array 310 to pupil 330.

Optional IR detector array 320 detects IR light that has been retro-reflected from the retina of eye 325, a cornea of eye 325, a crystalline lens of eye 325, or some combination thereof. IR detector array 320 includes either a single IR sensor or a plurality of IR sensitive detectors (e.g., photodiodes). While IR detector array 320 in FIG. 3A is shown separate from light emission device array 305, in some embodiments, IR detector array 320 may be integrated into light emission device array 305.

In some embodiments, light emission device array 305 and emission intensity array 310 make up a display element. Alternatively, the display element includes light emission device array 305 (e.g., when light emission device array 305 includes individually adjustable pixels) without emission intensity array 310. In some embodiments, the display element additionally includes IR array 320. In some embodiments, in response to a determined location of pupil 335, the display element adjusts the emitted image light such that the light output by the display element is refracted by microlens array 315 toward the location of pupil 335, and not toward other locations in the eyebox.

Figure 3B:
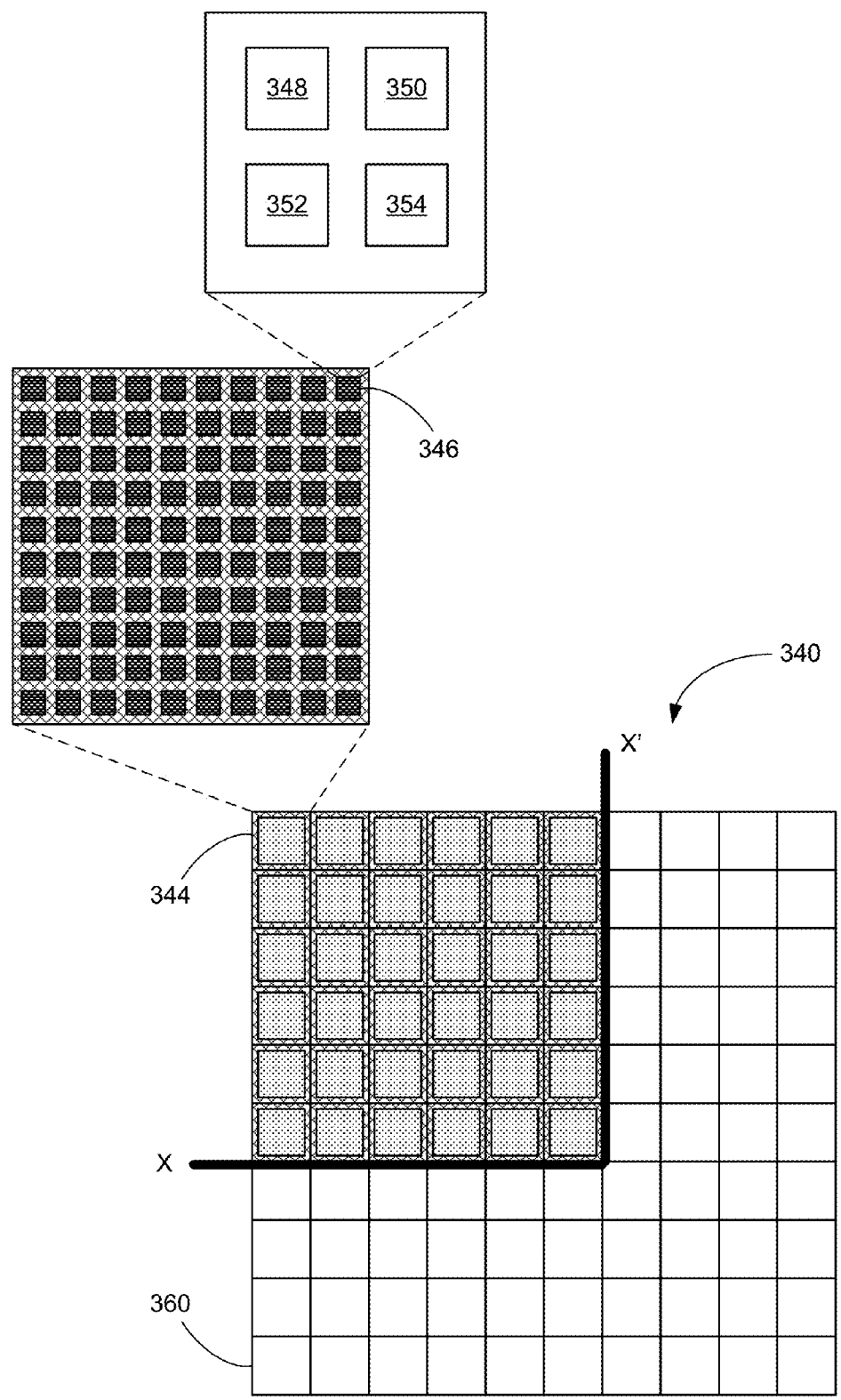
FIG. 3B is a partial cross-sectional view of the adjustable electronic device in accordance with some embodiments.

FIG. 3B is a partial cross-sectional view of adjustable electronic device 340 in accordance with some embodiments.

Adjustable electronic device 340 includes a two-dimensional array of tiles 360 (e.g., 10-by-10 array of tiles 360, as shown in FIG. 3B). In some cases, each tile has a shape of a 1-mm-by-1-mm square, although tiles of different sizes and/or shapes can be used. In some embodiments, the two-dimensional array of tiles 360 is arranged on a flat surface. In some other embodiments, the two-dimensional array of tiles 360 is arranged on a curved surface or a surface of any other shape. Although FIG. 3B shows a square array of tiles 360, in some other embodiments, the two-dimensional array of tiles 360 may have a rectangular shape, or any other shape (e.g., a rasterized circle or a rasterized ellipse).

In addition, a different number of tiles 360 may be used depending on the desired performance of the display device (e.g., a field of view).

As explained above, tile 360 includes a lens. In some embodiments, lenses for the two-dimensional array of tiles are provided in a form of a microlens array (e.g., microlens array 315 in FIG. 3A). In FIG. 3B, a portion of the microlens array is not shown (e.g., an upper-left portion of the microlens array indicated by the line XX') to illustrate groups of pixels located behind it.

FIG. 3B also illustrates that each tile 360 includes a two-dimensional array 344 of pixels 346 (e.g., 10-by-10 array of pixels). In some other embodiments, the tiles 360 may include different numbers of pixels (e.g., 40-by-40 pixels).

In some embodiments, the two-dimensional array 344 of pixels 346 does not encompass the entire surface of tile 360, as shown in FIG. 3B. In such embodiments, a portion of tile 360 (e.g., an area along a periphery of tile 360) not covered by the pixels 346 includes electronic circuits for operating pixels 346 on tile 360 (e.g., adjusting individual pixels 346 and/or subpixels to turn on or off).

In FIG. 3B, each pixel 346 includes a plurality of subpixels (e.g., subpixel 348, 350, 352, and 354), where each subpixel corresponds to a respective color. For example, each pixel may include three subpixels, each subpixel outputting light of one of red, green, and blue colors. In another example, each pixel may include four subpixels, each subpixel outputting to one of red, green, blue, and yellow colors (e.g., subpixel 348 outputs red light, subpixel 350 outputs green light, subpixel 352 outputs blue light, and subpixel 354 outputs yellow light). In some cases, this is enabled by placing different color filters in front of the subpixels. In some embodiments, the subpixels in each pixel have the same size (e.g., the red subpixel, the green subpixel, and the blue subpixel have the same size), while in some other embodiments, the subpixels have different sizes (e.g., to compensate for different intensities of light of different colors).

In some embodiments, each tile 360 in the two-dimensional array of tiles has a same configuration. For example, each tile may have the same shape and size, and include a same number of pixels. In some embodiments, tiles in the two-dimensional array of tiles have different configurations (e.g., tiles having one of two different configurations are alternated).

In some embodiments, each tile includes a two-dimensional array of lenses. For example, the tile may have the same number of pixels and lenses so that each pixel is coupled with a respective lens. In some embodiments, each single lens is integrated with a respective pixel (e.g., each single lens is placed on, or included as part of, the respective pixel).

Figure 3C:
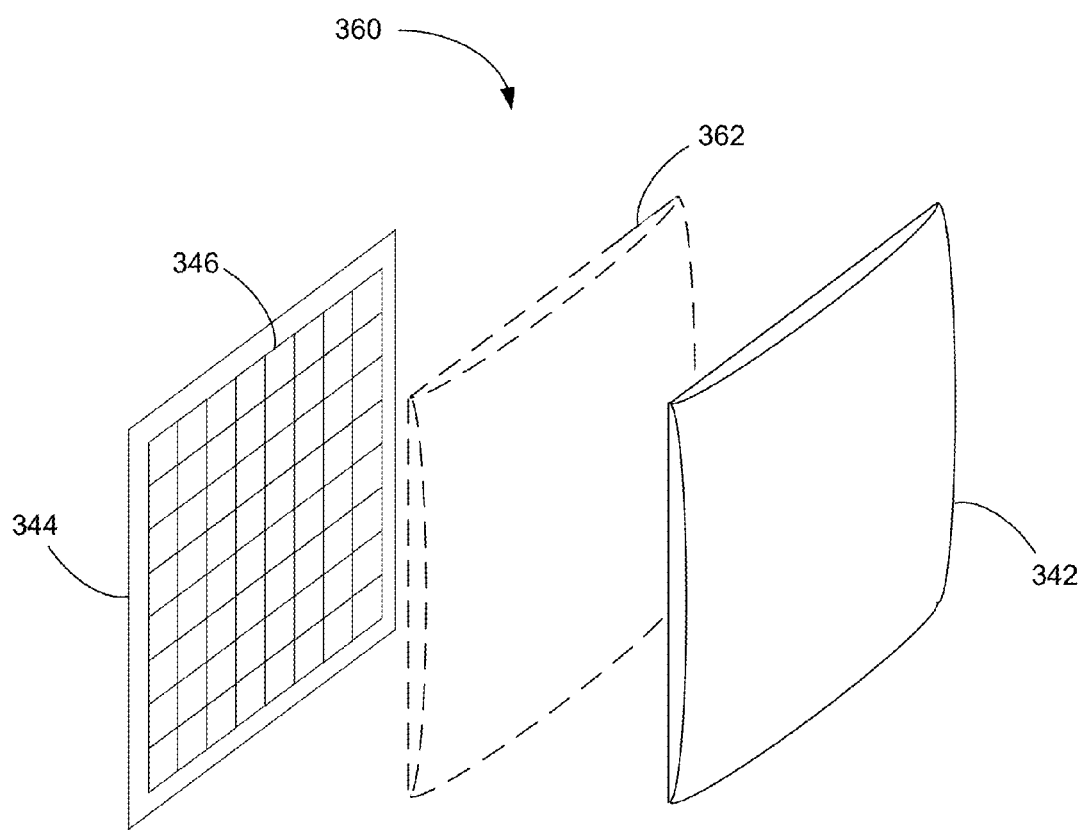
FIG. 3C is a perspective view of a tile in accordance with some embodiments.

FIG. 3C is a perspective view of tile 360 in accordance with some embodiments. As explained above, tile 360 includes two-dimensional array 344 of pixels 346 and lens 342, which may be a lenslet of a microlens array (e.g., microlens array 315 in FIG. 3A). In some embodiments, tile 360 includes a single lens. In some other embodiments, tile 360 includes two or more lenses along the optical axis (e.g., second lens 362 is located between pixels 346 and lens 342).

Figure 3D:
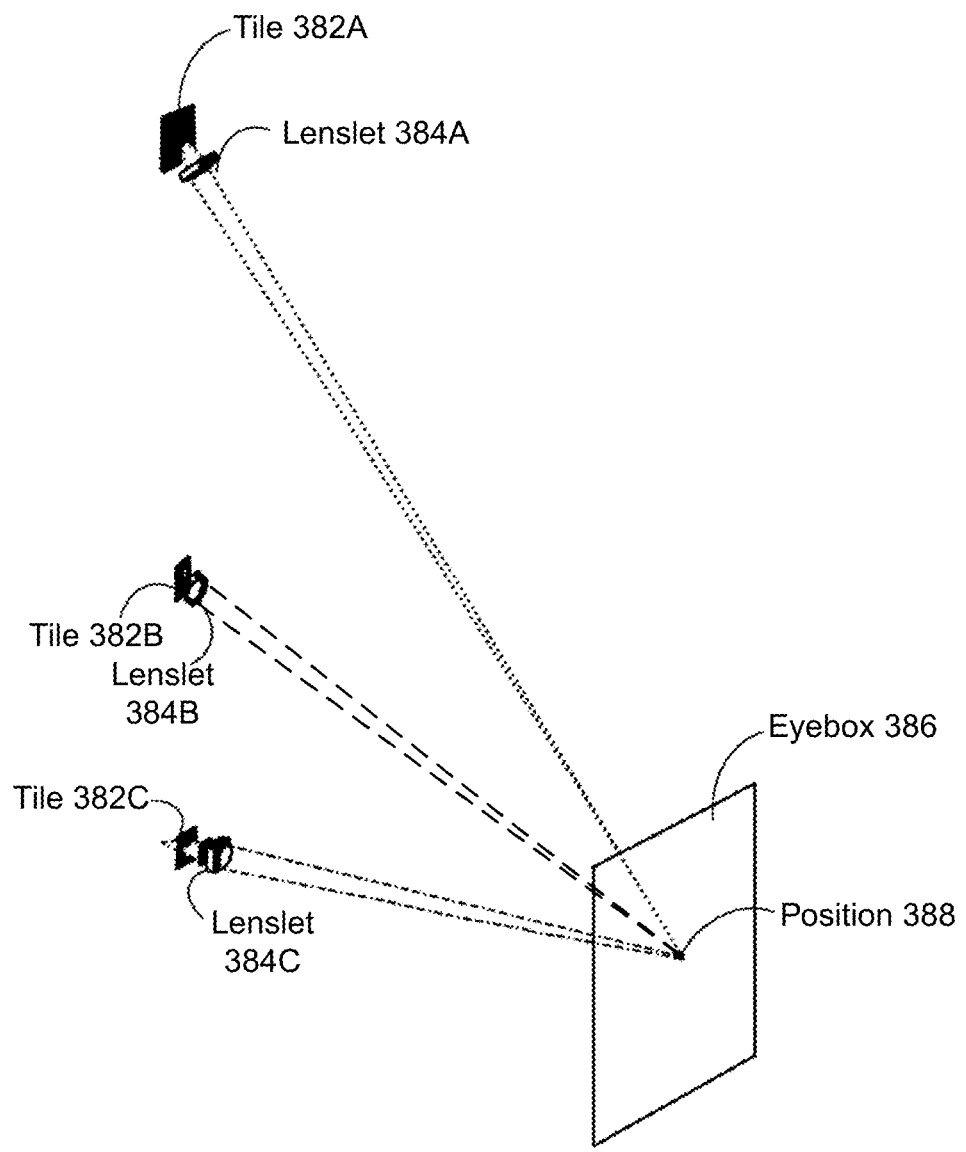
FIG. 3D is a perspective view of a portion of the adjustable electronic display element in accordance with some embodiments.

FIG. 3D is a perspective view of a portion of the adjustable electronic display element in accordance with some embodiments. The perspective view 380 includes a portion of the electronic display element and eyebox 386. For example, the portion includes tiles 382A, 382B, and 382C, and lenslets 384A, 384B, and 384C in those tiles. In some cases, eyebox 386 has a dimension of 10 mm×10 mm, although eyeboxes of different sizes can be used. When pupil 330 is at position 388, the image is rendered for this portion of eyebox 386, and light is directed from different tiles, including tiles 382A, 382B, and 382C to form an image on a retina of the eye.

Figure 3E:
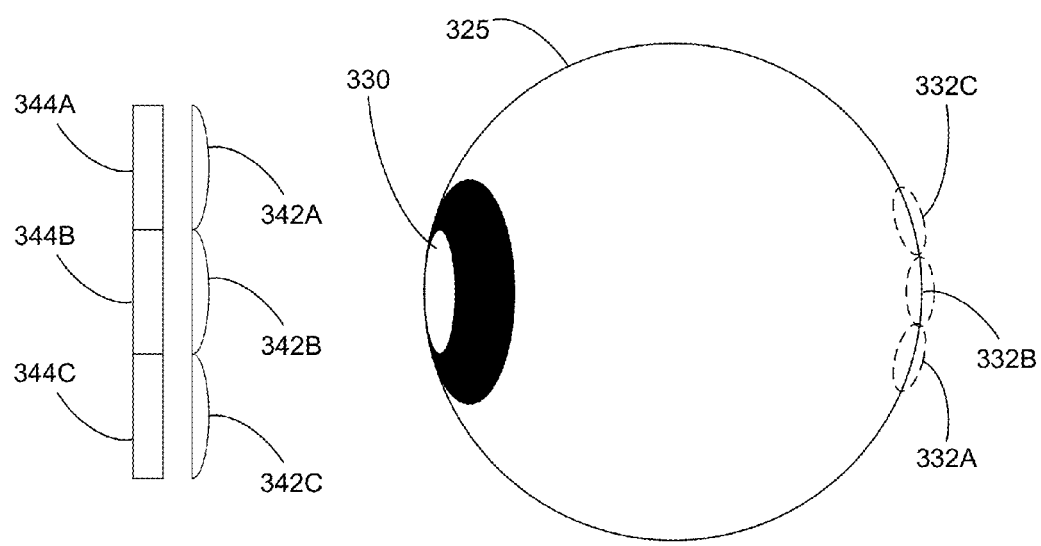
FIGS. 3E-3G are schematic diagrams illustrating an exemplary operation of tiles in accordance with some embodiments.
Figure 3F:
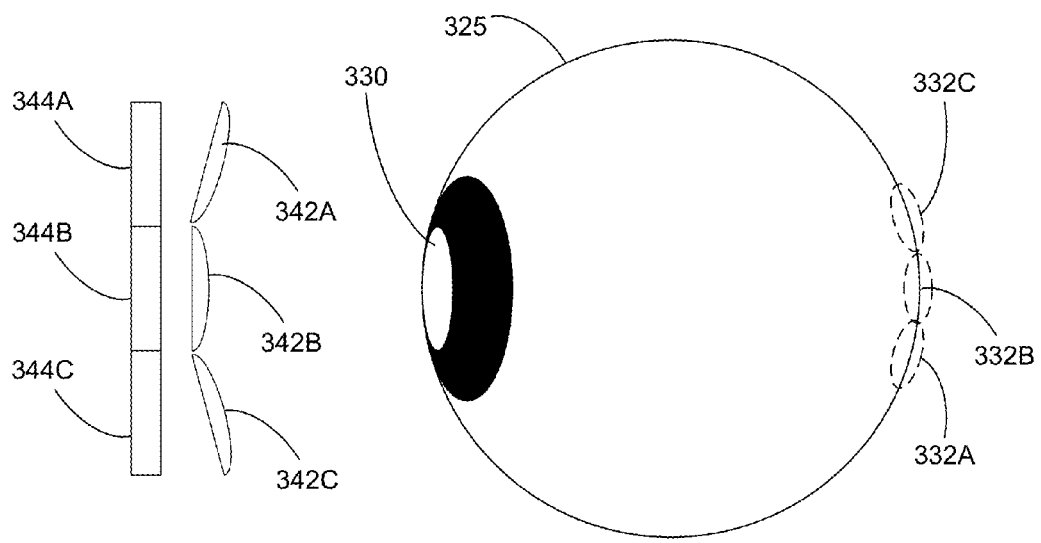
Figure 3G:
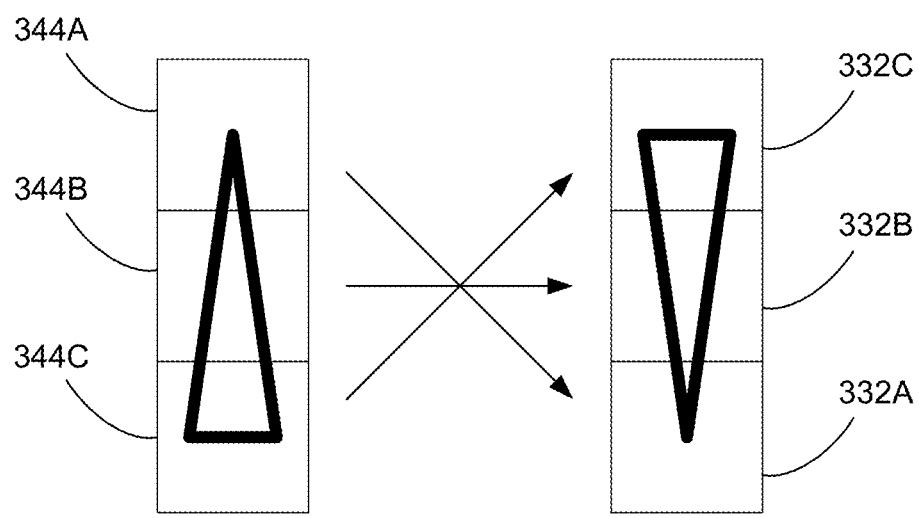

FIGS. 3E-3G are schematic diagrams illustrating exemplary operations of tiles in accordance with some embodiments.

FIG. 3E illustrates three tiles (e.g., a first tile with group 344A of pixels and lens 342A, a second tile with group 344B of pixels and lens 342B, and a third tile with group 344C of pixels and lens 342C). Pixels 344 in each tile render a respective pattern of light, which is directed by lens 342 in the tile to pupil 330 of eye 325. The respective pattern of light from group 344A of pixels forms an image on a first portion 332A of a retina of eye 325, the respective pattern of light from group 344B of pixels forms an image on a second portion 332B of the retina of eye 325, and the respective pattern of light from group 344C of pixels forms an image on a third portion 332C of the retina of eye 325, as shown in FIG. 3G. Thus, the respective patterns of light from pixel groups 344A, 344B, and 344C form a collective pattern of light, which is seamlessly projected onto the retina of eye 325, which is perceived by the eye as a single image. In some embodiments, as shown in FIG. 3F, one or more lenses (e.g., lens 342A and 342C) are tilted to better direct light toward pupil 330 of eye 325.

It should be noted that display devices described herein are distinct from what is known as light field displays. Light field displays project partially overlapping series of images. However, light field displays have a limited field of view. In comparison, the disclosed display devices provide a large field of view that has not been possible with light field displays, and therefore, can be used for a wider range of applications.

Figure 3H:
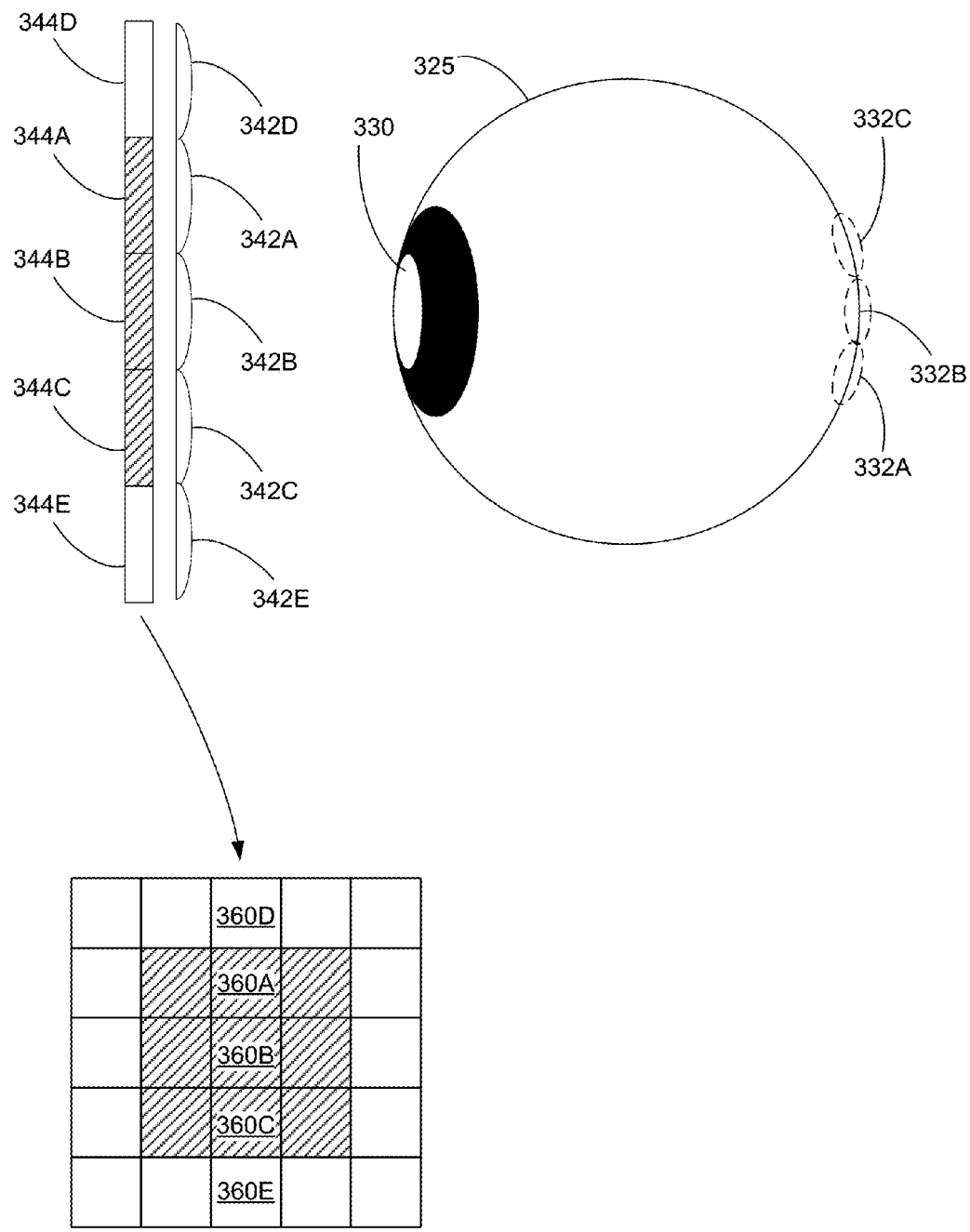
FIGS. 3H and 3I are schematic diagrams illustrating exemplary operations of activating a subset of tiles in accordance with some embodiments.
Figure 3I:
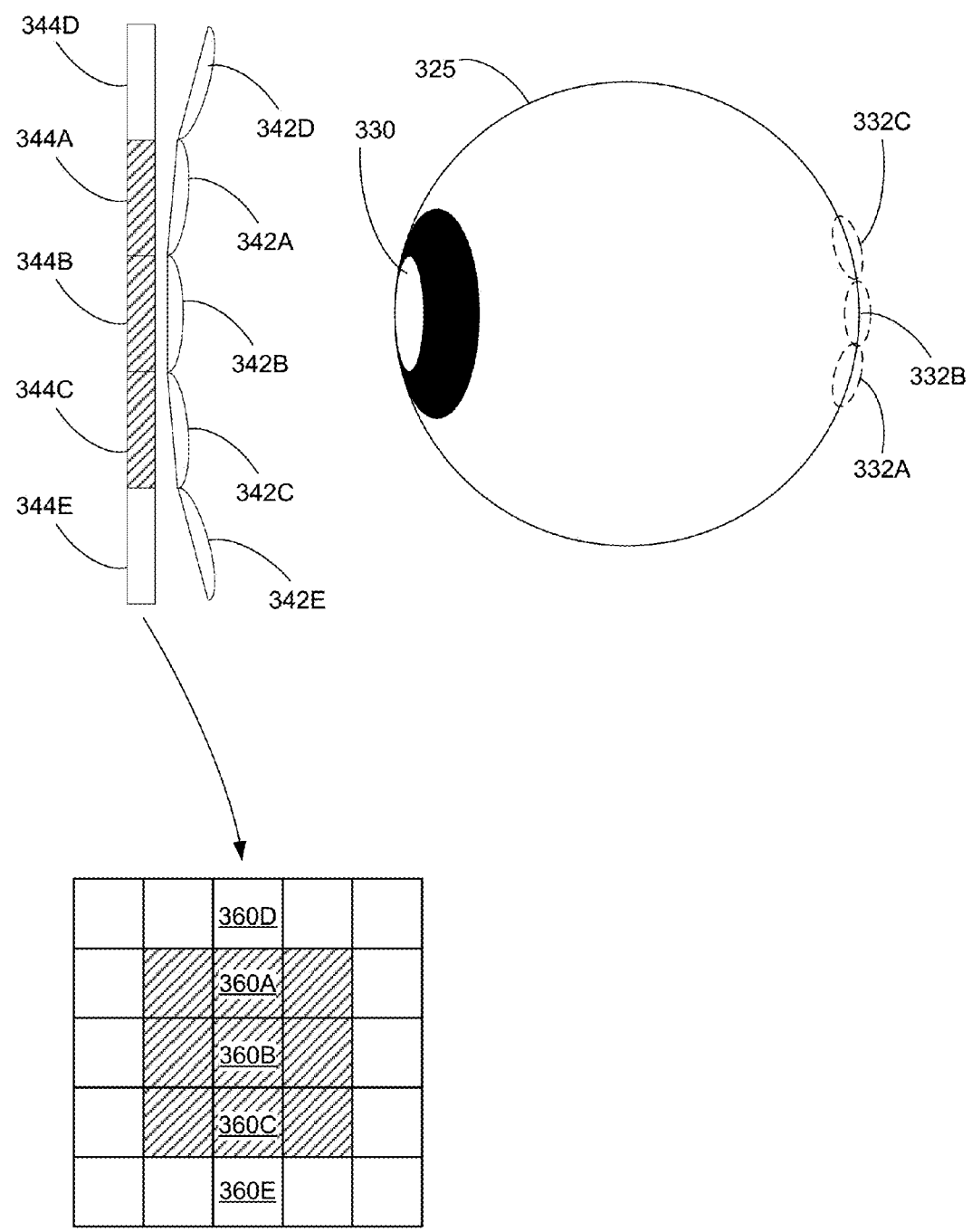

FIGS. 3H and 3I are schematic diagrams illustrating exemplary operations of activating a subset of tiles in accordance with some embodiments. FIG. 3H illustrates an array of 5-by-5 tiles, where five tiles out of the 25 tiles are shown in the side view (e.g., tiles with pixel groups 344D, 344A, 344B, 344C, and 344E and corresponding lenses 342D, 342A, 342B, 342C, and 342E). As explained above with respect to FIGS. 3E-3G, the respective pattern of light from group 344A of pixels forms an image on a first portion 332A of a retina of eye 325, the respective pattern of light from group 344B of pixels forms an image on a second portion 332B of the retina of eye 325, and the respective pattern of light from group 344C of pixels forms an image on a third portion 332C of the retina of eye 325. However, group 344D of pixels and group 344E of pixels are not activated. In some embodiments, group 344D of pixels and group 344E of pixels are not activated, because light output from group 344D of pixels and group 344E of pixels cannot be directed to pupil 330 of eye 325 (or because the light output from group 344D of pixels and group 344E of pixels cannot form an image on the retina of eye 325). In some embodiments, group 344D of pixels and group 344E of pixels are not activated, because the light output from group 344D of pixels and group 344E of pixels are not necessary for forming an image on the retina of eye 325. In some embodiments, group 344D of pixels and group 344E of pixels are not activated, because light output from group 344D of pixels and group 344E of pixels cannot be directed to pupil 330 of eye 325 (or because the light output from group 344D of pixels and group 344E of pixels cannot form an image on the retina of eye 325).

In some embodiments, a group of pixels that is not activated does not output light toward the pupil of the eye. In some embodiments, a group of pixels that is not activated does not output light at all. In some embodiments, a group of pixels that is not activated is turned off or remains in a power savings mode, thereby reducing consumption of energy.

FIG. 3H also illustrates that out of the twenty-five tiles, nine contiguous tiles (including tiles 360A, 360B, and 360C) are activated (which are shaded in FIG. 3H) and the remaining sixteen tiles (including tiles 360D and 360E) are not activated (which are not shaded in FIG. 3H).

In some embodiments, as shown in FIG. 3I, one or more lenses (e.g., lens 342A, 342C, 342D, and 342E) are tilted to better direct light toward pupil 330 of eye 325.

Figure 4A:
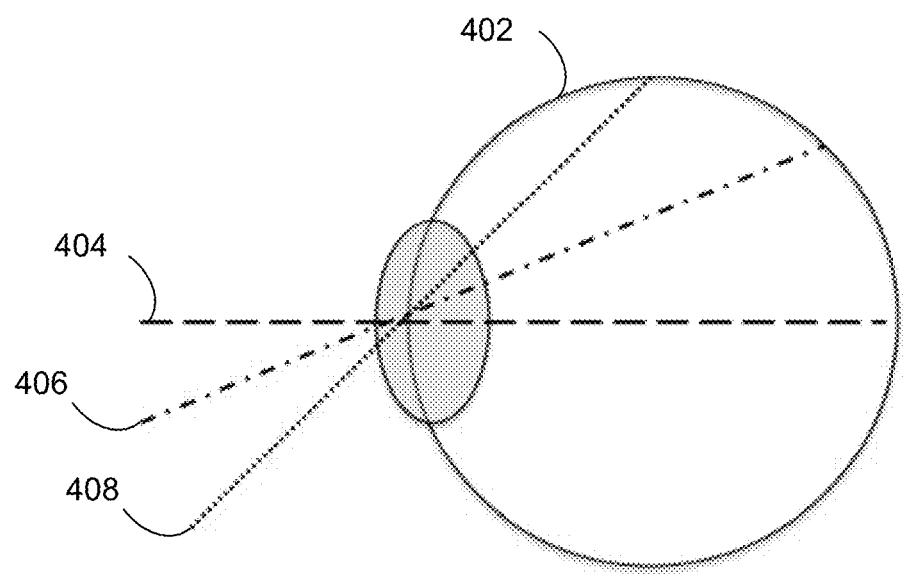
FIGS. 4A and 4B are schematic diagrams illustrating back reflection of light entering an eye in accordance with some embodiments.
Figure 4B:
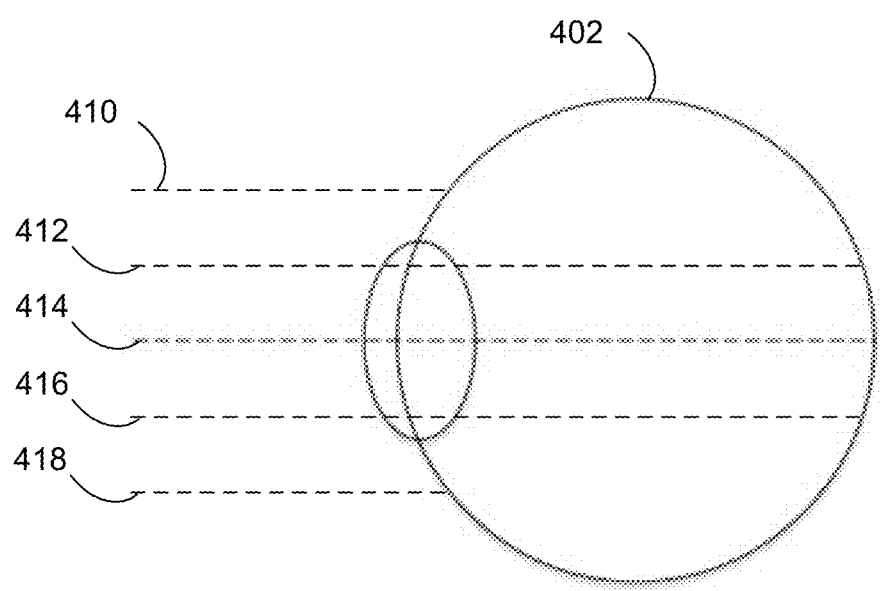

FIGS. 4A and 4B are schematic diagrams illustrating back reflection of light entering eye 402 in accordance with some embodiments.

In some embodiments, a retina of an eye reflects infrared light (e.g., a deer in the headlights). In particular, a central region of the retina has a higher reflectivity than a non-central region of the retina. For example, in FIG. 4A, ray 404 of light hitting a central region of the retina is reflected better than rays 406 and 408 of light hitting non-central regions of the retina. Thus, by measuring the intensity of the reflected light, an angle (or a gaze) of eye 402 can be determined.

In FIG. 4B, rays 412, 414, and 46 of light entering eye 402 are reflected better by the retina of eye 402 than rays 410 and 418 of light, which are reflected by a sclera of eye 402. In addition, ray 414 of light that is reflected by a central region of eye 402 is reflected better than rays 412 and 416 of light that are reflected by non-central regions of eye 402.

Figure 4C:
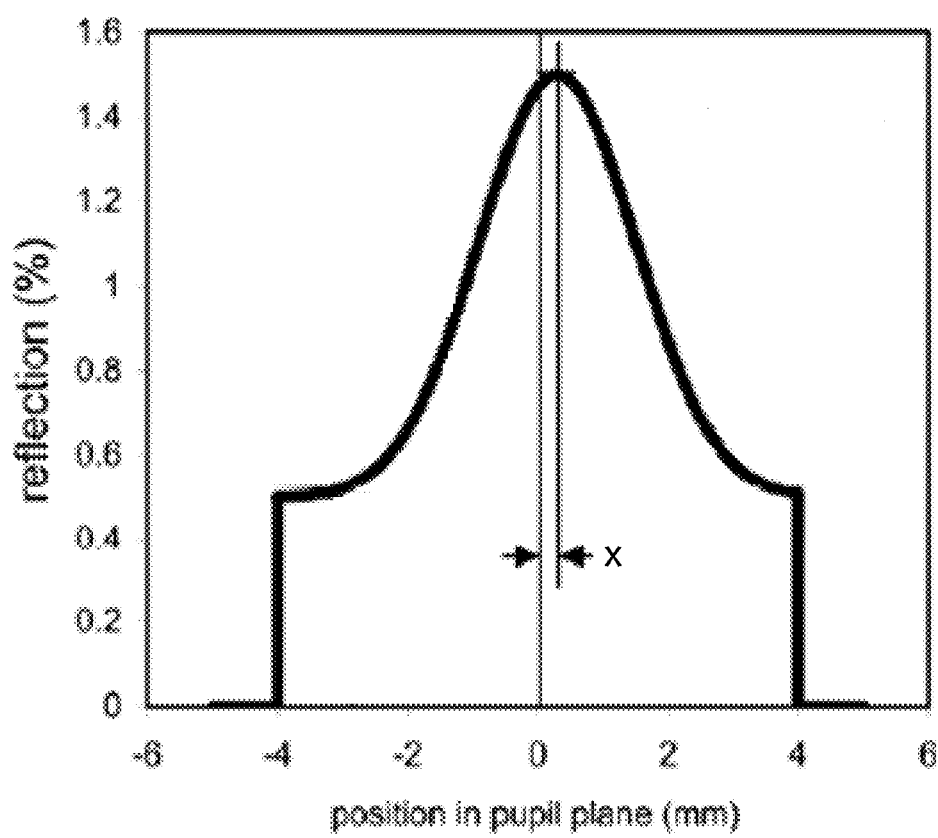
FIG. 4C is a graph representing intensity of light reflected by an eye in accordance with some embodiments.

FIG. 4C is a graph representing intensity of light reflected by an eye in accordance with some embodiments. As shown in FIG. 4C, light reflected by a central region of an eye has a higher intensity than a non-central region of the eye. Thus, in some embodiments, a location of the eye (e.g., a location of a pupil of the eye) is determined from a profile of the intensity of light reflected by the eye (e.g., a location with the highest intensity of reflected light corresponds to a position of a center of the eye).

Figure 4D:
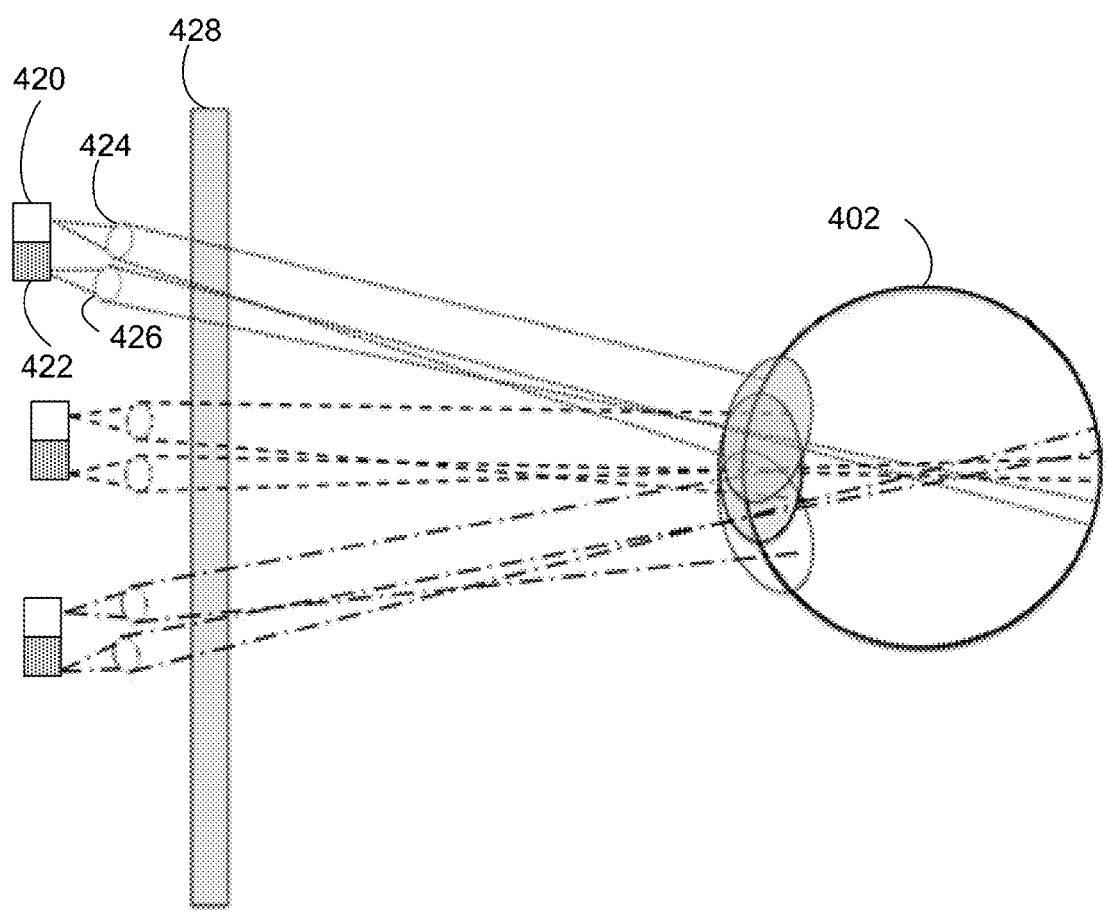
FIGS. 4D-4F are schematic diagrams illustrating methods of determining a location of a pupil in accordance with some embodiments.
Figure 4E:
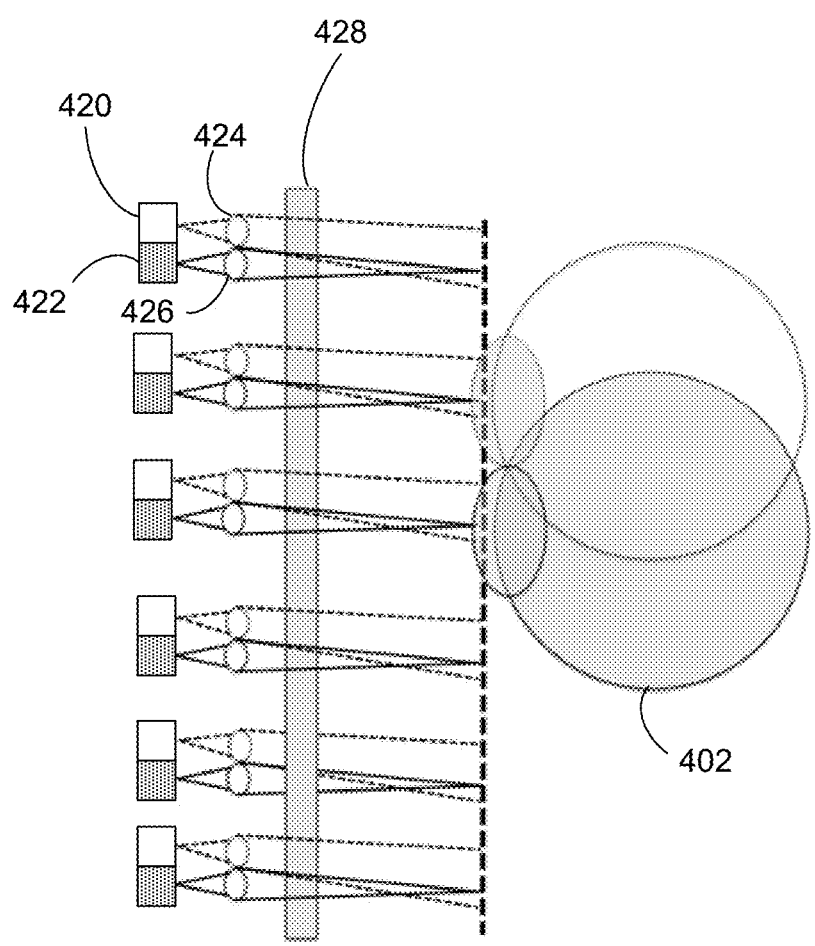
Figure 4F:
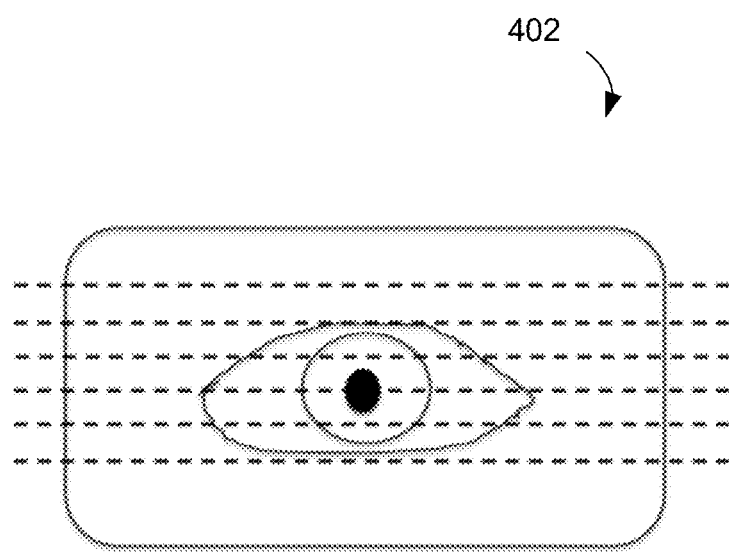

FIGS. 4D-4F are schematic diagrams illustrating methods of determining a location of a pupil in accordance with some embodiments.

In FIG. 4D, emitters 422 and sensors 420 are used to determine a location of a pupil of eye 402. In some embodiments, as shown in FIG. 4D, one emitter 422 is paired with one sensor 420 to determine the location of the pupil of eye 402. For example, emitter 422 is configured to emit non-visible light (e.g., infrared light). Sensor 420 is configured to receive reflected non-visible light (e.g., non-visible light reflected by eye 402). From a profile of the intensity of light received by sensors 420, an angle (or a gaze) of eye 402 is determined. In some embodiments, when light from emitters 422 is directed toward a pupil of eye 402, sensor 420 with a highest intensity of the reflected light is determined to correspond to the angle (or the gaze) of eye 402. In some embodiments, the device includes a single emitter. In some embodiments, the device includes a single sensor. In some embodiments, sensors 420 are arranged in an array (e.g., the device includes an array of sensors). In some embodiments, emitters 422 are arranged in an array (e.g., the device includes an array of emitters).

In some embodiments, as shown in FIG. 4D, the display device includes lens 424 and/or lens 426. Lens 426 is configured to direct light from emitter 422 toward eye 402. Lens 424 is configured to direct light reflected by eye 402 toward sensor 420.

In some embodiments, the display device includes one or more polarizers 428 (e.g., a combination of a linear polarizer and a quarter wave plate) to reduce specular reflection of light by a cornea of eye 402.

In FIG. 4E, an array of emitter-sensor pairs is used to determine a position of eye 402. Lens 426 is configured to direct light independently of a location of eye 402 (e.g., forward). In FIG. 4E, light from an array of emitters 422 is directed forward, instead of being directed toward a single location (e.g., a pupil of eye 402) as shown in FIG. 4D. In some embodiments, sensor 420 with a highest intensity of the reflected light is determined to correspond to a position of eye 402 (or a position of a pupil of eye 402).

FIG. 4F illustrates that, in some embodiments, an intensity of light reflected from different positions of eye 402 is sequentially measured. For example, at least a portion of the eye is linearly scanned (e.g., in a raster pattern).

Figure 4G:
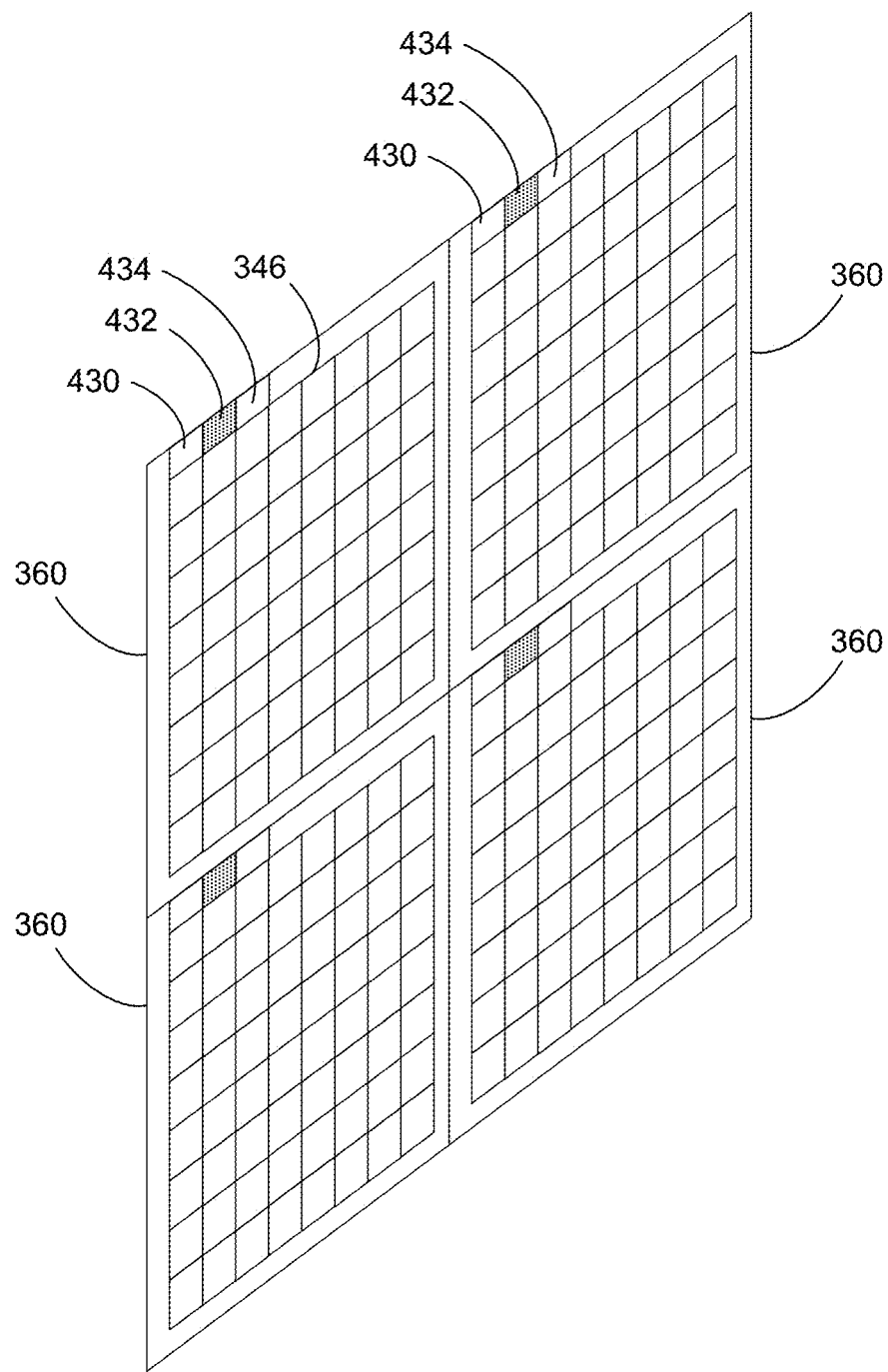
FIG. 4G is a perspective view of a portion of a two-dimensional array of tiles in accordance with some embodiments.

FIG. 4G is a perspective view of a portion of a two-dimensional array of tiles 360 in accordance with some embodiments. As shown in FIG. 4G, each tile 360 in FIG. 4G includes a two-dimensional array of pixels 346 formed on a substrate. FIG. 4G also illustrates that each tile 360 includes emitter 432 and one or more sensors 430 and 434 formed on the same substrate. Thus, the two-dimensional array of pixels 346, emitter 432, and one or more sensors 430 and 434 are located on a same plane. Although FIG. 4G shows that each tile 360 has one emitter 432, in some embodiments, each tile 360 has multiple emitters (e.g., each tile 360 may have as many emitters as a number of pixels in tile 360). In some embodiments, multiple tiles collectively have one emitter (e.g., a group of two or four tiles has only one emitter).

Figure 4H:
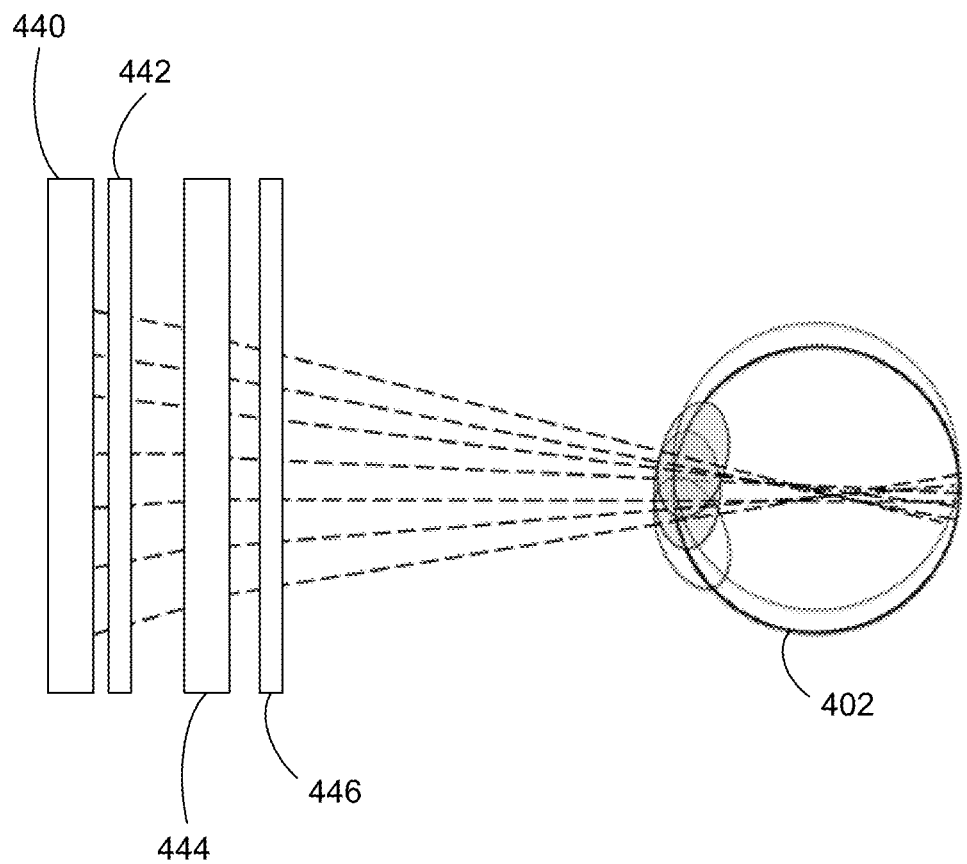
FIG. 4H is a schematic diagram of a display device in accordance with some embodiments.

FIG. 4H is a schematic diagram of a display device in accordance with some embodiments.

The display device includes sensor panel 440 that includes one or more emitters (e.g., an array of emitters) and one or more sensors (e.g., an array of sensors). In some embodiments, the emitters are interspersed within the sensors.

In some embodiments, the display device also includes array 442 of lenses configured for directing light from emitters toward eye 402 and direct light, reflected by eye 402, toward sensors.

The display device includes two-dimensional array 444 of tiles. In some embodiments, two-dimensional array 444 of tiles is transparent to infrared light. Thus, infrared light emitted by emitters in sensor panel 440 passes through two-dimensional array 444 of tiles toward eye 402. Similarly, infrared light, reflected by eye 402, passes through two-dimensional array 444 of tiles toward sensor panel 440.

In some embodiments, the display device also includes array 446 of lenses (or an array of lens assemblies), which are described above. For brevity, the detailed description of array 446 of lenses is not repeated herein.

Figure 4I:
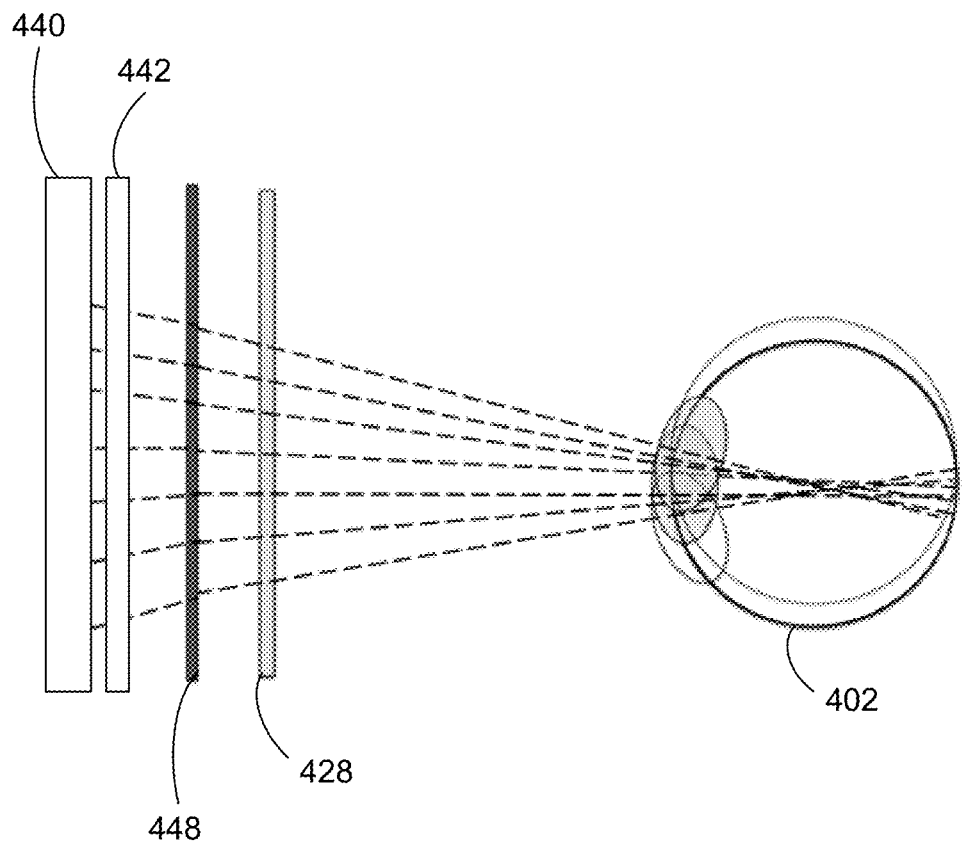
FIG. 4I is a schematic diagram of a display device in accordance with some embodiments.

FIG. 4I is a schematic diagram of a display device in accordance with some embodiments.

In FIG. 4I, the display device includes electro-optics 448 (or an array of electro-optic elements). Electro-optics 448 is configured to adjust focusing and/or steering of light propagating from and/or toward sensor panel 440. In some embodiments, electro-optics 448 includes a liquid crystal layer.

In some embodiments, the two-dimensional array of tiles is integrated in sensor panel 440. Thus, the same lens array 442 is used for directing light from emitters and light from the two-dimensional array of pixels. This reduces, or eliminates, the need for complex processing of image collected by the sensors, because the sensors are collocated with the display pixels. Light from a display pixel and light collected by a sensor adjacent to the display pixel follow paths, that are proximate to each other, through a same lens.

Figure 4J:
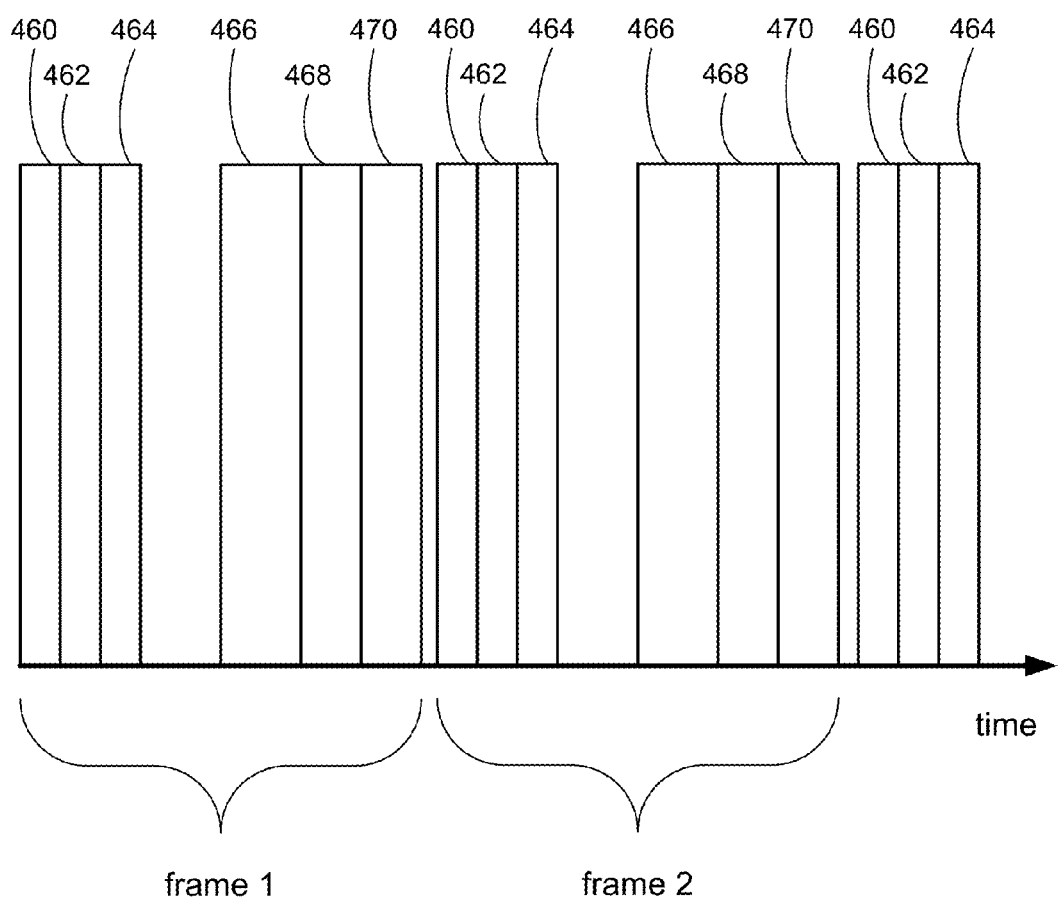
FIG. 4J is a timing diagram illustrating an operation of an eye tracker in accordance with some embodiments.

FIG. 4J is a timing diagram illustrating an operation of an eye tracker in accordance with some embodiments.

In FIG. 4J, the operation of the eye tracker is illustrated with respect to frames. Each frame corresponds to preselected time duration (e.g., 10 ms). A series of operations is performed within a single frame.

In some embodiments, a reset voltage (e.g., a global pixel voltage) is provided (460) to the pixels, which clears (or resets) liquid crystals in pixels. Subsequently, an eye tracking operation is performed (462) to determine a location of a pupil of an eye (and an angle of the eye). Information about the location of the eye (e.g., the location of the pupil of the eye and/or the angle of the eye) is provided (464) to one or more processors (e.g., processor(s) 216, FIG. 2). In some embodiments, the one or more processors subsequently render one or more frames for display.

Pixel voltages are applied (466) to the pixels, which initiates placing the pixels in respective states for displaying a rendered frame. In some embodiments, voltages are applied to activate electro-optic components (e.g., liquid crystal lenses and/or beam steerers). In some embodiments, the display device waits (468) until liquid crystals in respective pixels settle. Subsequently, the display device turns on a backlight so that a respective pattern of light is output from a respective tile.

In some embodiments, these steps are repeated for subsequent frames.

Certain embodiments based on these principles are described below.

In accordance with some embodiments, display device 100 includes a two-dimensional array of tiles (e.g., two-dimensional array of tiles 340 in FIG. 3B). Each tile (e.g., tile 360 in FIG. 3C) includes a two-dimensional array of pixels (e.g., two-dimensional array 340 of pixels 346 in FIG. 3C). Each pixel is configured to output light so that the two-dimensional array of pixels outputs a respective pattern of light (e.g., two-dimensional array of pixels 344A in FIG. 3G outputs a pattern of light that corresponds to a top portion of a triangle, two dimensional array of pixels 344B in FIG. 3G outputs a pattern of light that corresponds to a middle portion of the triangle, and two-dimensional array of pixels 344C in FIG. 3G outputs a pattern of light that corresponds to a bottom portion of the triangle). The tile also includes a lens (e.g., lens 342 in FIG. 3C), of a two-dimensional array of lenses, configured to direct at least a portion of the respective pattern of light from the two-dimensional array of pixels to a pupil of an eye of a user. Display device 100 includes one or more sensors for determining a location of the pupil of the eye of the user (e.g., sensor plate 440 in FIG. 4H). In some embodiments, display device 100 includes an array of sensors for determining the location of the pupil of the eye of the user.

In some embodiments, display device 100 includes a substrate (e.g., sensor plate 440). The two-dimensional array of pixels and the one or more sensors are located on the same substrate. In some embodiments, the array of sensors is located on the same substrate.

In some embodiments, each tile includes one or more sensors. In some embodiments, each tile includes at least one sensor of the array of sensors (e.g., each tile 360 includes sensor 430, FIG. 4G). In some embodiments, display device 100 includes only one sensor for determining the location of the pupil of the eye of the user.

In some embodiments, display device 100 includes an array of emitters configured to emit non-visible light (e.g., an array of emitters 432 in FIG. 4G). Each emitter is coupled with a respective sensor (e.g., each emitter 432 is coupled with respective sensor 430). In some embodiments, each emitter is coupled with a respective sensor of the array of sensors. In some embodiments, display device 100 includes only a single emitter.

In some embodiments, display device 100 includes an array of emitters (e.g., an array of emitters 432 in FIG. 4G) configured to emit non-visible light (e.g., infrared light). Each emitter is coupled with a respective group of multiple sensors located adjacent to the emitter (e.g., in FIG. 4G, each emitter 432 is coupled with adjacent sensors 430 and 434). In some embodiments, each emitter is coupled with a respective group of multiple sensors, of the array of sensors, located adjacent to the emitter.

In some embodiments, display device 100 includes multiple arrays of sensors for determining the location of the pupil of the eye of the user (e.g., an array of sensors 430 and a separate array of sensors 434). A respective array is separate from the rest of the multiple arrays of sensors. This allows a shorter interval between eye tracking operations. For example, each sensor may have a certain delay in collecting light received by the sensors so that an interval between determining positions of a pupil of an eye is 10 ms. By using a first half of the sensors (e.g., sensors 430) concurrently and subsequently using a second half of the sensors (e.g., sensors 434) together, the interval between determining positions of the pupil of the eye is reduced to 5 ms (=10 ms/2). When three groups of sensors are used, the interval between determining positions of the pupil of the eye is reduced to 3.3 ms (≈10 ms/3).

In some embodiments, display device 100 includes one or more polarizers (e.g., one or more polarizers 428 in FIG. 4D) configured to reduce light reflected from a cornea of the eye of the user toward the one or more sensors. In some embodiments, display device 100 includes one or more polarizers (e.g., one or more polarizers 428 in FIG. 4D) configured to reduce light reflected from a cornea of the eye of the user toward the array of sensors.

In some embodiments, display device 100 includes one or more processors (e.g., processor(s) 216, FIG. 2) coupled with the two-dimensional array of tiles and configured to select a subset of the two-dimensional array of tiles based on the location of the pupil of the eye of the user and activate the subset of the two-dimensional array of tiles for outputting, from at least the subset of the two-dimensional array of tiles, a collective pattern of light that is directed to the pupil of the eye of the user. For example, when the position of the pupil of the eye is determined, tiles that are located far from the position of the pupil of the eye are not selected. Because the tiles that are located far from the position of the pupil of the eye are not likely to output light that will enter the pupil of the eye of the user, by keeping the tiles that are located far from the position of the pupil of the eye off, the display device can save power.

In some embodiments, the one or more processors (e.g., processor(s) 216, FIG. 2) are configured to activate the one or more sensors for determining the location of the pupil of the eye of the user between activating the subset of the two-dimensional array of tiles. For example, the one or more sensors are activated in frame 2 (FIG. 4J) between determining activating a subset of a two-dimensional array of tiles in frame 1 and activating a subset of the two-dimensional array of tiles in frame 2. In some embodiments, the one or more processors are configured to activate the array of sensors for determining the location of the pupil of the eye of the user between activating the subset of the two-dimensional array of tiles.

In some embodiments, the one or more processors (e.g., processor(s) 216, FIG. 2) are configured to concurrently activate less than all of the sensors for determining the location of the pupil of the eye of the user. In some embodiments, the one or more processors are configured to activate at least a subset of the array of sensors concurrently for determining the location of the pupil of the eye of the user. For example, as shown in FIG. 4E, multiple sensors are activated concurrently to determine the location of the pupil of the eye of the user.

In some embodiments, the one or more processors are configured to sequentially activate at least a subset of the array of sensors for determining the location of the pupil of the eye of the user. For example, as shown in FIG. 4D, multiple sensors are activated to determine the angle (or the gaze) of eye 402. In some embodiments, the multiple sensor are activated sequentially (e.g., in a raster pattern). In some embodiments, the multiple sensors are activated concurrently.

In some embodiments, the one or more processors are configured to sequentially activate less than all of the sensors for determining an angle of the pupil of the eye of the user. In some embodiments, the one or more processors are configured to activate at least a subset of the array of sensors sequentially for determining an angle of the pupil of the eye of the user. In some embodiments, the subset of the array of sensors is selected based on the location of the pupil of the eye of the user (e.g., the location of the pupil of the eye of the user is determined by activating at least a subset of the array of sensors concurrently, followed by sequentially activating the subset of the array of sensors for determining the angle of the pupil of the eye).

In some embodiments, the one or more processors are configured to concurrently activate at least a subset of the sensors for determining the location of the pupil of the eye of the user and subsequently activate sequentially at least a subset of the sensors for determining an angle of the pupil of the eye of the user. In some embodiments, the one or more processors are configured to concurrently activate at least a subset of the array of sensors for determining the location of the pupil of the eye of the user and subsequently activate sequentially at least a subset of the array of sensors for determining an angle of the pupil of the eye of the user.

In some embodiments, the one or more processors are configured to adjust the location of the pupil of the eye of the user for an interpupilary distance of the pupil of the eye of the user. For example, when the interpupilary distance of the pupil of the eye of the user is known (e.g., based on a manual input or a manual adjustment of the display device), the location of the pupil of the eye of the user is estimated based on the interpupilary distance of the pupil of the eye of the user.

Figure 5:
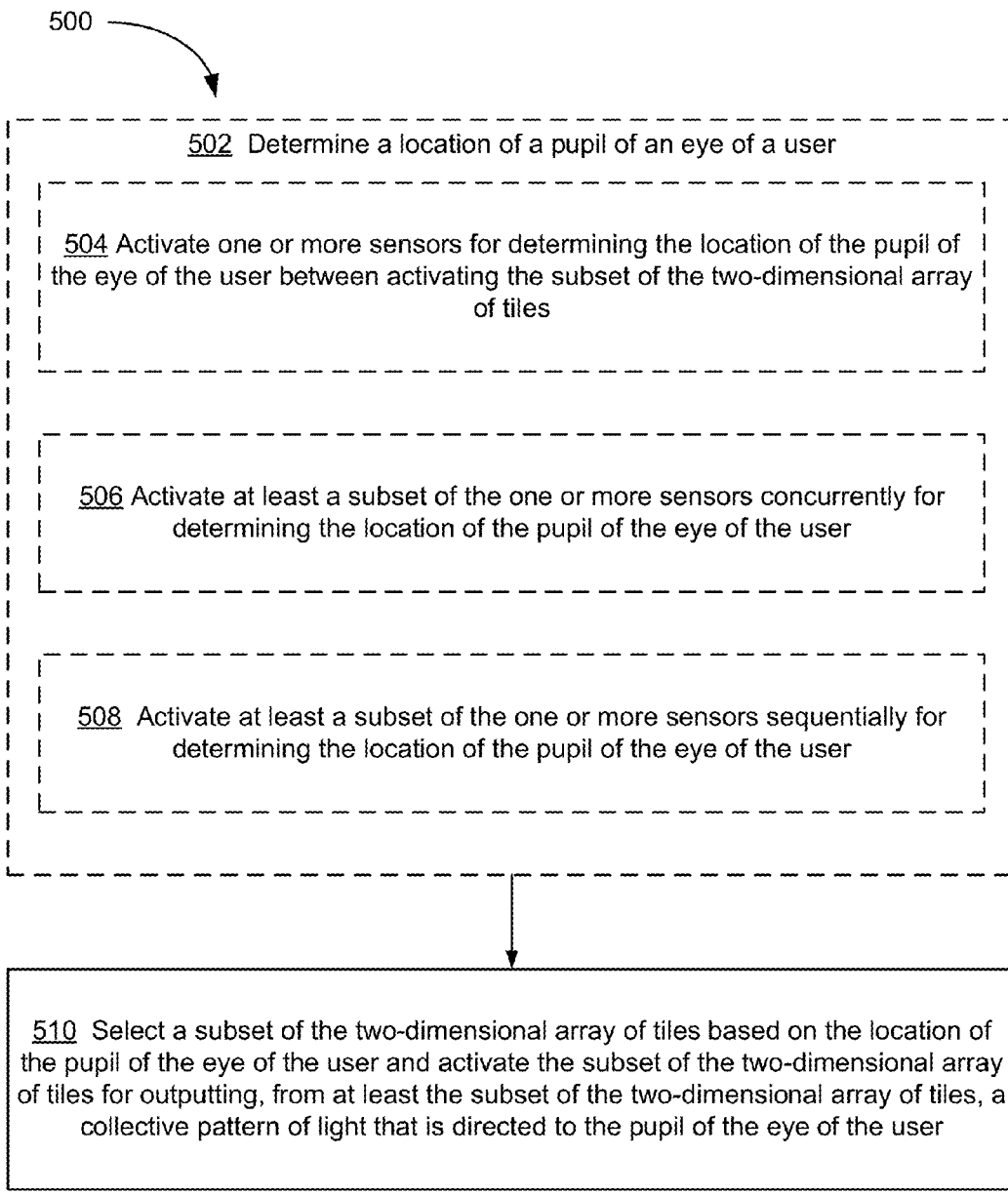
FIG. 5 is a flow diagram illustrating a method of activating a two-dimensional array of tiles based on a location of a pupil of an eye in accordance with some embodiments.

FIG. 5 is a flow diagram illustrating method 500 of activating a two-dimensional array of tiles based on a location of a pupil of an eye in accordance with some embodiments. Method 500 is performed at a display device (e.g., display device 100 in FIG. 1) comprising a two-dimensional array of tiles (e.g., FIG. 3B). Each tile includes (e.g., FIG. 3C) a two-dimensional array of pixels (e.g., 344). Each pixel is configured to output light so that the two-dimensional array of pixels outputs a respective pattern of light (e.g., FIG. 3G). Each tile also includes a lens (e.g., 342), of a two-dimensional array of lenses, configured to direct at least a portion of the respective pattern of light from the two-dimensional array of pixels to a pupil of an eye of a user (e.g., FIG. 3D). The display device also includes one or more sensors (e.g., an array of sensors) for determining a location of the pupil of the eye of the user.

In some embodiments, the display device determines (502) a location of a pupil of an eye of the user. For example, the display device sends non-visible light (e.g., infrared light) toward the eye of the user, and collects non-visible light that is reflected by the eye of the user. Based on an intensity profile of the light reflected by the eye of the user, the display device determines the location of the pupil of the eye of the user (e.g., a location with the highest intensity of the reflected light corresponds to the location of the pupil of the eye of the user).

In some embodiments, the display device activates (504) the one or more sensors for determining the location of the pupil of the eye of the user between activating the subset of the two-dimensional array of tiles (e.g., FIG. 4J). In some embodiments, the display device activates the array of sensors for determining the location of the pupil of the eye of the user between activating the subset of the two-dimensional array of tiles.

In some embodiments, the display device concurrently activates (506) at least a subset of the one or more sensors for determining the location of the pupil of the eye of the user (e.g., FIG. 4E). In some embodiments, the display device concurrently activates (506) at least a subset of the array of sensors for determining the location of the pupil of the eye of the user. In some embodiments, the display device concurrently activates a subset of the array of emitters for determining the location of the pupil of the eye of the user. For example, the display device concurrently activates all of the emitters and detects reflected light with the one or more sensors (e.g., the array of sensors) for determining the location of the pupil of the eye.

In some embodiments, the display device activates (508) at least a subset of the one or more sensors (e.g., the array of sensors) sequentially for determining the location of the pupil of the eye of the user (e.g., FIG. 4D). In some embodiments, the display device activates a subset of the array of emitters sequentially for determining the location of the pupil of the eye of the user. For example, the display device sequentially activates the array of emitters (in conjunction with sequentially activating the array of sensors) in a raster pattern.

In some embodiments, the display device activates a first subset of the array of emitters concurrently for determining the location of the pupil of the eye of the user and subsequently activates a second subset of the array of emitters sequentially for determining the location of the pupil of the eye of the user. For example, the display device activates the first subset of the array of emitters concurrently for determining the location of the pupil of the eye of the user with a first accuracy and the display device activates the second subset of the array of emitters sequentially for determining the location of the pupil of the eye of the user with a second accuracy that is distinct from the first accuracy. Alternatively, in some embodiments, the display device activates a first subset of the array of emitters sequentially for determining the location of the pupil of the eye of the user and subsequently activates a second subset of the array of emitters concurrently for determining the location of the pupil of the eye of the user.

The display device selects (510) a subset of the two-dimensional array of tiles based on the location of the pupil of the eye of the user and activates the subset of the two-dimensional array of tiles for outputting, from at least the subset of the two-dimensional array of tiles, a collective pattern of light that is directed to the pupil of the eye of the user. For example, tiles that are located far from the location of the pupil of the eye are not selected (and as a result, the tiles that are located far from the location of the pupil of the eye are not activated).

Figure 6A:
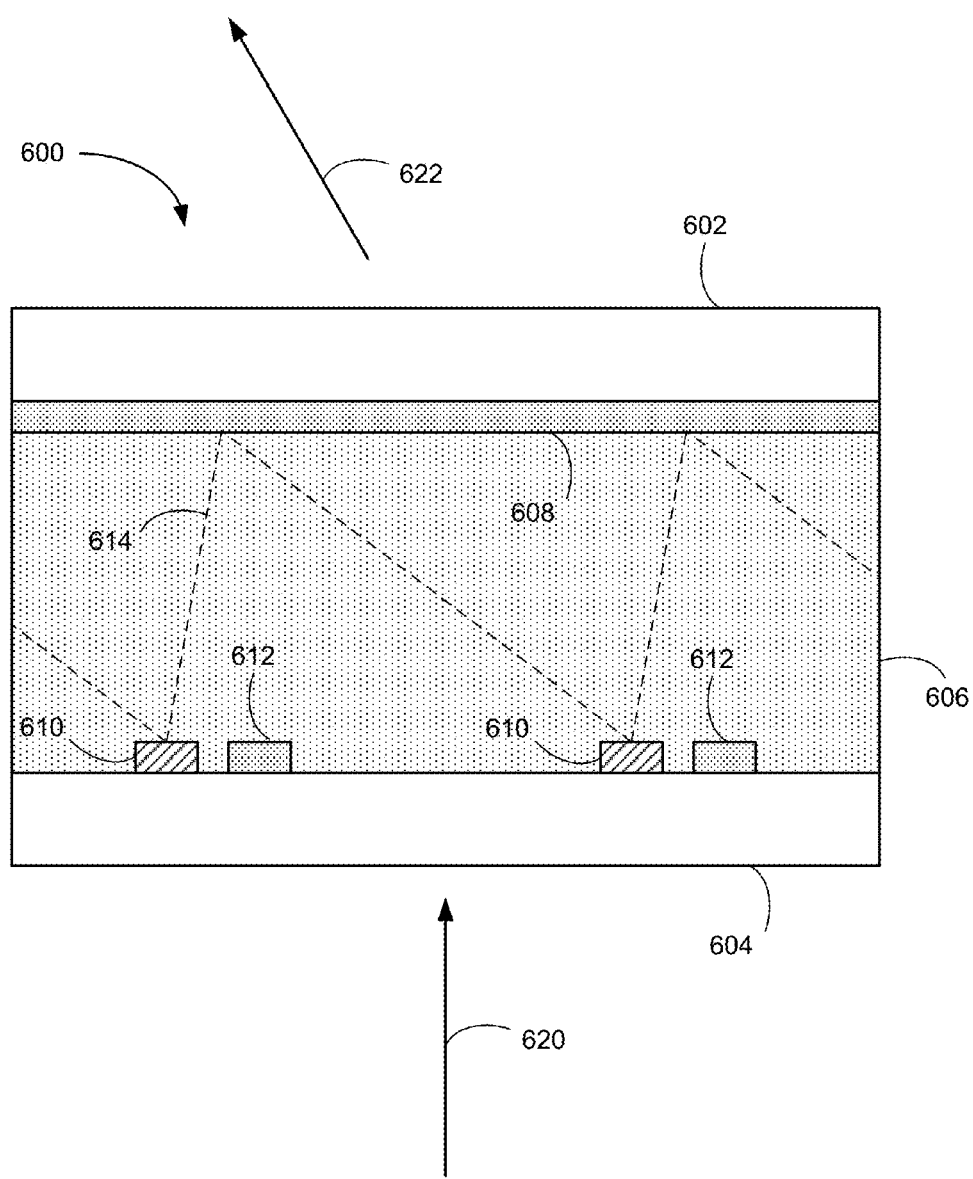
FIGS. 6A and 6B are partial cross-sectional views of an electro-optic element in accordance with some embodiments.
Figure 6B:
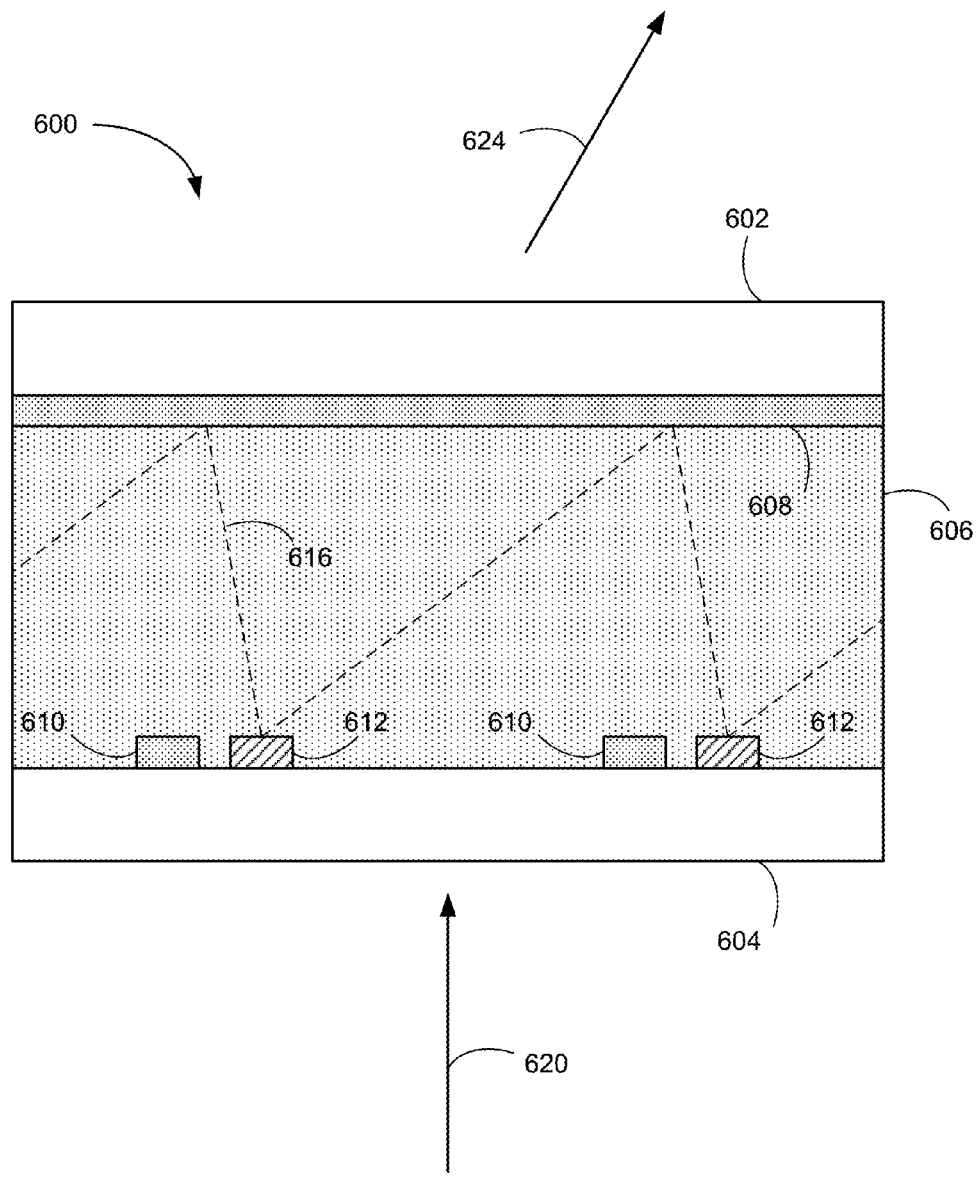

FIGS. 6A and 6B are partial cross-sectional views of an electro-optic element in accordance with some embodiments.

The electro-optic element includes transparent layers 602 and 604 (e.g., glass substrates) and liquid crystal layer 606 between transparent layers 602 and 604. The electro-optic element also includes electrode 608 (e.g., a planar electrode) on transparent layer 602 and electrodes 610 and 612 (e.g., patterned electrodes) on transparent layer 604. Although two electrodes 610 and two electrodes 612 are shown in FIGS. 6A and 6B, an electro-optic element may include three or more electrodes 610 and three or more electrodes 612 (e.g., 25 electrodes). In some embodiments, electrodes 610 and 612 are masked to reduce direct interaction between light and electrodes 610 and 612.

FIG. 6A illustrates that a first voltage (e.g., 5V) is applied to electrodes 610 and a ground voltage (e.g., 0V) is applied to electrodes 612 and 608, which causes liquid crystals to align based on the distribution of the electrical potential generated by the voltages applied to electrodes 608, 610, and 612.

Line 614 represents a shape of an equivalent liquid crystal prism formed by the application of the voltages to electrodes 608, 610, and 612. However, line 614 does not necessarily represent a visible feature in the electro-optic element.

When a ray of light enters the electro-optic element from first direction 620, due to the alignment of the liquid crystals, the direction of light changes to second direction 622 that is distinct from first direction 620 (e.g., when the ray of light enters the electro-optic element perpendicularly to substrate 604, the ray of light exits from the electro-optic element at a slanted angle toward left).

FIG. 6B illustrates that the first voltage (e.g., 5V) is applied to electrodes 612, and a ground voltage (e.g., 0V) is applied to electrodes 610 and 608, which causes liquid crystals to realign based on the changed distribution of the electrical potential generated by the voltages applied to electrodes 608, 610, and 612.

Line 616 represents a shape of an equivalent liquid crystal prism formed by the application of the changed voltages to electrodes 608, 610, and 612. The orientation of the equivalent liquid crystal prism shown in FIG. 6B is opposite to the orientation of the equivalent liquid crystal prism shown in FIG. 6A. Thus, in FIG. 6B, when a ray of light enters the electro-optic element from first direction 620, due to the changed alignment of the liquid crystals, the direction of light changes to third direction 624 that is distinct from first direction 620 and second direction 622 (e.g., when the ray of light enters the electro-optic element perpendicularly to substrate 604, the ray of light exits from the electro-optic element at a slanted angle toward right).

Thus, by changing the voltages applied to electrodes 608, 610, and 612, the direction of light exiting from the electro-optic element can be adjusted (e.g., toward left or right). When no voltages are applied to electrodes 608, 610, and 612, light exits from the electro-optic element without changing its direction.

In addition, by changing the amplitude of the voltages applied to electrodes 608, 610, and 612, the extent of changes to the direction of light can be selected. For example, when a third voltage (e.g., 2.5V) that is lower than the first voltage (e.g., 5V) is applied to electrodes 610, and a ground voltage (e.g., 0V) is applied to electrodes 612 and 608, light exits from the electro-optic element at an angle (from a surface normal of substrate 602) that is smaller than the angle of light (from the surface normal of substrate 602) exiting from the electro-optic element when the first voltage (e.g., 5V) is applied to electrodes 610 and a ground voltage (e.g., 0V) is applied to electrodes 612 and 608.

Although FIGS. 6A-6B illustrate steering a beam (or a ray) of light on a same plane (e.g., from left to right), in some embodiments, the electro-optic element is configured to steer the beam (or the ray) of light in two dimensions (e.g., left, right, up, down, or a diagonal direction).

Figure 6C:
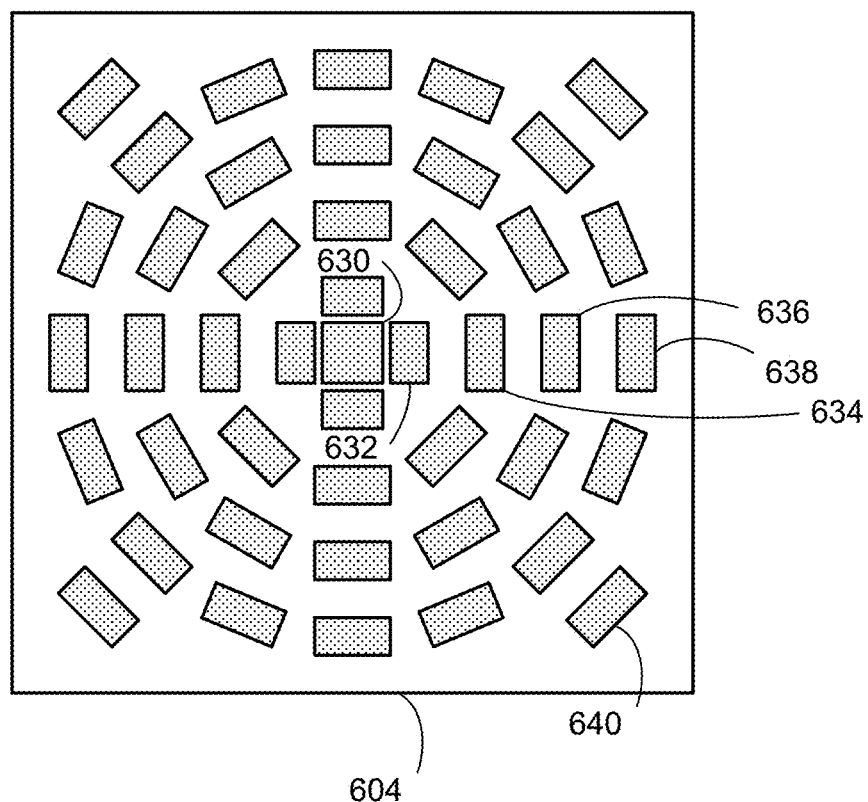
FIGS. 6C and 6D are plan views of an electro-optic element in accordance with some embodiments.

FIG. 6C is a plan view of an electro-optic element in accordance with some embodiments.

In FIG. 6C, the electro-optic element includes a plurality of electrodes 630 that are axisymmetrically arranged. For example, electrode 630 is located in a center of the electro-optic element, surrounded by a first group of electrodes 632, which are, in turn, surrounded by a second group of electrodes 634, a third group of electrodes 636, a fourth group of electrodes 638, and a fifth group of electrodes 640. By applying different voltages to different groups of electrodes, the liquid crystals are arranged in such a way that the liquid crystals collectively operate as a lens. By changing the amplitude of voltages applied to different groups of electrodes, the liquid crystals operate as a lens of a different power (e.g., a focal length of an equivalent lens changes based on the amplitude of voltages applied to different groups of electrodes).

Figure 6D:
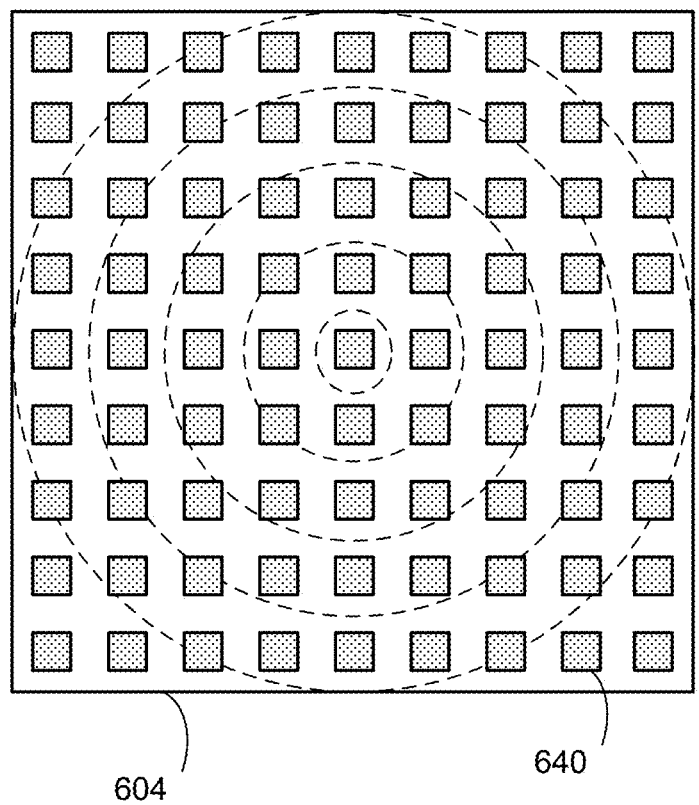

FIG. 6D is a plan view of an electro-optic element in accordance with some embodiments.

In FIG. 6D, the electro-optic lens includes a rectangular array of electrodes 640. By selectively applying various voltages to respective electrodes 640, the liquid crystals can be arranged in such a way that the liquid crystals collectively operate as a lens.

Figure 6E:
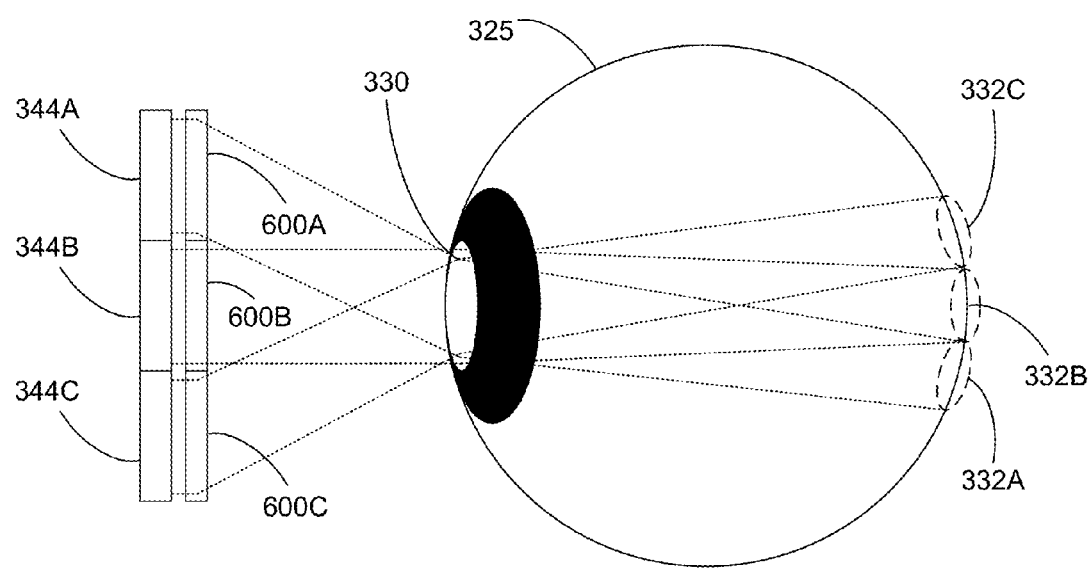
FIG. 6E is a schematic diagram illustrating an exemplary operation of tiles in accordance with some embodiments.

FIG. 6E is a schematic diagram illustrating an exemplary operation of tiles in accordance with some embodiments. FIG. 6E is similar to FIG. 3E except that electro-optic elements 600A, 600B, and 600C are used in place of lenses 342A, 342B, and 342C shown in FIG. 3E.

As shown above, the electro-optic element can be used for directing (or steering) light as well as focusing (or defocusing) the light. The electro-optic element is used in place of a lens (e.g., lens 342 in FIG. 3C) or a lens assembly (e.g., lens assembly 604 in FIG. 6A) in a tile. Alternatively, the electro-optic element is used in conjunction with the lens or the lens assembly in a tile.

In some embodiments, the display device includes one or more prisms (e.g., a prism made of a cycloidal diffractive waveplate, a polarization grating, or a liquid crystal prism). In some embodiments, the one or more prisms are electro-optic elements, which allow electrically-controlled beam steering (e.g., discrete or continuous beam steering), beam shaping, and polarization conversion. When light is directed through the prism, the light is dispersed. In some embodiments, to correct for the dispersion, color separated images are projected by the display device so that corresponding pixels in the color separated images overlap when forming an image on the retina of the eye of the user. Thus, projecting the color separated images compensates for, or reduces the effect of, the dispersion by the prism. Accordingly, the user will see an overlap of the color separated images as a unified image.

Figure 6F:
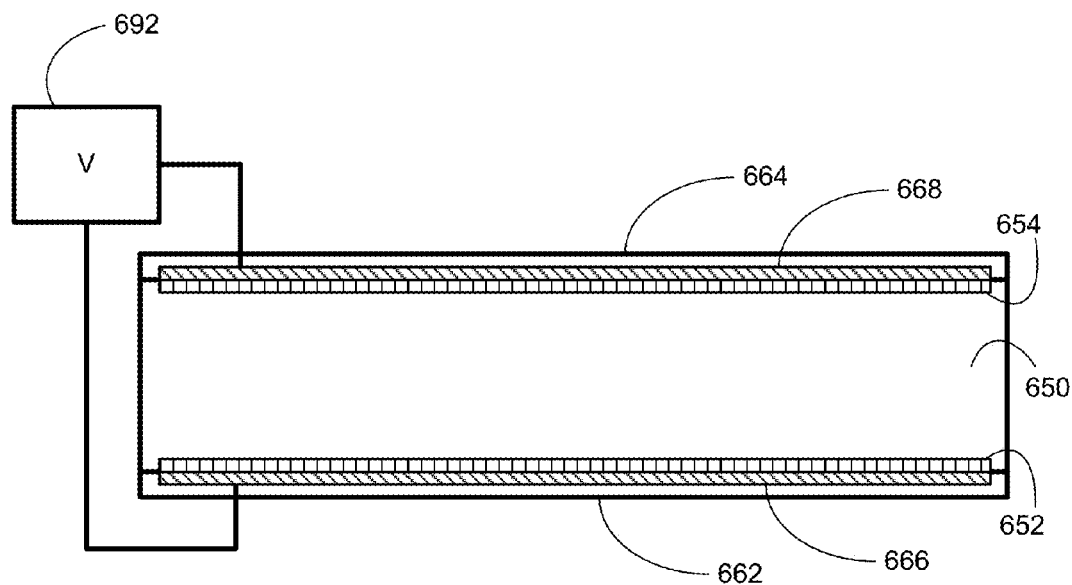
FIG. 6F is a schematic diagram illustrating a structure of a liquid crystal grating in accordance with some embodiments.

FIG. 6F is a schematic diagram illustrating a structure of a liquid crystal grating (e.g., a liquid crystal polarization grating) in accordance with some embodiments. The schematic diagram shown in FIG. 6F corresponds to a cross-sectional view of the liquid crystal grating.

In FIG. 6F, liquid 650 containing liquid crystals (e.g., twisted nematic liquid crystals) is located between first substrate 642 and second substrate 644. In some embodiments, first substrate 642 is parallel to second substrate 644. First substrate 642 includes one or more electrodes 646, and second substrate 644 includes one or more electrodes 648. First substrate 642 also includes alignment layer 652, and second substrate 644 includes alignment layer 654. First substrate 642 and second substrate 644 are made of optically transparent material (e.g., glass, fused silica, sapphire, etc.). One or more electrodes 646 and/or one or more electrodes 648 are made with optically transparent material (e.g., indium tin oxide). Alignment layer 652 and alignment layer 654 are made with optically transparent material. In some embodiments, first substrate 642 and second substrate 644 are separated by 5 µm, 10 µm, 15 µm, 20 µm, 25 µm, 30 µm, 35 µm, 40 µm, 45 µm, 50 µm, 60 µm, 70 µm, 80 µm, 90 µm, or 100 µm. In some embodiments, first substrate 642 and second substrate 644 are separated by a different distance.

In some embodiments, alignment layers 652 and 654 are formed by mechanical methods (e.g., rubbing, friction transfer, stretching, etc.). In some embodiments, alignment layers 652 and 654 are formed by patterning (e.g., imprinting, ink-jet printing, exposure to an ion beam, plasma beam, or electron beam, etc.). In some embodiments, alignment layers 652 and 654 are self-assembled monolayers. In some embodiments, alignment layers 652 and 654 are photo-alignment layers. In some embodiments, the photo-alignment layers include linear photo-polymerizable polymers (e.g., polyester or polyimide, etc.). When the photo-alignment layers include linear photo-polymerizable polymers, the photo-alignment layers are exposed to two orthogonal circularly polarized beams that are not parallel to each other, which create a spatially separated rotating linear polarization field. In some embodiments, the linear photo-polymerizable polymers are aligned with the spatially separated rotating linear polarization field. In some embodiments, the two orthogonal circularly polarized beams cure the linear photo-polymerizable polymers (e.g., the beams include ultraviolet light, which cures the polymers).

Figure 6G:
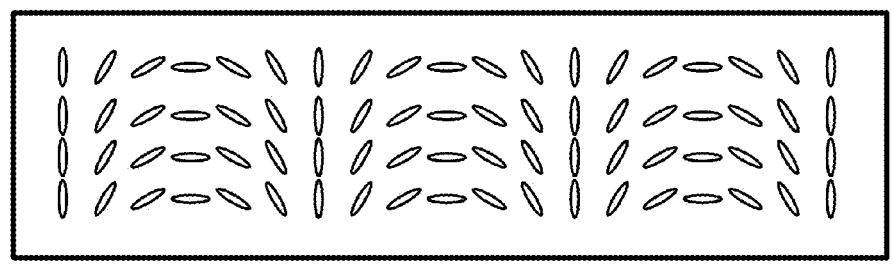
FIGS. 6G-6I are schematic diagrams illustrating orientations of nematic liquid crystals in accordance with some embodiments.

When liquid crystals are provided between two photo-alignment layers 646 and 648, liquid crystals align with the spatially separated rotating linear polarization pattern as shown in FIG. 6G, which is a schematic diagram illustrating the orientations of liquid crystals viewed from the top of the liquid crystal grating in accordance with some embodiments.

Figure 6H:
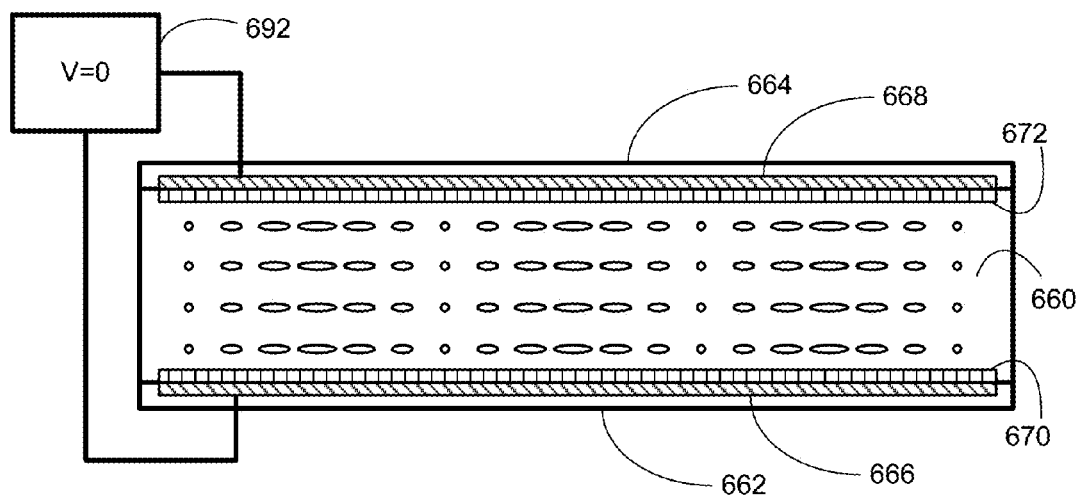

FIG. 6H illustrates the orientations of liquid crystals viewed from the side of the liquid crystal grating when no voltage is applied between one or more electrodes 646 on first substrate 642 and one or more electrodes 648 on second substrate 644 (e.g., a voltage differential applied by voltage source 692 is zero).

Figure 6I:
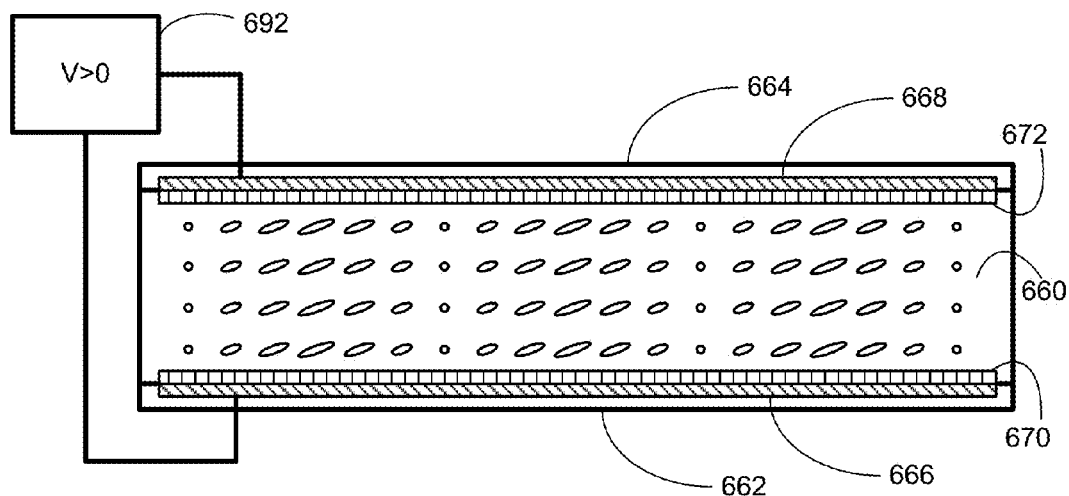

FIG. 6I illustrates the orientations of liquid crystals viewed from the side of the liquid crystal grating when a voltage differential is applied between one or more electrodes 646 on first substrate 642 and one or more electrodes 648 on second substrate 644, which create a pattern of an electric field on liquid 650 (e.g., using voltage source 692).

As shown in FIGS. 6H and 6I, liquid crystals in liquid 650 are aligned in accordance with the electric field. For example, when no electric field is applied (e.g., FIG. 6H), liquid crystals are aligned in first orientations (e.g., parallel to substrates 642 and 644). When an electric field is applied with a voltage differential, at least some of liquid crystals are aligned in different orientations.

When circularly polarized light (e.g., with right-handed polarization) impinges on the liquid crystal polarization grating (when no voltage differential is applied between one or more electrodes 646 on first substrate 642 and one or more electrodes 648 on second substrate 644), the transmitted light is deflected to a particular direction (e.g., a direction of a first order diffraction). When orthogonal circularly polarized light (e.g., with left-handed polarization) impinges on the liquid crystal polarization grating (when no voltage differential is applied between one or more electrodes 646 on first substrate 642 and one or more electrodes 648 on second substrate 644), the transmitted light is deflected to an opposite direction (e.g., a direction of a first order diffraction in an opposite direction). When a voltage differential above a threshold voltage differential is applied, circularly polarized light (e.g., with either right-handed polarization or left-handed polarization) is transmitted through the liquid crystal polarization grating without deflection. Thus, the liquid crystal polarization grating functions as a beam steering device. The direction of deflection is determined by a period of the electrodes (e.g., 5 µm, 5.5 µm, 6 µm, 6.5 µm, 7 µm, 7.5 µm, 8 µm, 9 µm, 10 µm, 15 µm, 20 µm, etc.).

Although most (e.g., 99% or more) of the light impinging on the liquid crystal polarization grating is deflected into a direction of first order diffraction, a portion (e.g., 1% of less) of the light impinging on the liquid crystal polarization grating is deflected into different directions. For example, a portion of the light impinging on the liquid crystal polarization grating is deflected into a direction of zeroth order diffraction, which contributes optical artifacts. In some cases, the zeroth order diffraction from the last optical element in a beam steering device contributes the most to the optical artifacts. Thus, there is a need for a method of separating the zeroth order diffraction from the first order diffraction in a beam steering device. These challenges are reduced or eliminated by beam steering devices shown in FIGS. 6J-6O.

Figure 6J:
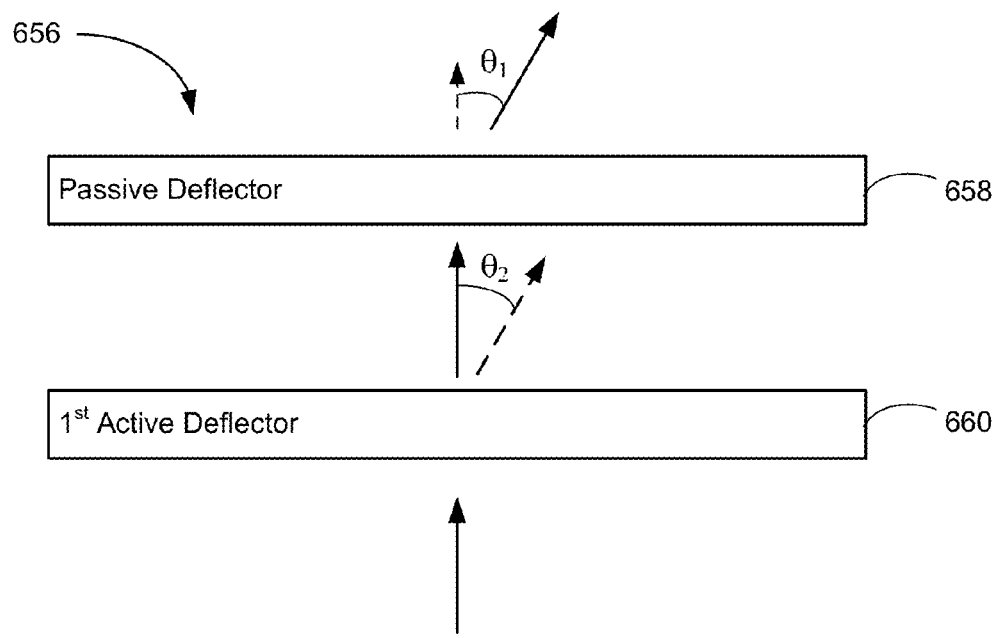
FIGS. 6J-6O are schematic diagrams illustrating side views of beam steering devices in accordance with some embodiments.

FIG. 6J is a schematic diagram illustrating a side view of beam steering device 656 in accordance with some embodiments. Beam steering device 656 includes first active deflector 660 and passive deflector 658. First active deflector 660 includes a first substrate with one or more electrodes, a second substrate with one or more electrodes, and liquid crystals located between the first substrate and the second substrate (e.g., the liquid crystal polarization grating shown in FIG. 6F). When a voltage differential (e.g., above a threshold voltage) is applied on first active deflector 660, first active deflector 660 transmits light without deflection. When no voltage differential is applied on first active deflector 660, first active deflector 660 deflects incoming light with circular polarization (e.g., at an angle $\theta_2$, such as 8°). Thus, first active deflector 660 can be used to steer incoming light.

In some embodiments, passive deflector 658 includes two substrates and liquid crystals located between the two substrates (e.g., two parallel substrates). In some embodiments, passive deflector 658 has the same structure as the liquid crystal polarization grating shown in FIG. 6F. In some embodiments, passive deflector 658 does not include electrodes.

Passive deflector 658 deflects light from first active deflector 660 at an angle $\theta_1$. For example, when light from first active deflector 660 impinges on passive deflector 658 at a normal angle, a large portion (e.g., 99% or more) of the light from first active deflector 660 is deflected to an angle $\theta_1$ (e.g., 8°). In some cases, a small portion (e.g., 1% or less) of the light from first active deflector 660 is transmitted without deflection (e.g., zeroth order leakage). However, the zeroth order diffraction and the first order diffraction in passive deflector 658 are separated by the deflection angle of passive deflector 658 (e.g., 8°). When passive deflector 658 is configured to deflect light at a large angle $\theta_1$, the zeroth order diffraction can be easily separated from the first order diffraction. For example, in some embodiments, the zeroth order diffraction is vignetted during propagation through an optical system. In some embodiments, the deflection angle $\theta_1$ of passive deflector 658 is not smaller than the deflection angle $\theta_2$ of first active deflector 660 (e.g., the deflection angle $\theta_1$ is equal to, or greater than, the deflection angle $\theta_2$).

Figure 6K:
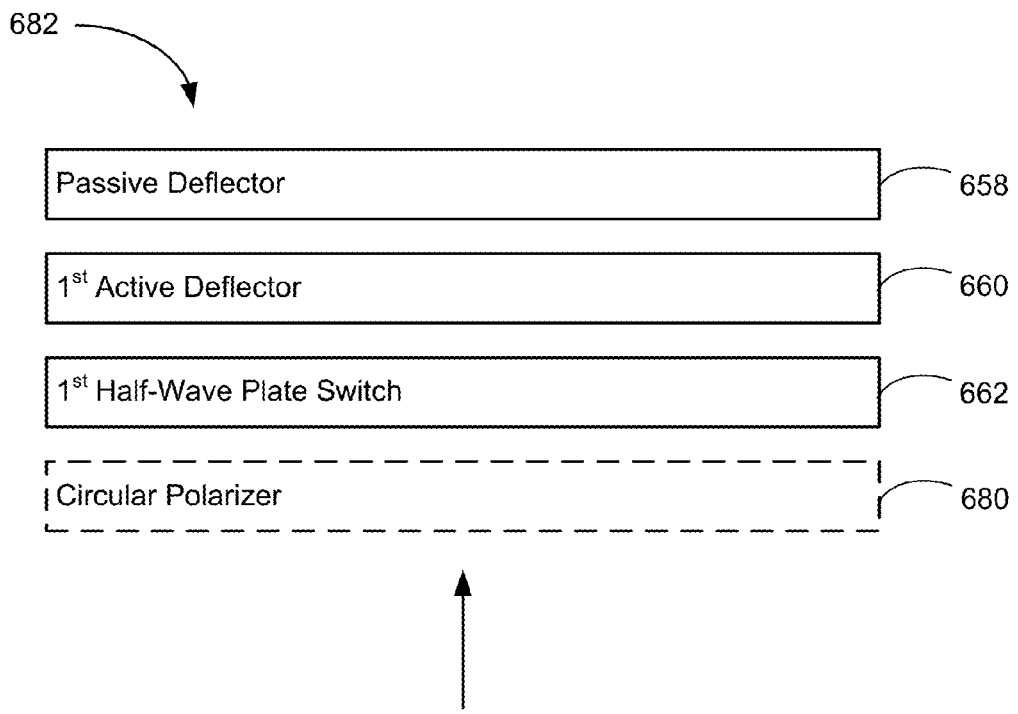

FIG. 6K is a schematic diagram illustrating a side view of beam steering device 682 in accordance with some embodiments. Beam steering device 682 is similar to beam steering device 656 illustrated in FIG. 6J, except that beam steering device 682 also includes first half-wave plate switch 662. In some embodiments, first half-wave plate switch 662 is a twisted nematic liquid crystal cell. When no voltage differential is applied on first half-wave plate switch 662, first half-wave plate switch 662 changes polarization of incoming light (e.g., right-handed circularly polarized light is changed into left-handed circularly polarized light). When a voltage differential (e.g., above a voltage threshold) is applied on first half-wave plate switch 662, first half-wave plate switch 662 does not rotate the polarization of incoming light (e.g., the polarization of light remains the same before and after passing through first half-wave plate switch 662). Thus, first half-wave plate switch 662 is used to control direction of deflection. For example, when light impinging on first active deflector 660 has right-handed circular polarization, first active deflector 660, in an off state, deflects the light in one direction (e.g., toward right) by angle $\theta_2$, and when light impinging on first active deflector 660 has left-handed circular polarization (e.g., due to the polarization change by first half-wave plate switch 662), first active deflector 660, in an off state, deflects the light in another direction (e.g., toward left) by angle $\theta_2$. When first active deflector 660 is in an on state (e.g., when a voltage differential is applied), the light impinging on first active deflector 660 is transmitted without deflection.

In some embodiments, beam steering device 682 also includes circular polarizer 680 as shown in FIG. 6K. Circular polarizer 680 converts linearly polarized light to circularly polarized light, thereby facilitating deflection of the circularly polarized light by first active deflector 660 and/or passive deflector 658. In some embodiments, circular polarizer 680 is an achromatic circular polarizer or a broadband circular polarizer. In some embodiments, beam steering device 682 does not include circular polarizer 680.

Figure 6L:
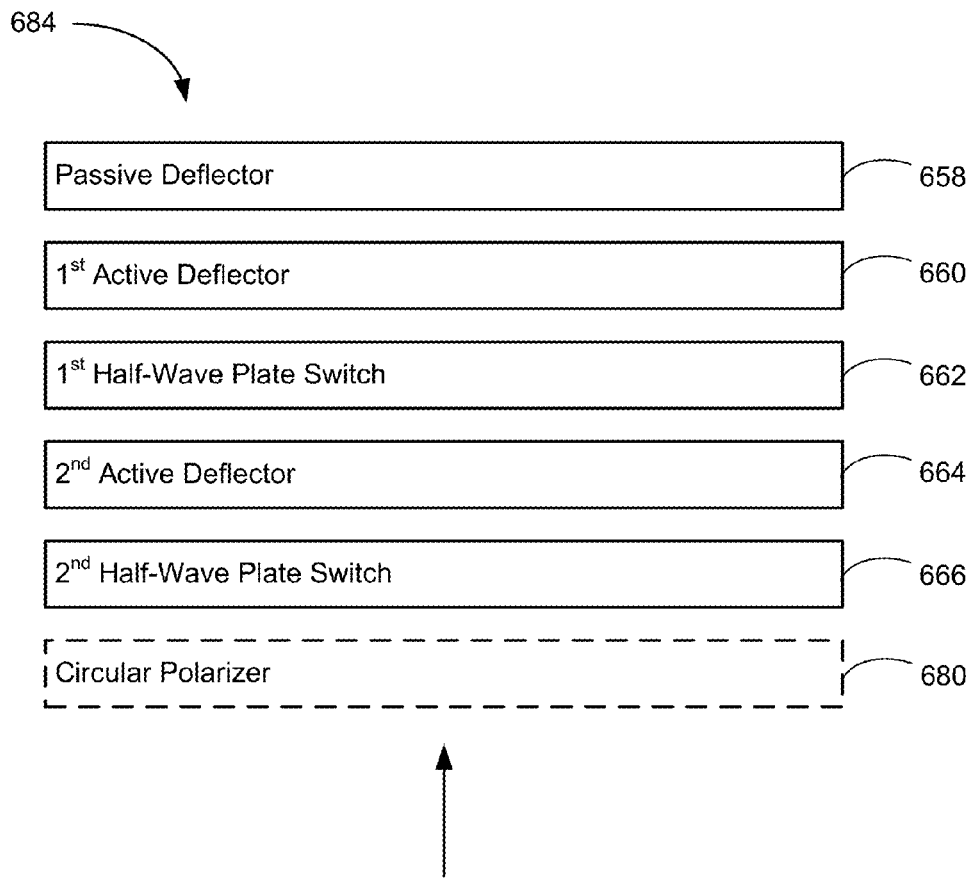

FIG. 6L is a schematic diagram illustrating a side view of beam steering device 684 in accordance with some embodiments. Beam steering device 684 is similar to beam steering device 682 illustrated in FIG. 6K, except that beam steering device 684 also includes second half-wave plate switch 666 and second active deflector 664.

In some embodiments, second active deflector 664 includes a first substrate with one or more electrodes, a second substrate with one or more electrodes, and liquid crystals located between the first substrate and the second substrate (e.g., the liquid crystal polarization grating shown in FIG. 6F). When a voltage differential is applied on second active deflector 664, second active deflector 664 transmits light without deflection. When no voltage differential is applied on second active deflector 664, second active deflector 664 deflects incoming light with circular polarization (e.g., at an angle $\theta_3$, such as 4°).

In some embodiments, second half-wave plate switch 666 is a twisted nematic liquid crystal cell. In some embodiments, second half-wave plate switch 666 is used to control direction of deflection by changing the polarizing of impinging light, as described above with respect to first half-wave plate switch 662.

Figure 6M:
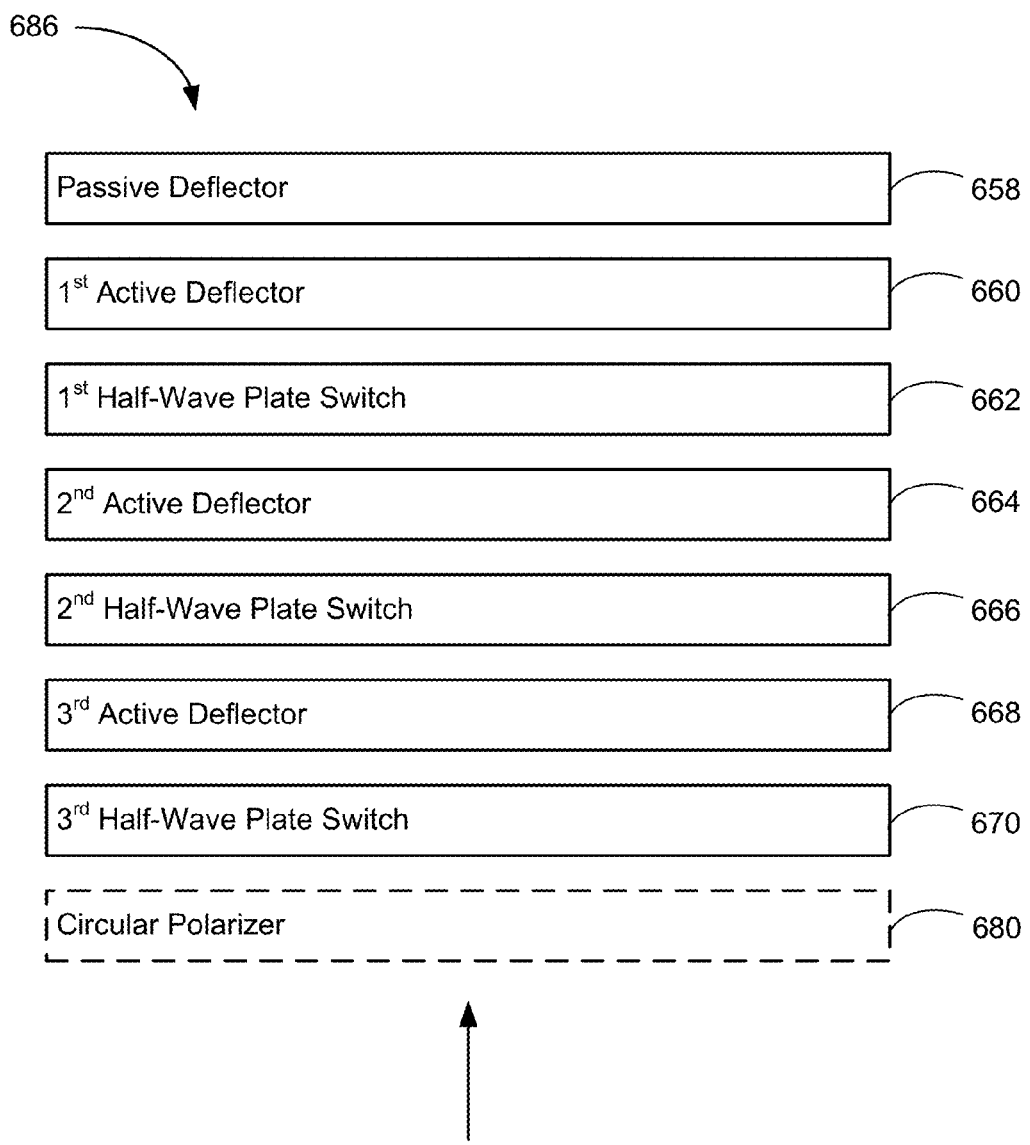

FIG. 6M is a schematic diagram illustrating a side view of beam steering device 686 in accordance with some embodiments. Beam steering device 686 is similar to beam steering device 684 illustrated in FIG. 6L, except that beam steering device 686 also includes third half-wave plate switch 670 and third active deflector 668.

In some embodiments, third active deflector 668 includes a first substrate with one or more electrodes, a second substrate with one or more electrodes, and liquid crystals located between the first substrate and the second substrate (e.g., the liquid crystal polarization grating shown in FIG. 6F). When a voltage differential is applied on third active deflector 668, third active deflector 668 transmits light without deflection. When no voltage differential is applied on third active deflector 668, third active deflector 668 deflects incoming light with circular polarization (e.g., at an angle $\theta_4$, such as 2°).

In some embodiments, third half-wave plate switch 670 is a twisted nematic liquid crystal cell. In some embodiments, third half-wave plate switch 670 is used to control direction of deflection by changing the polarizing of impinging light, as described above with respect to first half-wave plate switch 662.

Figure 6N:
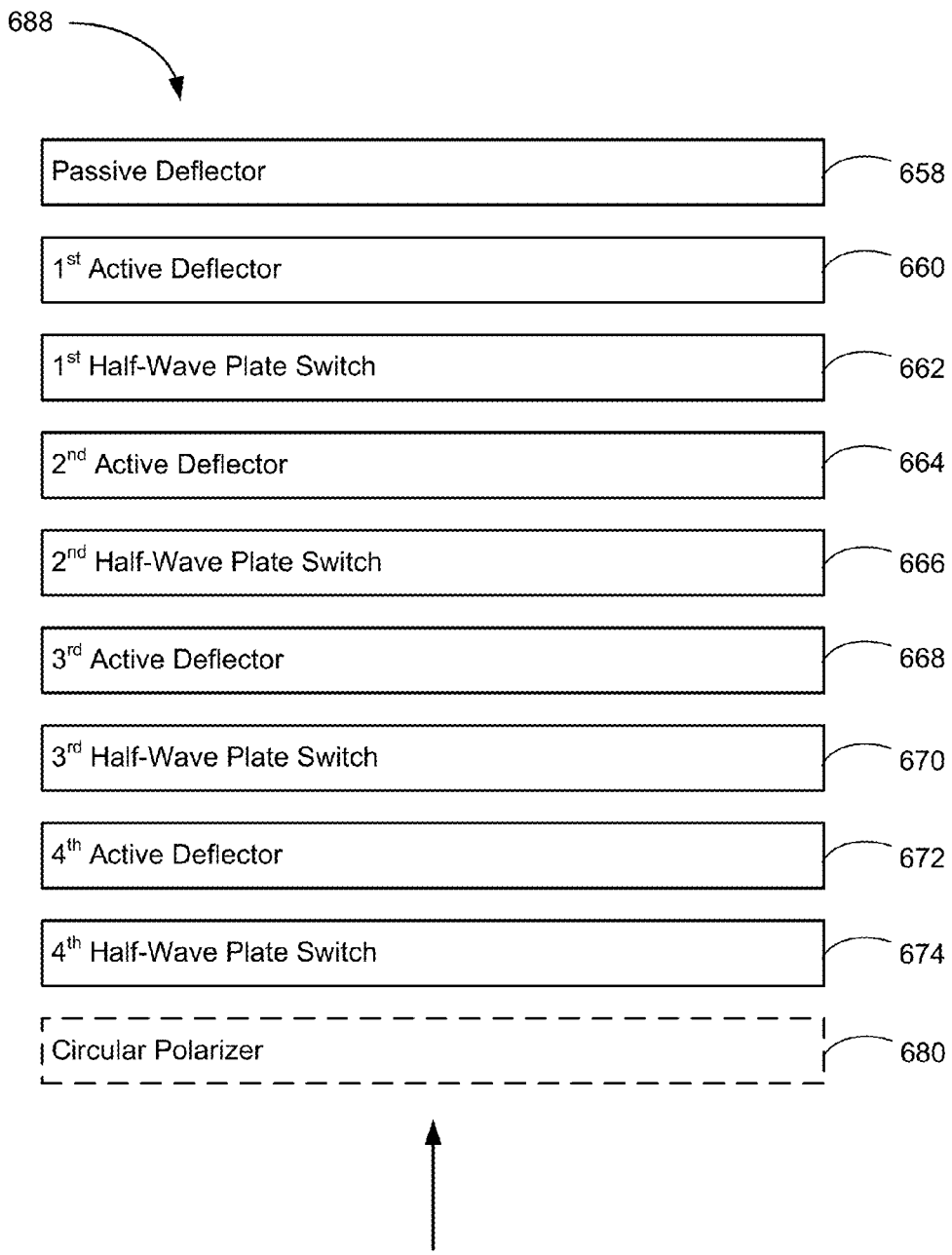

FIG. 6N is a schematic diagram illustrating a side view of beam steering device 688 in accordance with some embodiments. Beam steering device 688 is similar to beam steering device 686 illustrated in FIG. 6M, except that beam steering device 688 also includes fourth half-wave plate switch 674 and fourth active deflector 672.

In some embodiments, fourth active deflector 672 includes a first substrate with one or more electrodes, a second substrate with one or more electrodes, and liquid crystals located between the first substrate and the second substrate (e.g., the liquid crystal polarization grating shown in FIG. 6F). When a voltage differential is applied on fourth active deflector 672, fourth active deflector 672 transmits light without deflection. When no voltage differential is applied on fourth active deflector 672, fourth active deflector 672 deflects incoming light with circular polarization (e.g., at an angle $\theta_5$, such as 1°).

In some embodiments, fourth half-wave plate switch 674 is a twisted nematic liquid crystal cell. In some embodiments, fourth half-wave plate switch 674 is used to control direction of deflection by changing the polarizing of impinging light, as described above with respect to first half-wave plate switch 662.

Figure 6O:
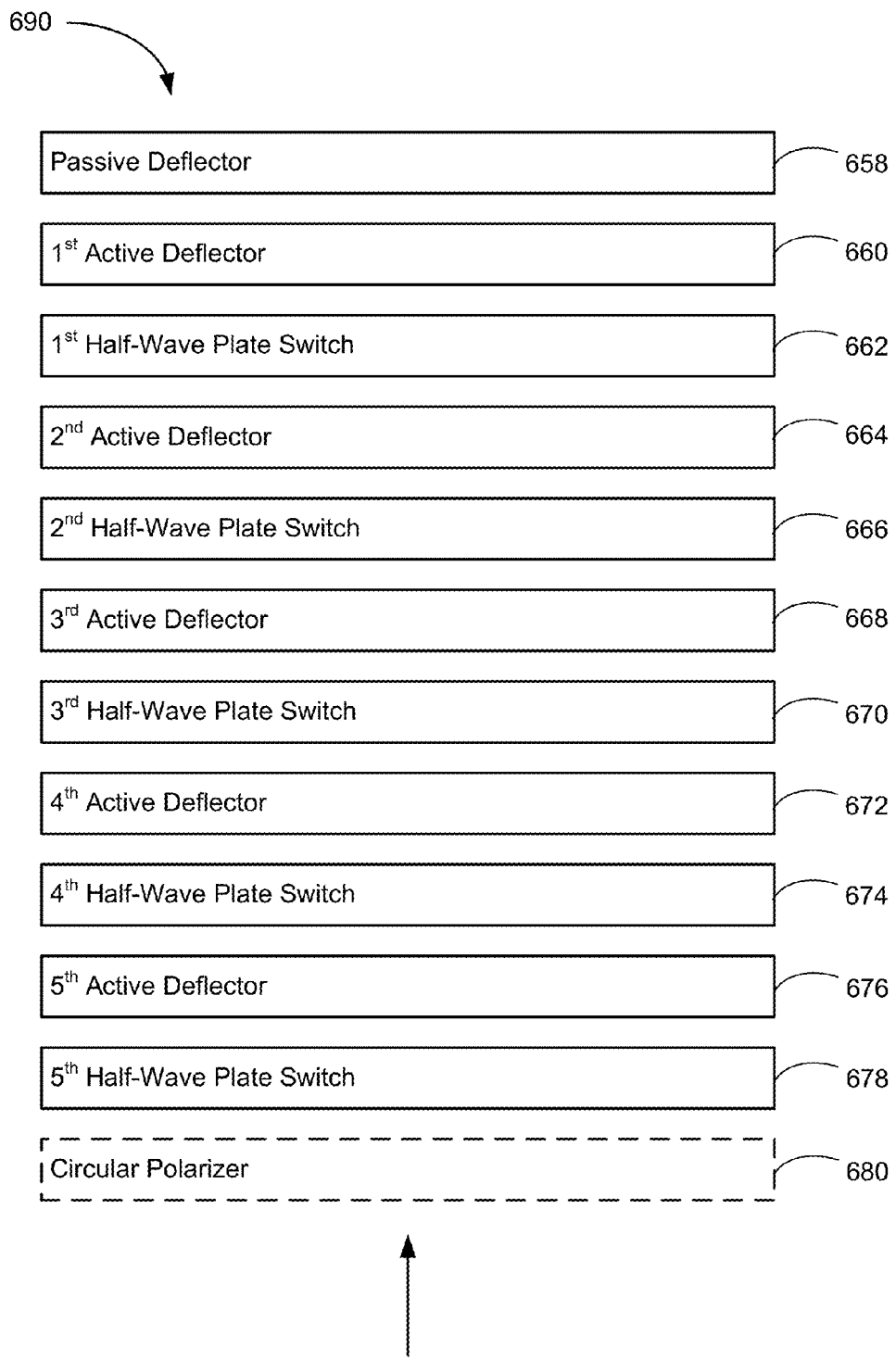

FIG. 6O is a schematic diagram illustrating a side view of beam steering device 690 in accordance with some embodiments. Beam steering device 690 is similar to beam steering device 688 illustrated in FIG. 6N, except that beam steering device 690 also includes fifth half-wave plate switch 678 and fifth active deflector 676.

In some embodiments, fifth active deflector 676 includes a first substrate with one or more electrodes, a second substrate with one or more electrodes, and liquid crystals located between the first substrate and the second substrate (e.g., the liquid crystal polarization grating shown in FIG. 6F). When a voltage differential is applied on fifth active deflector 676, fifth active deflector 676 transmits light without deflection. When no voltage differential is applied on fifth active deflector 676, fifth active deflector 676 deflects incoming light with circular polarization (e.g., at an angle $\theta_6$, such as 0.5°).

In some embodiments, fifth half-wave plate switch 678 is a twisted nematic liquid crystal cell. In some embodiments, fifth half-wave plate switch 678 is used to control direction of deflection by changing the polarizing of impinging light, as described above with respect to first half-wave plate switch 662.

In light of these principles, we now turn to certain embodiments.

In accordance with some embodiments, a beam steering device includes a first active deflector (e.g., first active deflector 660 in FIG. 6J). The first active deflector includes a first substrate with one or more electrodes, and a second substrate with one or more electrodes (e.g., substrate 646 and substrate 648 in FIG. 6F). The second substrate is distinct from the first substrate. The first active deflector also includes liquid crystals located between the first substrate and the second substrate (e.g., liquid 650 containing liquid crystals shown in FIG. 6F). The beam steering device also includes a passive deflector positioned parallel to the first active deflector (e.g., passive deflector 658 in FIG. 6J). The passive deflector includes a third substrate, a fourth substrate that is distinct from the third substrate, and liquid crystals located between the third substrate and the fourth substrate (e.g., passive deflector 658 has a structure similar to the liquid crystal polarization grating shown in FIG. 6F, except that passive deflector 658 may not include electrodes).

In some embodiments, the liquid crystals in the passive deflector are oriented in a first rotational orientation, and the liquid crystals in the first active deflector are oriented in the first rotational orientation (e.g., the liquid crystals in the passive deflector and the liquid crystals in the first active deflector are oriented in a same orientation, such as having either a clockwise turn or a counterclockwise turn).

In some embodiments, the passive deflector is configured to deflect light by more than 5°. In some embodiments, the passive deflector is configured to deflect light by more than 6°. In some embodiments, the passive deflector is configured to deflect light by more than 7°. In some embodiments, the passive deflector is configured to deflect light by more than 8°. In some embodiments, the passive deflector is configured to deflect light by more than 9°. In some embodiments, the passive deflector is configured to deflect light by more than 10°.

In some embodiments, the liquid crystals in the passive deflector are immobilized. In some embodiments, the liquid crystals in the passive deflector are polymerized. In some embodiments, liquid containing the liquid crystals includes polymers that are distinct from the liquid crystals.

In some embodiments, the first substrate, the second substrate, the third substrate, and the fourth substrate are optically transparent. The one or more electrodes for the first substrate and the one or more electrodes for the second substrate are optically transparent. For example, the passive deflector and the first active deflector are optically transparent (for transmission and deflection of light). In some embodiments, the passive deflector and the first active deflector are optically transparent to visible light. In some embodiments, the passive deflector and the first active deflector are optically transparent to infrared light.

In some embodiments, the passive deflector is configured to steer incoming light by a first angle (e.g., $\theta_1$, such as 8°); and the first active deflector is configured to steer incoming light by a second angle (e.g., $\theta_2$, such as 8°).

In some embodiments, the first angle is not smaller than the second angle. This facilitates that the zeroth order leakage from the passive deflector, which is the last optical element in the beam steering device, is separated from the first order diffraction by the passive deflector, thereby facilitating removal of the zeroth order leakage (e.g., by vignetting in an optical system). In some embodiments, the first angle is greater than the second angle.

In some embodiments, the first angle is the same as the second angle (e.g., both the first angle and the second angle are 8°).

In some embodiments, the beam steering device includes a first switchable half-wave plate (e.g., first half-wave plate 662 in FIG. 6K). The first active deflector is located between the passive deflector and the first switchable half-wave plate.

In some embodiments, the beam steering device includes a second active deflector that is configured to steer incoming light by a third angle that is less than the second angle (e.g., second active deflector 664 in FIG. 6L). For example, the second active deflector is configured to steer incoming light by 4°. The first switchable half-wave plate is located between the first active deflector and the second active deflector.

In some embodiments, the liquid crystals in the first active deflector are oriented in a first rotational orientation, and the liquid crystals in the second active deflector are oriented in the first rotational orientation (e.g., the liquid crystals in the first active deflector and the liquid crystals in the second active deflector are oriented in a same orientation, such as having either a clockwise turn or a counterclockwise turn).

In some embodiments, the beam steering device includes a second switchable half-wave plate (e.g., second half-wave plate switch 666 in FIG. 6L). The second active deflector is located between the first switchable half-wave plate and the second switchable half-wave plate.

In some embodiments, the beam steering device includes a third active deflector that is configured to steer incoming light by a fourth angle that is less than the third angle (e.g., third active deflector 668 in FIG. 6M). For example, the third active deflector is configured to steer incoming light by 2°. The second switchable half-wave plate is located between the second active deflector and the third active deflector. The beam steering device also includes a third switchable half-wave plate (e.g., third half-wave plate switch 670 in FIG. 6M). The third active deflector is located between the second switchable half-wave plate and the third switchable half-wave plate.

In some embodiments, the beam steering device includes a fourth active deflector that is configured to steer incoming light by a fifth angle that is less than the fourth angle (e.g., fourth active deflector 672 in FIG. 6N). For example, the fourth active deflector is configured to steer incoming light by 1°. The third switchable half-wave plate is located between the third active deflector and the fourth active deflector. The beam steering device also includes a fourth switchable half-wave plate (e.g., fourth half-wave plate switch 674 in FIG. 6N). The fourth active deflector is located between the third switchable half-wave plate and the fourth switchable half-wave plate.

In some embodiments, the beam steering device includes a fifth active deflector that is configured to steer incoming light by a sixth angle that is less than the fifth angle (e.g., fifth active deflector 676 in FIG. 6O). For example, the fifth active deflector is configured to steer incoming light by 0.5°. The fourth switchable half-wave plate is located between the fourth active deflector and the fifth active deflector. The beam steering device also includes a fifth switchable half-wave plate (e.g., fifth half-wave plate switch 678 in FIG. 6O). The fifth active deflector is located between the fourth switchable half-wave plate and the fifth switchable half-wave plate.

In some embodiments, the first angle corresponds to a direction of first order diffraction for the first active deflector; and the passive deflector is configured to transmit a portion of incident light to a direction of zeroth order diffraction.

In some embodiments, the passive deflector is positioned to receive light from the first active deflector (e.g., in FIG. 6J, passive deflector 658 is positioned to receive light from first active deflector 660).

In some embodiments, the beam steering device includes a quarter-wave plate (e.g., the beam steering device includes a quarter-wave plate as a circular polarizer that convert linearly polarized light to circularly polarized light).

In accordance with some embodiments, a display device includes one or more light sources; and a beam steering device configured to steer light from the one or more light sources (e.g., FIG. 6E).

In accordance with some embodiments, a method includes transmitting incoming light through a first active deflector (e.g., transmitting light through first active deflector 660 in FIG. 6J). The first active deflector includes: a first substrate with one or more electrodes; a second substrate with one or more electrodes; and liquid crystals located between the first substrate and the second substrate. The second substrate is distinct from the first substrate. The method also includes transmitting the light from the active deflector through a passive deflector (e.g., transmitting light through passive deflector 658 in FIG. 6J). The passive deflector includes a third substrate, a fourth substrate that is distinct from the third substrate, and liquid crystals located between the third substrate and the fourth substrate.

In some embodiments, the passive deflector deflects the light from the first active deflector by a first angle; and the first active deflector deflects the incoming light by a second angle.

Figure 7:
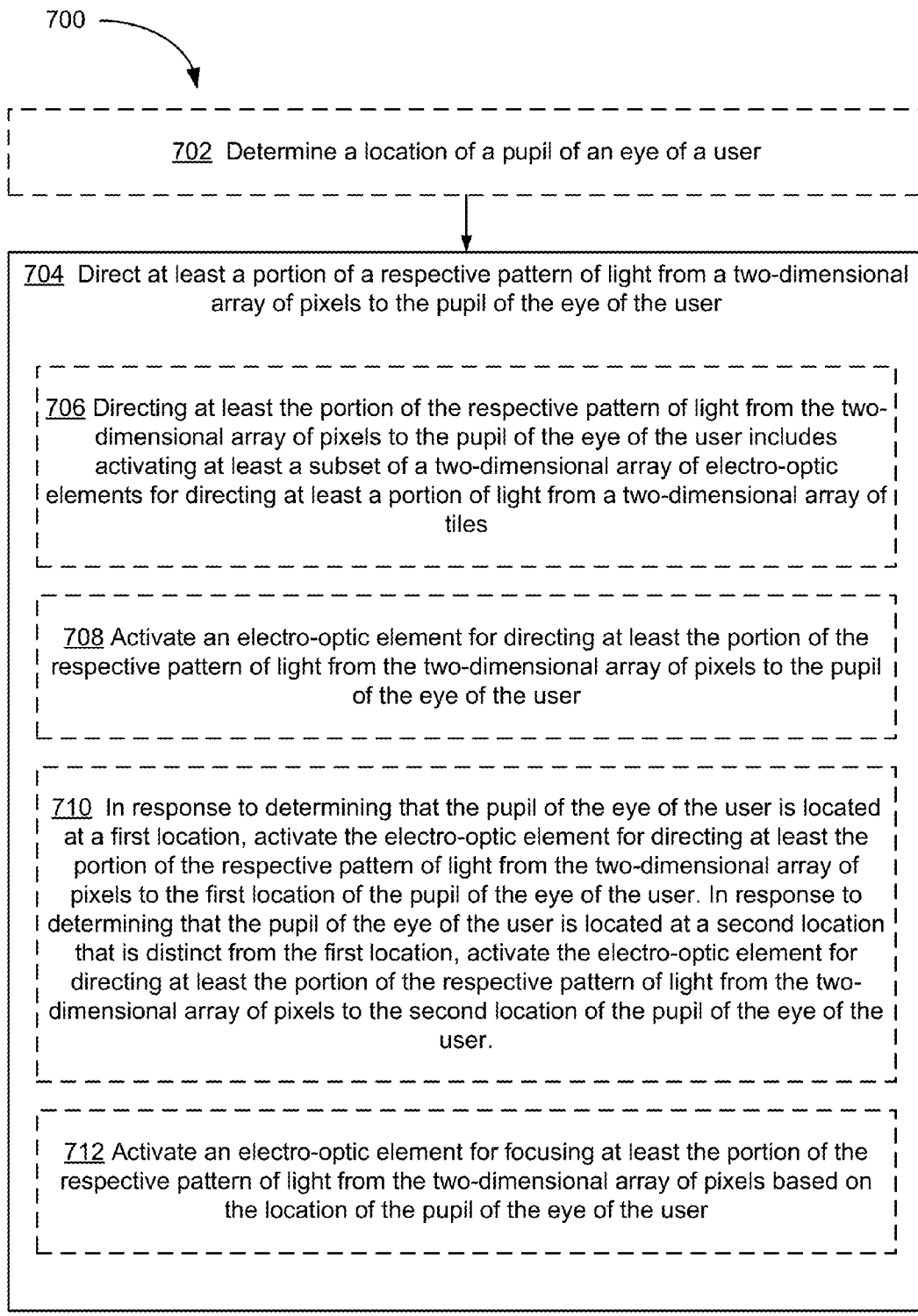
FIG. 7 is a flow diagram illustrating a method of directing light from a two-dimensional array of pixels with an electro-optic element in accordance with some embodiments.

FIG. 7 is a flow diagram illustrating method 700 of activating a two-dimensional array of tiles based on a location of a pupil of an eye in accordance with some embodiments. Method 700 is performed at a display device (e.g., display device 100 in FIG. 1) comprising a two-dimensional array of tiles (e.g., FIG. 3B). Each tile includes (e.g., FIG. 3C) a two-dimensional array of pixels (e.g., 344). Each pixel is configured to output light so that the two-dimensional array of pixels outputs a respective pattern of light (e.g., FIG. 3G). Each tile also includes an electro-optic element (e.g., electro-optic element 600 in FIG. 6E), of a two-dimensional array of electro-optic elements, configured to direct at least a portion of the respective pattern of light from the two-dimensional array of pixels to a pupil of an eye of a user (e.g., FIG. 6E).

In some embodiments, the display device determines (702) a location of a pupil of an eye of the user. For example, the display device sends non-visible light (e.g., infrared light) toward the eye of the user, and collects non-visible light that is reflected by the eye of the user. Based on an intensity profile of the light reflected by the eye of the user, the display device determines the location of the pupil of the eye of the user (e.g., a location with the highest intensity of the reflected light corresponds to the location of the pupil of the eye of the user).

The display device directs (704) at least the portion of the respective pattern of light from the two-dimensional array of pixels to the pupil of the eye of the user (e.g., FIG. 6E).

In some embodiments, directing at least the portion of the respective pattern of light from the two-dimensional array of pixels to the pupil of the eye of the user includes (706) activating at least a subset of the two-dimensional array of electro-optic elements for directing at least a portion of light from the two-dimensional array of tiles (e.g., in FIG. 6E, electro-optic elements 600A and 600B are activated for directing light from array 344A of pixels and array 344C of pixels).

In some embodiments, the display device activates (708) the electro-optic element for directing at least the portion of the respective pattern of light from the two-dimensional array of pixels to the pupil of the eye of the user (e.g., voltages are applied to electrodes of the electro-optic element for steering the light from the two-dimensional array of tiles as shown in FIG. 6A).

In some embodiments, the display device, in response to determining that the pupil of the eye of the user is located at a first location, activates (710) the electro-optic element for directing at least the portion of the respective pattern of light from the two-dimensional array of pixels to the first location of the pupil of the eye of the user (e.g., FIG. 6A); and, in response to determining that the pupil of the eye of the user is located at a second location that is distinct from the first location, activates the electro-optic element for directing at least the portion of the respective pattern of light from the two-dimensional array of pixels to the second location of the pupil of the eye of the user (e.g., FIG. 6B).

In some embodiments, the display device, in response to determining that the pupil of the eye of the user has moved from the first location to the second location, activates the electro-optic element for changing the direction of at least the portion of the respective pattern of light from the two-dimensional array of pixels so that at least the portion of the respective pattern of light from the two-dimensional array of pixels moves from the first location to the second location. Thus, the display device displays an image that is adjusted based on a lateral movement and/or a rotation of the eye.

In some embodiments, the display device activates (712) the electro-optic element for focusing at least the portion of the respective pattern of light from the two-dimensional array of pixels based on the location of the pupil of the eye of the user.

Figure 8A:
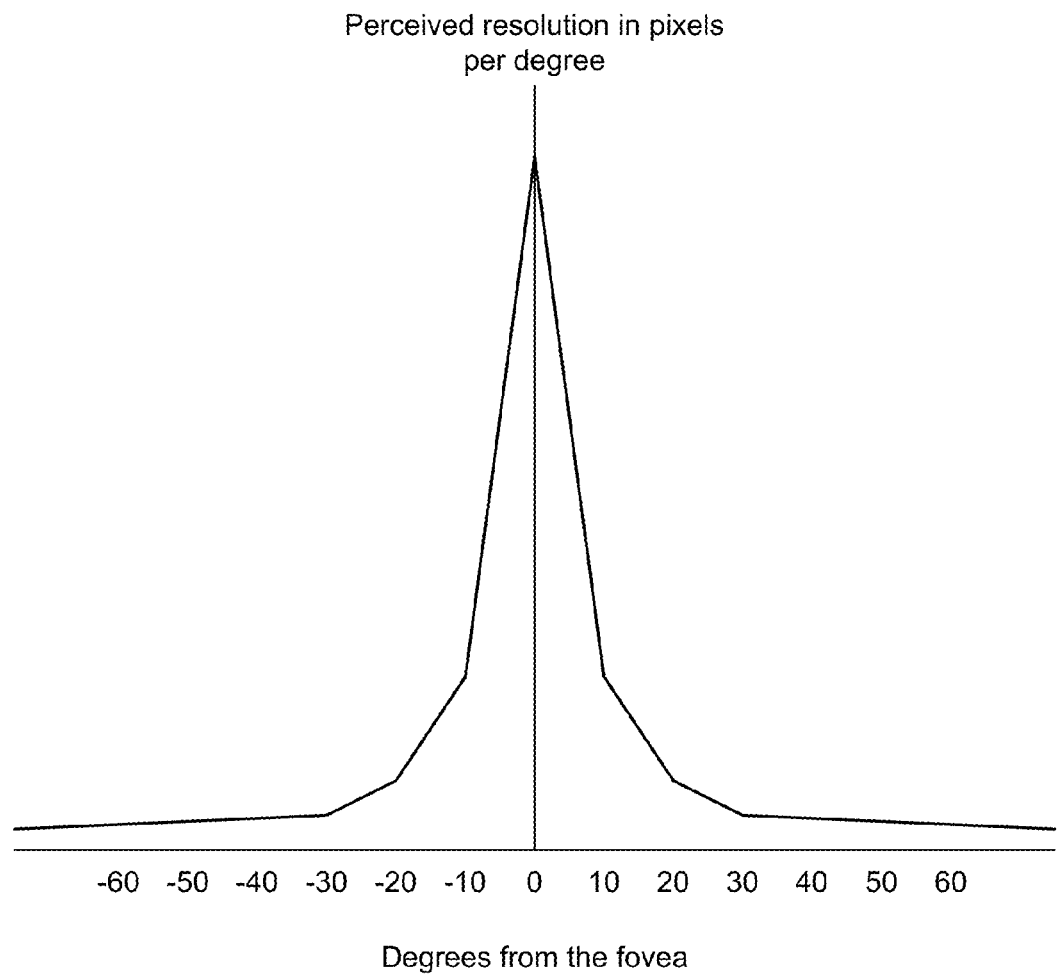
FIG. 8A is a graph illustrating a perceived resolution for a respective region of a retina in accordance with some embodiments.

FIG. 8A is a graph illustrating a perceived resolution for a respective region of a retina in accordance with some embodiments.

The retina is a light-sensitive layer located on a backside of an eyeball. An image formed on the retina is converted to physiological signals (e.g., electrical and/or chemical signals), which are transmitted to a brain. It has been observed that a certain region of the retina (e.g., a fovea) better perceives a high resolution image than the rest of the retina. The fovea is responsible for sharp central vision, and the rest of the retina is responsible for lower resolution peripheral vision.

FIG. 8A illustrates a prophetic example of the perceived resolution (or a relative acuity) for respective regions of the retina. In FIG. 8A, the fovea (e.g., a region that corresponds to 0 degree in the graph) has the highest perceived resolution, and the perceived resolution decreases as a respective region is located further away from the fovea.

Thus, it is not useful to project a high resolution image over the entire area of the retina. Only the fovea and its adjacent region benefit from a high resolution image, because the rest of the retina cannot distinguish a high resolution image from a low resolution image.

Figure 8B:
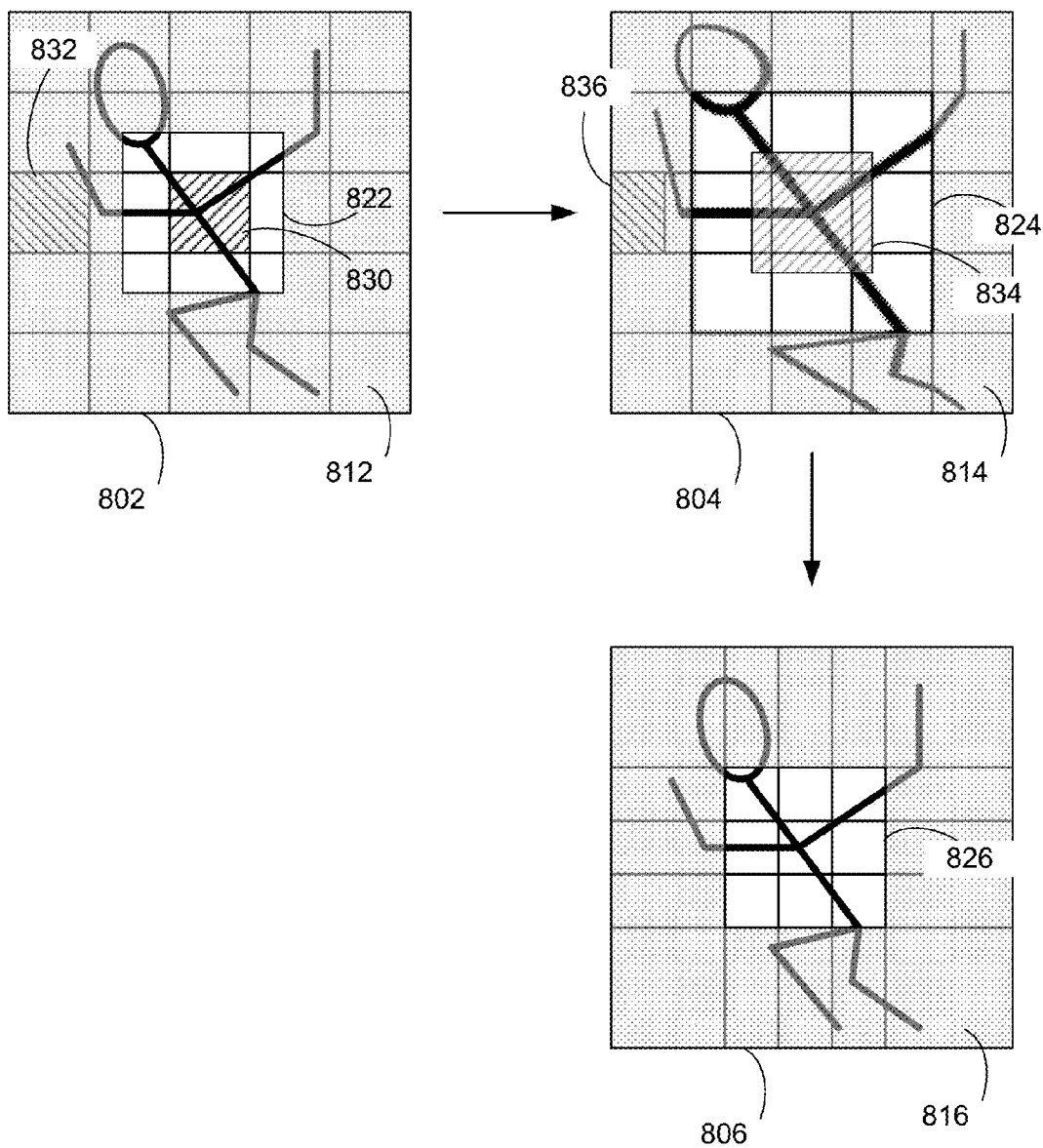
FIG. 8B illustrates a non-transformed image, a transformed image, and a projected image in accordance with some embodiments.

FIG. 8B illustrates non-transformed image 802, transformed image 804, and projected image 806 in accordance with some embodiments.

Non-transformed image 802 in FIG. 8B includes an image of a person. In some embodiments, central region 822 of non-transformed image 802 is to be projected with high resolution, and peripheral region 812 (e.g., shaded area within non-transformed image 802 in FIG. 8B) of non-transformed image 802 is to be projected with low resolution.

Central region 824 of transformed image 804 corresponds to central region 822 of non-transformed image 802, and peripheral region 814 (e.g., shaded area within transformed image 804 in FIG. 8B) of transformed image 804 corresponds to peripheral region 812 of non-transformed image 802.

Comparison of non-transformed image 802 and transformed image 804 shows that non-transformed image 802, when projected without transformation, requires four tiles (or an area equivalent to four tiles) to project central region 822 of non-transformed image 802 and 21 tiles (or an area equivalent to 21 tiles) to project peripheral region 812 of non-transformed image 802, transformed image 804 requires nine tiles (or an area equivalent to nine tiles) to project central region 824 of transformed image 804 and 16 tiles (or an area equivalent to 16 tiles) to project peripheral region 814 of transformed image 804. In embodiments where each tile has 400 pixels, non-transformed image 802 uses 1,600 pixels (=4×400 pixels) to render central region 822 and transformed image 804 uses 3,600 pixels (=9×400 pixels) to render central region 824, thereby providing a higher resolution image for central region 824.

Comparison of non-transformed image 802 and transformed image 804 also shows that region 830 of non-transformed image 802 corresponds to region 834 of transformed image 804 and region 832 of non-transformed image 802 corresponds to region 836 of transformed image 804. While region 830 and region 832 in non-transformed image 802 have the same size (e.g., an area equivalent to one tile), corresponding regions 834 and 836 have distinct sizes (e.g., region 834 has an area larger than one tile and region 836 has an area smaller than one tile).

When transformed image 804 is projected on a retina, central region 826 and peripheral region 816 of transformed image 804 are projected with different magnification. In image 806 projected on the retina, central region 826 is demagnified more than peripheral region 816. As a result, central region 826 has a higher pixel resolution (or a higher pixel density) than peripheral region 816.

Figure 8C:
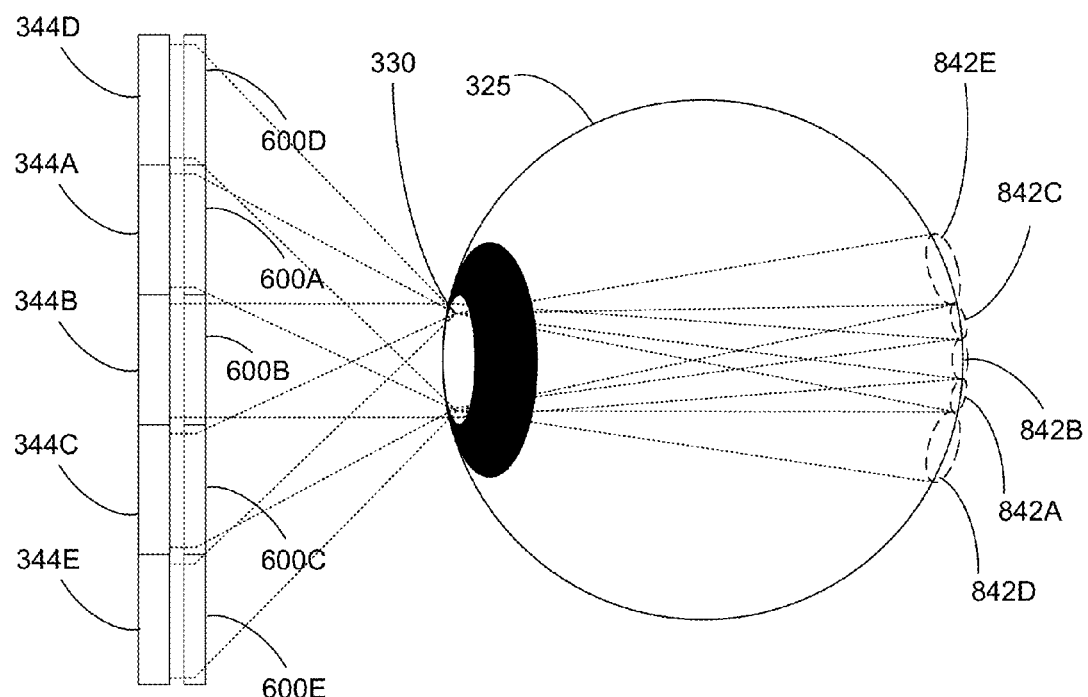
FIG. 8C is a schematic diagram illustrating an exemplary operation of tiles in accordance with some embodiments.

FIG. 8C is a schematic diagram illustrating an exemplary operation of tiles in accordance with some embodiments.

FIG. 8C is similar to FIG. 3H except that electro-optic elements 600A, 600B, 600C, 600D, and 600E are used in place of lenses 342A, 342B, 342C, 342D, and 342E shown in FIG. 3H.

FIG. 8C also illustrates that portions of an image rendered by two-dimensional arrays of pixels 344A, 344B, and 344C are projected on regions 842A, 842B, and 842C with high resolution (e.g., a high pixel density). Portions of an image rendered by two-dimensional arrays of pixels 344D and 344E are projected on regions 842D and 842E with low resolution (e.g., a low pixel density).

Although FIGS. 8B and 8C illustrate projecting a transformed image with two regions (e.g., a central region and a peripheral region) with two different resolutions, a person having ordinary skill in the art would understand that a non-transformed image can be divided into three or more regions (e.g., a central region, an inner peripheral region, and an outer peripheral region) and the three or more regions can be projected with three or more respective resolutions. In some embodiments, the resolution varies continuously from the central region to the peripheral region. For brevity, these details are omitted herein.

Figure 9:
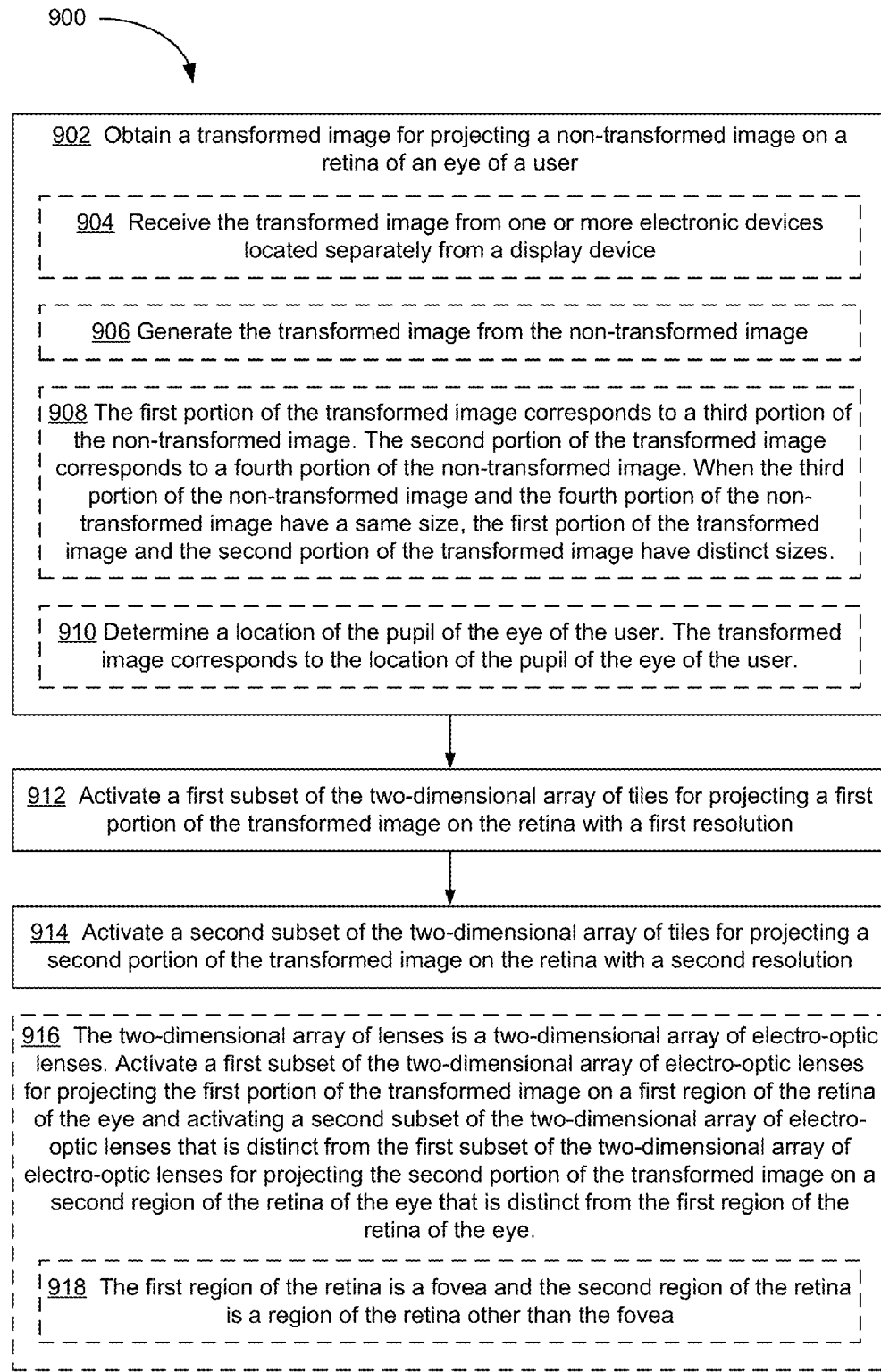
FIG. 9 is a flow diagram illustrating a method of projecting respective portions of an image with different resolutions in accordance with some embodiments.

FIG. 9 is a flow diagram illustrating method 900 of projecting respective portions of an image with different resolutions in accordance with some embodiments. Method 900 is performed at a display device (e.g., display device 100 in FIG. 1) comprising a two-dimensional array of tiles (e.g., FIG. 3B). Each tile includes (e.g., FIG. 3C) a two-dimensional array of pixels (e.g., 344). Each pixel is configured to output light so that the two-dimensional array of pixels outputs a respective pattern of light (e.g., FIG. 3G). Each tile also includes a lens of a two-dimensional array of lenses configured to direct at least a portion of the respective pattern of light from the two-dimensional array of pixels to a pupil of an eye of a user (e.g., FIG. 8C).

The device obtains (902) a transformed image (e.g., transformed image 804 in FIG. 8B) for projecting a non-transformed image on a retina of the eye of the user. The transformed image (e.g., transformed image 804 in FIG. 8B) is distinct from the non-transformed image (e.g., non-transformed image 802 in FIG. 8B).

In some embodiments, the device receives (904) the transformed image from one or more electronic devices located separately from the display device (e.g., console 210 in FIG. 2).

In some embodiments, the device generates (906) the transformed image from the non-transformed image. For example, the device magnifies a central region of a non-transformed image and demagnifies a peripheral region of a non-transformed image (e.g., the device demagnifies a peripheral region horizontally and/or vertically) to generate a transformed image, as shown in FIG. 8B.

In some embodiments, the first portion of the transformed image corresponds (908) to a third portion of the non-transformed image (e.g., region 834 of transformed image 836 corresponds to region 830 of non-transformed image 802). The second portion of the transformed image corresponds to a fourth portion of the non-transformed image (e.g., region 836 of transformed image 836 corresponds to region 832 of non-transformed image 802). When the third portion of the non-transformed image and the fourth portion of the non-transformed image have a same size (e.g., region 830 and region 832 have the same size), the first portion of the transformed image and the second portion of the transformed image have distinct sizes (e.g., region 834 and region 836 have different sizes).

In some embodiments, the device determines (910) a location of the pupil of the eye of the user. The transformed image corresponds to the location of the pupil of the eye of the user. For example, when the eye of the user gazes a central region of the image (e.g., an upper body of a person), the central region of the image is projected with high resolution and the rest of the image is projected with low resolution. When the eye of the user gazes a particular corner region of the image (e.g., a face of the person), the particular corner region of the image is projected with high resolution and the rest of the image is projected with low resolution. Alternatively, when the eye of the user rolls toward the particular corner region of the image, the image is updated so that the particular corner region of the image moves toward the center of the image. For example, when the eye of the user rolls toward a face of a person in the image, projected with low resolution, as shown in FIG. 8B, the image is updated so that the face of the person is rendered near the center of the image with high resolution. A body of the person, which is rendered with high resolution before the eye of the user rolls, is rendered, after the eye rolls, off the center of the image with low resolution.

The device activates (912) a first subset of the two-dimensional array of tiles for projecting a first portion of the transformed image on the retina of the eye of the user with a first resolution. For example, as shown in FIG. 8B, the device activates nine tiles for projecting central region 824 of transformed image 804 on the retina of the eye of the user with high resolution.

The device activates (914) a second subset of the two-dimensional array of tiles, that is distinct from the first subset of the two-dimensional array of tiles, for projecting a second portion of the transformed image, that is distinct from the first portion of the transformed image, on the retina of the eye of the user with a second resolution that is distinct from the first resolution. For example, as shown in FIG. 8B, the device activates 16 tiles for projecting peripheral region 814 of transformed image 804 on the retina of the eye of the user with low resolution.

In some embodiments, the two-dimensional array of lenses is (916) a two-dimensional array of electro-optic lenses (e.g., electro-optic elements 600A through 600E in FIG. 8C). The device activates a first subset of the two-dimensional array of electro-optic lenses for projecting the first portion of the transformed image on a first region of the retina of the eye (e.g., electro-optic elements 600A, 600B, and 600C are activated to project central region 824 of transformed image 804 on regions 842A, 842B, and 842C of the retina) and activates a second subset of the two-dimensional array of electro-optic lenses that is distinct from the first subset of the two-dimensional array of electro-optic lenses for projecting the second portion of the transformed image on a second region of the retina of the eye that is distinct from the first region of the retina of the eye (e.g., electro-optic elements 600D and 600E are activated to project peripheral region 814 of transformed image 804 on regions 842D and 842E of the retina).

In some embodiments, the first region of the retina is (918) a fovea and the second region of the retina is a region of the retina other than the fovea (e.g., a peripheral region of the retina).

Figure 10A:
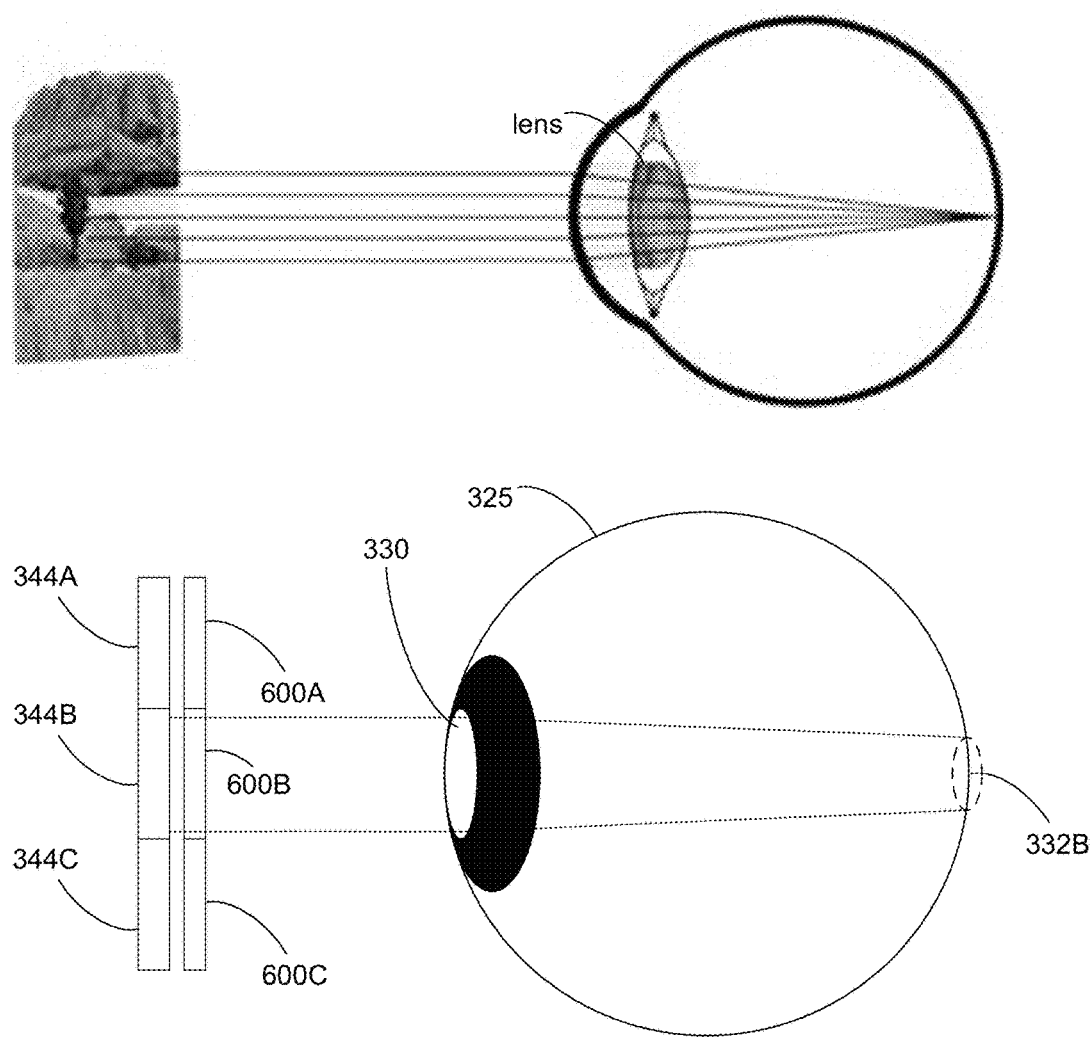
FIGS. 10A and 10B are schematic diagrams illustrating an exemplary operation of a tile in accordance with some embodiments.
Figure 10B:
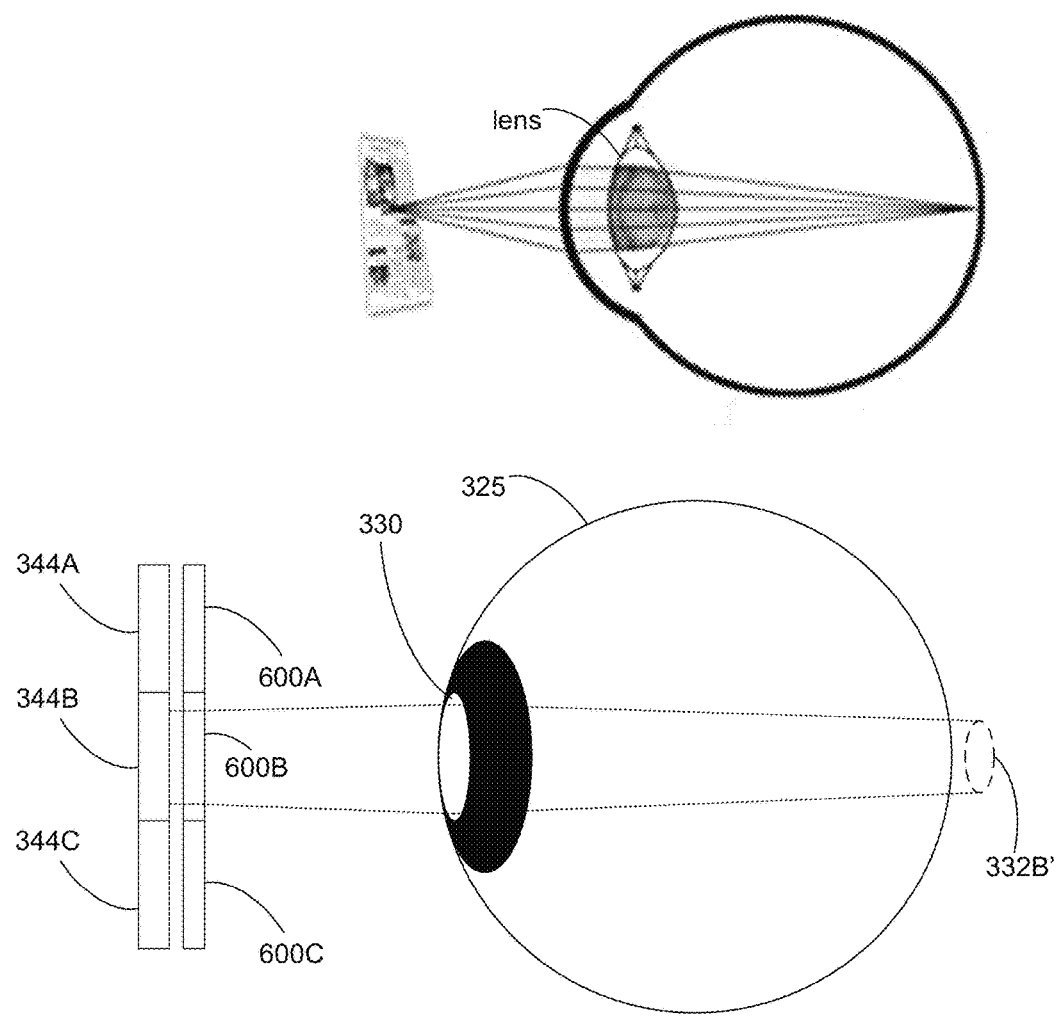

FIGS. 10A and 10B are schematic diagrams illustrating an exemplary operation of a tile in accordance with some embodiments.

A lower portion of FIG. 10A is similar to FIG. 6E except that only two-dimensional array 344B of pixels and electro-optic element 600B are activated (e.g., two-dimensional arrays 344A and 344C and electro-optic elements 600A and 600C are not activated to simplify the illustration). A top portion of FIG. 10A illustrates a configuration of a lens inside an eye when the eye is viewing a far object (e.g., a tree that is located far from the eye). The lens is relaxed to focus light from the far object on the retina of the eye.

A top portion of FIG. 10B illustrates a configuration of the lens inside the eye when the eye is viewing an adjacent object (e.g., a newsletter or a magazine that the eye is reading). The lens changes its curvature to focus light from the adjacent object on the retina of the eye.

A lower portion of FIG. 10B illustrates that electro-optic element 600B is adjusted so that light from two-dimensional array 344B of pixels is projected out of focus on the retina of the eye when the lens of eye 325 is relaxed (e.g., the focal length of electro-optic element 600B is increased so that the light from two-dimensional array 344B of pixels is focused on plane 332B' that is behind the retina when the lens of eye 325 is relaxed). This allows the lens inside eye 325 to change its curvature so that the light from two-dimensional array 344B of pixels is focused on the retina of eye 325. Because a brain is trained to relax the lens inside the eye for viewing far objects and tighten the lens inside the eye for viewing adjacent objects, this provides natural and comfortable user experience.

Figure 10C:
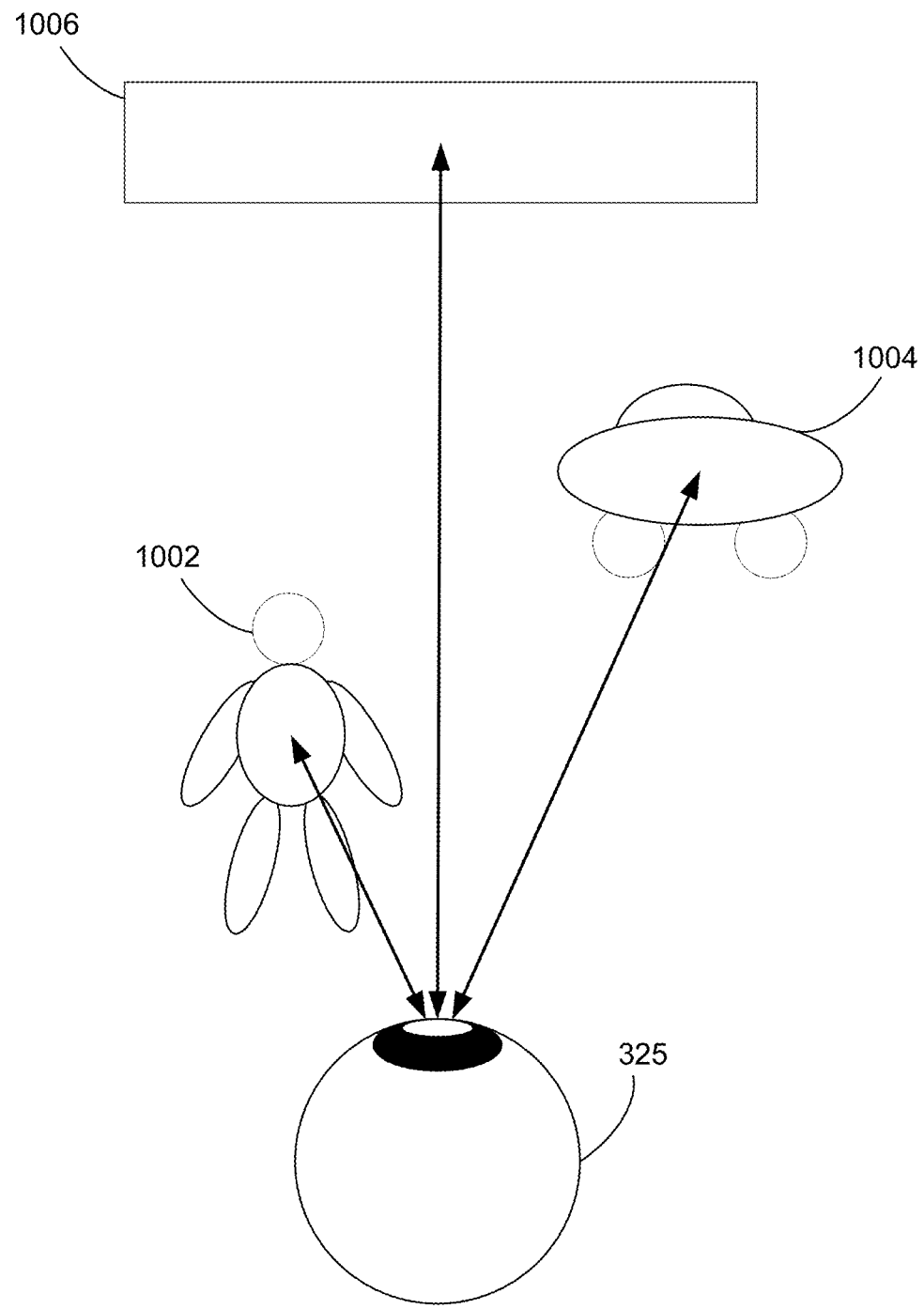
FIG. 10C is a schematic diagram illustrating a distance model in accordance with some embodiments.

FIG. 10C is a schematic diagram illustrating a distance model in accordance with some embodiments. Three-dimensional settings data (e.g., a data representation of a three-dimensional environment, such as a virtual reality environment or an augmented reality environment) includes information identifying shapes and locations of objects (and optionally their shading and/or texture information). From the information identifying the locations of the objects, the distance from the user to the object in the three-dimensional environment can be determined. For example, as shown in FIG. 10C, particular three-dimensional settings data includes information representing person 1002, automobile 1004, and building 1006 at respective locations. Based on a view point (e.g., a location of eye 325 in the three-dimensional environment), distances from eye 325 to person 1002, automobile 1004, and building 1006 in the three-dimensional environment are determined.

Figure 11:
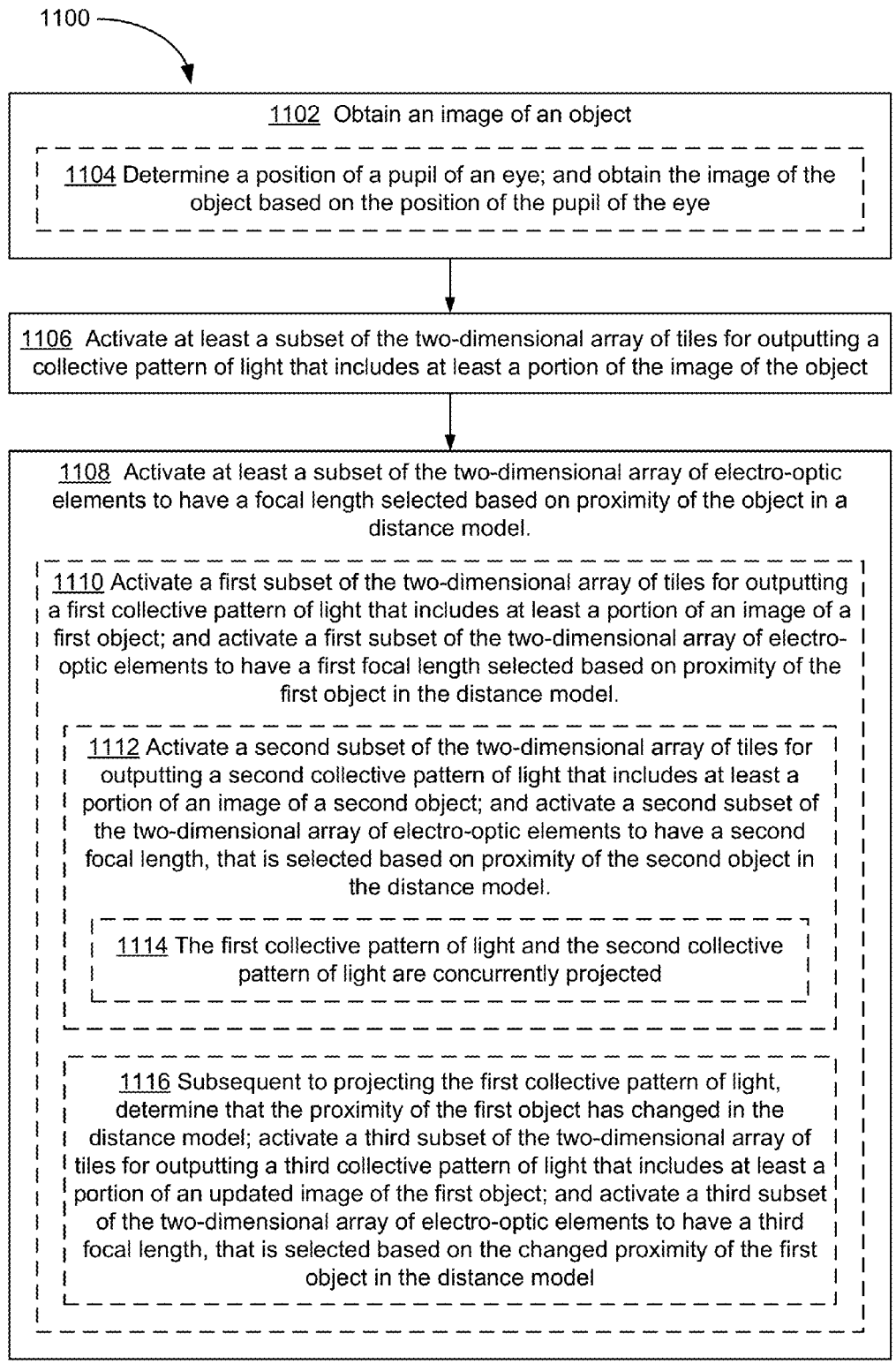
FIG. 11 is a flow diagram illustrating a method of projecting light with a focal length selected based on proximity of an object in a distance model in accordance with some embodiments.

FIG. 11 is a flow diagram illustrating a method of projecting light with a focal length selected based on proximity of an object in a distance model in accordance with some embodiments. Method 1100 is performed at a display device (e.g., display device 100 in FIG. 1) comprising a two-dimensional array of tiles (e.g., FIG. 3B). Each tile includes (e.g., FIG. 3C) a two-dimensional array of pixels (e.g., 344). Each pixel is configured to output light so that the two-dimensional array of pixels outputs a respective pattern of light (e.g., FIG. 3G). Each tile also includes an electro-optic element (e.g., electro-optic element 600 in FIG. 6E), of a two-dimensional array of electro-optic elements, configured to direct at least a portion of the respective pattern of light from the two-dimensional array of pixels to a pupil of an eye of a user (e.g., FIG. 6E).

The device obtains (1102) an image of an object (e.g., a newspaper). In some embodiments, the device obtains a location of the object in a three-dimensional model (e.g., how far the object is located from the user in the three-dimensional model) with the image of the object.

In some embodiments, the device determines (1104) a position of the pupil of the eye; and obtains the image of the object based on the position of the pupil of the eye. For example, the device performs a scan to determine a position of the pupil of the eye (e.g., a location of the pupil of the eye and/or a viewing angle (or a gaze) of the eye).

In some embodiments, the display device includes one or more sensors (e.g., an array of sensors) for determining the position of the pupil of the eye (e.g., FIG. 4G).

The device activates (1106) at least a subset of the two-dimensional array of tiles for outputting, from at least the subset of the two-dimensional array of tiles, a collective pattern of light that includes at least a portion of the image of the object (e.g., a tile with two-dimensional array 344B of pixels in FIG. 10B is activated to output a respective pattern of light).

The device activates (1108) at least a subset of the two-dimensional array of electro-optic elements for projecting the collective pattern of light (e.g., electro-optic element 600B in FIG. 10B is activated for projecting light from two-dimensional array 344B of pixels). At least the subset of the two-dimensional array of electro-optic elements is configured to have a focal length, that is selected based on proximity of the object in a distance model (e.g., FIG. 10C), for projecting the collective pattern of light (e.g., when the object is located far from the user in the three-dimensional model, a focal length that focuses a projected image on the retina of the eye when the lens inside the eye is relaxed is selected, and when the objected is located adjacent to the user in the three-dimensional model, a focal length which causes a defocused image to be projected on the retina of the eye when the lens inside the eye is relaxed is selected).

In some embodiments, the device activates at least the subset of the two-dimensional array of electro-optic elements for projecting the collective pattern of light before activating at least the subset of the two-dimensional array of tiles for outputting, from at least the subset of the two-dimensional array of tiles, the collective pattern of light that includes at least the portion of the image of the object. In some embodiments, the device activates at least the subset of the two-dimensional array of electro-optic elements for projecting the collective pattern of light after activating at least the subset of the two-dimensional array of tiles for outputting, from at least the subset of the two-dimensional array of tiles, the collective pattern of light that includes at least the portion of the image of the object. In some embodiments, the device activates at least the subset of the two-dimensional array of electro-optic elements for projecting the collective pattern of light, concurrently with activating at least the subset of the two-dimensional array of tiles for outputting, from at least the subset of the two-dimensional array of tiles, the collective pattern of light that includes at least the portion of the image of the object.

In some embodiments, the device activates (1110) a first subset of the two-dimensional array of tiles for outputting, from at least the first subset of the two-dimensional array of tiles, a first collective pattern of light that includes at least a portion of an image of a first object (e.g., a pattern of light that includes an image of an adjacent object); and activates a first subset of the two-dimensional array of electro-optic elements for projecting the first collective pattern of light. The first subset of the two-dimensional array of electro-optic elements is configured to have a first focal length, that is selected based on proximity of the first object in the distance model, for projecting the first collective pattern of light (e.g., the device selects a focal length, which causes a defocused image of the adjacent object to be projected on the retina of the eye when the lens inside the eye is relaxed).

In some embodiments, the device activates (1112) a second subset of the two-dimensional array of tiles for outputting, from at least the second subset of the two-dimensional array of tiles, a second collective pattern of light that includes at least a portion of an image of a second object (e.g., a pattern of light that includes an image of a far object); and activates a second subset of the two-dimensional array of electro-optic elements for projecting the second collective pattern of light. The second subset of the two-dimensional array of electro-optic elements is configured to have a second focal length, that is selected based on proximity of the second object in the distance model, for projecting the second collective pattern of light, and the second focal length is distinct from the first focal length (e.g., the device selects a focal length, which causes a focused image of the far object to be projected on the retina of the eye when the lens inside the eye is relaxed).

In some embodiments, the first collective pattern of light and the second collective pattern of light are (1114) concurrently projected. For example, an image includes both a far object and an adjacent object. Some of the tiles are used to project a focused image of the far object and a defocused image of the adjacent object at the same time when the eye is relaxed (e.g., the focused image of the far object is projected onto a first region of the retina and the defocused image of the adjacent object is projected onto a second region of the retina that is distinct from the first region of the retina). When the lens inside the eye is relaxed, the image of the far object projected on the first region of the retina remains focused and the image of the adjacent object projected on the second region of the retina remains defocused. When the lens inside the eye is tightened (e.g., by straining ciliary muscles connected to the lens inside the eye), the image of the far object projected on the first region of the retina becomes defocused and the image of the adjacent object projected on the second region of the retina becomes focused.

In some embodiments, the device, subsequent to projecting the first collective pattern of light while the first subset of the two-dimensional array of electro-optic elements is configured to have the first focal length, determines (1116) that the proximity of the first object has changed in the distance model (e.g., based on image processing, and/or proximity information for the object in the distance model, such as the three-dimensional model, received with the image of the object); activates a third subset of the two-dimensional array of tiles for outputting, from at least the third subset of the two-dimensional array of tiles, a third collective pattern of light that includes at least a portion of an updated image of the first object (e.g., a different number of tiles and/or pixels is used to output the updated image, such as a zoomed-in or zoomed-out image, of the first object); and activates a third subset of the two-dimensional array of electro-optic elements for projecting the third collective pattern of light. The third subset of the two-dimensional array of electro-optic elements is configured to have a third focal length, that is selected based on the changed proximity of the first object in the distance model, for projecting the third collective pattern of light (e.g., a focus of the updated image is changed based on the changed distance between the first object and the user).

Although some of various drawings illustrate a number of logical stages in a particular order, stages which are not order dependent may be reordered and other stages may be combined or broken out. While some reordering or other groupings are specifically mentioned, others will be apparent to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. For example, several of the components described herein can be included in a single display device and several features described herein can be implemented in the single display device. In some other embodiments, the display device is implemented without one or more functions described above (e.g., the one or more processors forgo projecting one or more portions of a transformed image and instead project a non-transformed image). For brevity, such details are omitted herein, because a person having ordinary skill in the art would recognize various modifications based on the description in this application.

The embodiments were chosen in order to best explain the principles underlying the claims and their practical applications, to thereby enable others skilled in the art to best use the embodiments with various modifications as are suited to the particular uses contemplated.

What is claimed is:

1. A display device, comprising:
one or more light sources; and
a beam steering device configured to steer light from the one or more light sources, the beam steering device including:
a first active deflector, wherein the first active deflector includes:
a first substrate with one or more electrodes;
a second substrate with one or more electrodes, wherein the second substrate is distinct from the first substrate; and
liquid crystals located between the first substrate and the second substrate; and
a passive deflector positioned parallel to the first active deflector to receive the light from the one or more light sources transmitted through the first active deflector, wherein the passive deflector includes:
a third substrate;
a fourth substrate that is distinct from the third substrate; and
liquid crystals located between the third substrate and the fourth substrate,
wherein the one or more light sources and the beam steering device are configured so that a zeroth order light from the passive deflector is directed away from an optical axis of the display device.

2. The display device of claim 1, wherein:
the liquid crystals in the first active deflector are oriented in a first rotational orientation; and
the liquid crystals in the passive deflector are oriented in the first rotational orientation.

3. The display device of claim 1, wherein:
the passive deflector is configured to deflect light by more than 5°.

4. The display device of claim 1, wherein:
the liquid crystals in the passive deflector are immobilized.

5. The display device of claim 1, wherein:
the liquid crystals in the passive deflector are polymerized.

6. The display device of claim 1, wherein:
the first substrate, the second substrate, the third substrate, and the fourth substrate are optically transparent; and
the one or more electrodes for the first substrate and the one or more electrodes for the second substrate are optically transparent.

7. The display device of claim 1, wherein:
the passive deflector is configured to steer incoming light by a first angle; and
the first active deflector is configured to steer incoming light by a second angle.

8. The display device of claim 7, wherein:
the first angle is greater than the second angle.

9. The display device of claim 7, including:
a first switchable half-wave plate, wherein the first active deflector is located between the passive deflector and the first switchable half-wave plate.

10. The display device of claim 9, including:
a second active deflector that is configured to steer incoming light by a third angle that is less than the second angle, wherein the first switchable half-wave plate is located between the first active deflector and the second active deflector.

11. The display device of claim 10, including:
a second switchable half-wave plate, wherein the second active deflector is located between the first switchable half-wave plate and the second switchable half-wave plate.

12. The display device of claim 11, including:
a third active deflector that is configured to steer incoming light by a fourth angle that is less than the third angle, wherein the second switchable half-wave plate is located between the second active deflector and the third active deflector; and
a third switchable half-wave plate, wherein the third active deflector is located between the second switchable half-wave plate and the third switchable half-wave plate.

13. The display device of claim 12, including:
a fourth active deflector that is configured to steer incoming light by a fifth angle that is less than the fourth angle, wherein the third switchable half-wave plate is located between the third active deflector and the fourth active deflector; and
a fourth switchable half-wave plate, wherein the fourth active deflector is located between the third switchable half-wave plate and the fourth switchable half-wave plate.

14. The display device of claim 13, including:
a fifth active deflector that is configured to steer incoming light by a sixth angle that is less than the fifth angle, wherein the fourth switchable half-wave plate is located between the fourth active deflector and the fifth active deflector; and
a fifth switchable half-wave plate, wherein the fifth active deflector is located between the fourth switchable half-wave plate and the fifth switchable half-wave plate.

15. The display device of claim 7, wherein:
the first angle corresponds to a direction of first order diffraction for the passive deflector; and
the passive deflector is configured to transmit a portion of incident light to a direction of zeroth order diffraction.

16. The display device of claim 15, wherein:
the passive deflector is positioned to receive light from the first active deflector.

17. The display device of claim 1, including:
a quarter-wave plate.

18. A method, comprising:
steering light from one or more light sources of a display device with a beam steering device that includes:
a first active deflector, wherein the first active deflector includes:
a first substrate with one or more electrodes;
a second substrate with one or more electrodes, wherein the second substrate is distinct from the first substrate; and
liquid crystals located between the first substrate and the second substrate; and
a passive deflector positioned parallel to the first active deflector, wherein the passive deflector includes:
a third substrate;
a fourth substrate that is distinct from the third substrate; and
liquid crystals located between the third substrate and the fourth substrate,
the steering including:
transmitting the incoming light through the first active deflector;
transmitting, through the passive deflector, the incoming light transmitted through the first active deflector; and
directing light diffracted into a direction of zeroth order diffraction by the passive deflector away from an optical axis of the display device.

19. The method of claim 18, wherein:
the passive deflector deflects the light from the first active deflector by a first angle; and
the first active deflector deflects the incoming light by a second angle.

20. The method of claim 18, including:
causing, with the passive deflector, diffraction of a first portion of the incoming light into the direction of zeroth order concurrently with diffraction of a second portion of the incoming light into a direction of first order that is distinct from the direction of zeroth order, wherein the one or more light sources and the beam steering device are configured so that a zeroth order light from the passive deflector is directed away from the optical axis of the display device for vignetting.

* * * * *